United States Patent
Huang et al.

(10) Patent No.: US 11,735,483 B2
(45) Date of Patent: Aug. 22, 2023

(54) METHOD FOR FORMING EPITAXIAL SOURCE/DRAIN FEATURES USING A SELF-ALIGNED MASK AND SEMICONDUCTOR DEVICES FABRICATED THEREOF

(71) Applicant: TAIWAN SEMICONDUCTOR MANUFACTURING COMPANY, LTD., Hsinchu (TW)

(72) Inventors: Yao-Sheng Huang, Kaohsiung (TW); I-Ming Chang, Hsinchu (TW); Huang-Lin Chao, Hillsboro, OR (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/187,283

(22) Filed: Feb. 26, 2021

(65) Prior Publication Data
US 2022/0278002 A1    Sep. 1, 2022

(51) Int. Cl.
| | |
|---|---|
| *H01L 21/8238* | (2006.01) |
| *H01L 29/423* | (2006.01) |
| *H01L 21/02* | (2006.01) |
| *H01L 29/161* | (2006.01) |
| *H01L 29/66* | (2006.01) |
| *H01L 29/06* | (2006.01) |
| *H01L 29/24* | (2006.01) |
| *H01L 29/417* | (2006.01) |

(Continued)

(52) U.S. Cl.
CPC .. *H01L 21/823814* (2013.01); *H01L 21/0259* (2013.01); *H01L 21/02236* (2013.01); *H01L 21/02252* (2013.01); *H01L 21/02521* (2013.01); *H01L 21/02532* (2013.01); *H01L 21/823807* (2013.01); *H01L 21/823864* (2013.01); *H01L 21/823871* (2013.01); *H01L 27/092* (2013.01); *H01L 29/0665* (2013.01); *H01L 29/161* (2013.01); *H01L 29/24* (2013.01); *H01L 29/41733* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/78618* (2013.01); *H01L 29/78696* (2013.01)

(58) Field of Classification Search
CPC ........... H01L 27/0924; H01L 29/66795; H01L 21/823821; H01L 21/823814
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Brian Turner
(74) *Attorney, Agent, or Firm* — NZ Carr Law Office

(57) ABSTRACT

Embodiments of the present disclosure provide a method of forming N-type and P-type source/drain features using one patterned mask and one self-aligned mask to increase windows of error tolerance and provide flexibilities for source/drain features of various shapes and/or volumes. In some embodiments, after forming a first type of source/drain features, a self-aligned mask layer is formed over the first type of source/drain features without using photolithography process, thus, avoid damaging the first type of source/drain features in the patterning process.

20 Claims, 57 Drawing Sheets

(51) Int. Cl.
    *H01L 29/786*    (2006.01)
    *H01L 27/092*    (2006.01)

(56) References Cited

U.S. PATENT DOCUMENTS

| | | | |
|---|---|---|---|
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2008/0191244 A1* | 8/2008 | Kim | H01L 29/6653 257/190 |
| 2009/0020820 A1* | 1/2009 | Baik | H01L 21/823814 257/E27.06 |
| 2017/0229350 A1* | 8/2017 | Bergendahl | H01L 29/165 |
| 2018/0061978 A1* | 3/2018 | Sun | H01L 29/78642 |
| 2018/0350821 A1* | 12/2018 | Lin | H01L 29/66636 |
| 2019/0164970 A1* | 5/2019 | Ching | H01L 21/28525 |
| 2019/0371677 A1* | 12/2019 | Lee | H01L 21/823814 |

\* cited by examiner

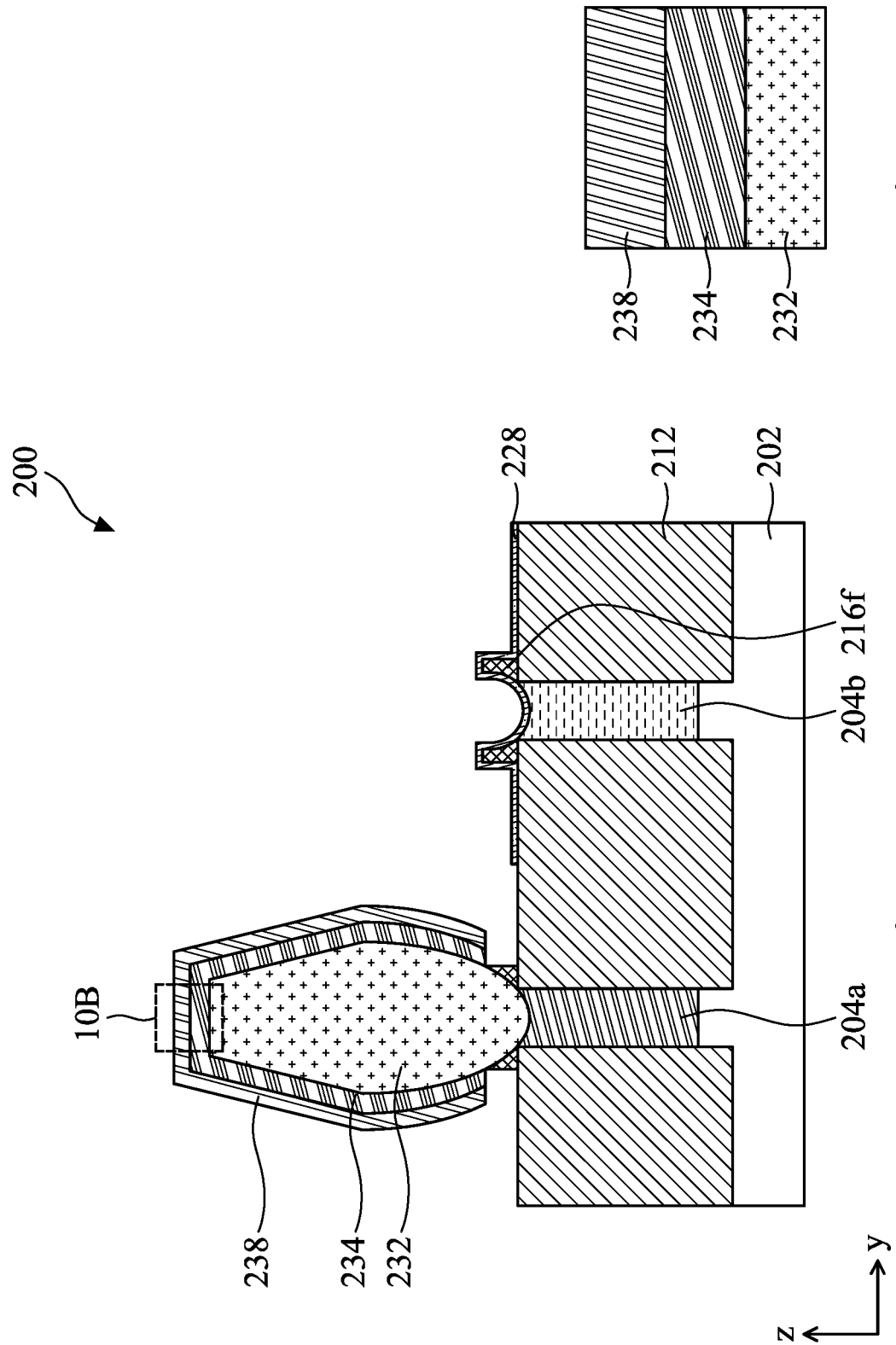

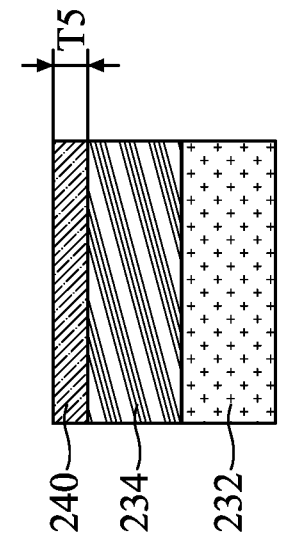
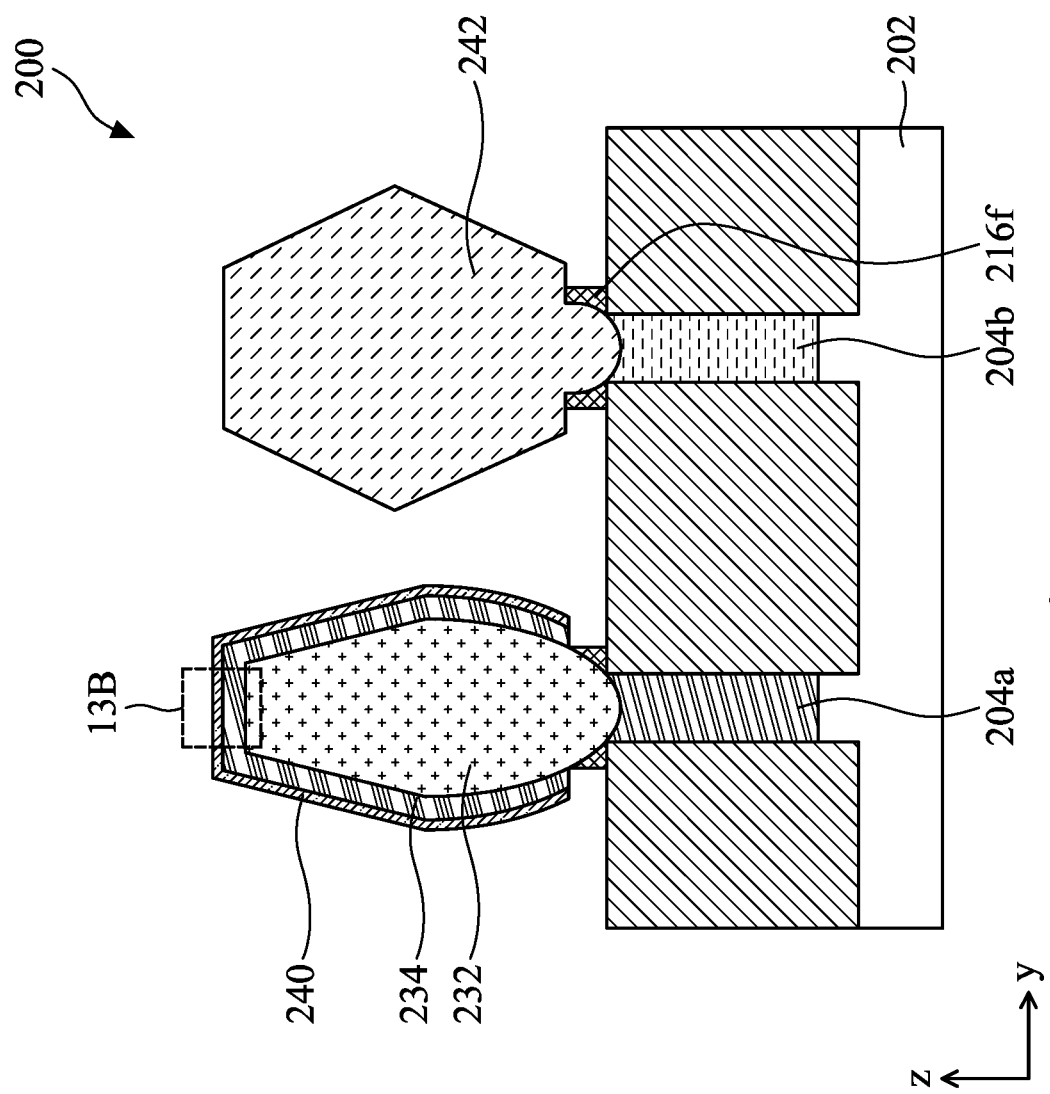
Fig. 13B
Fig. 13A

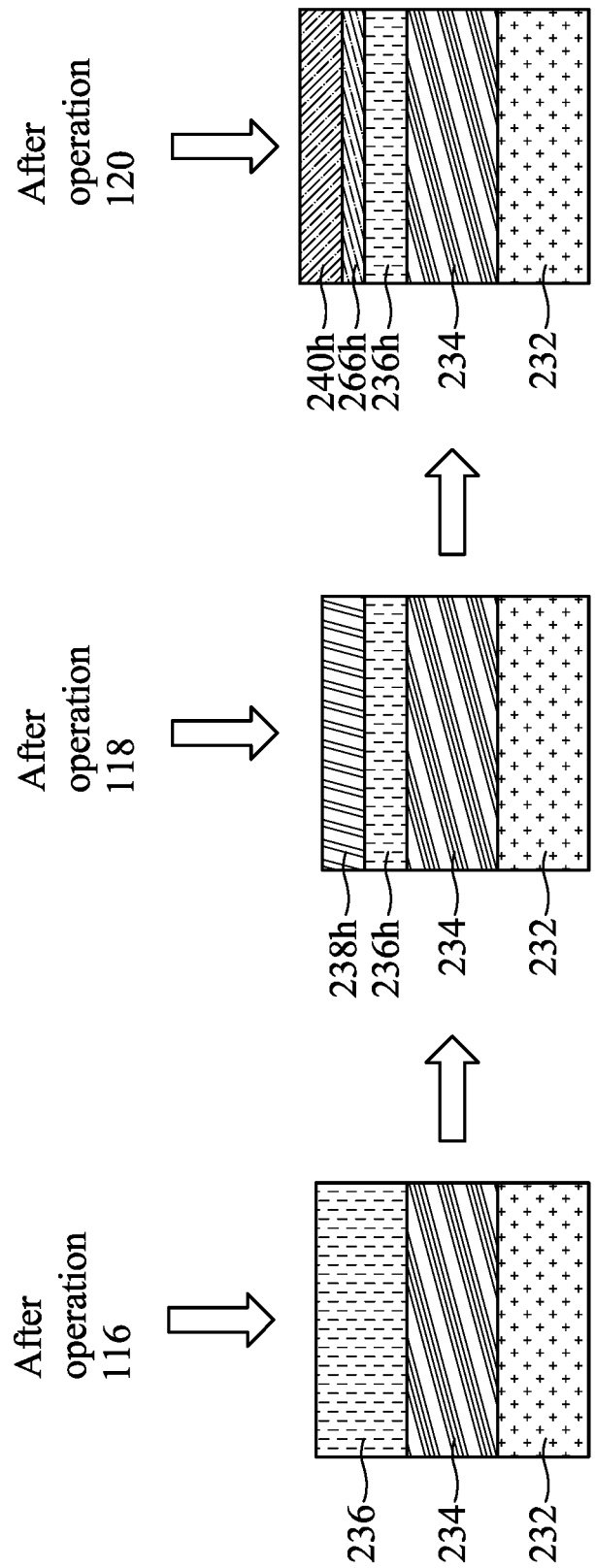

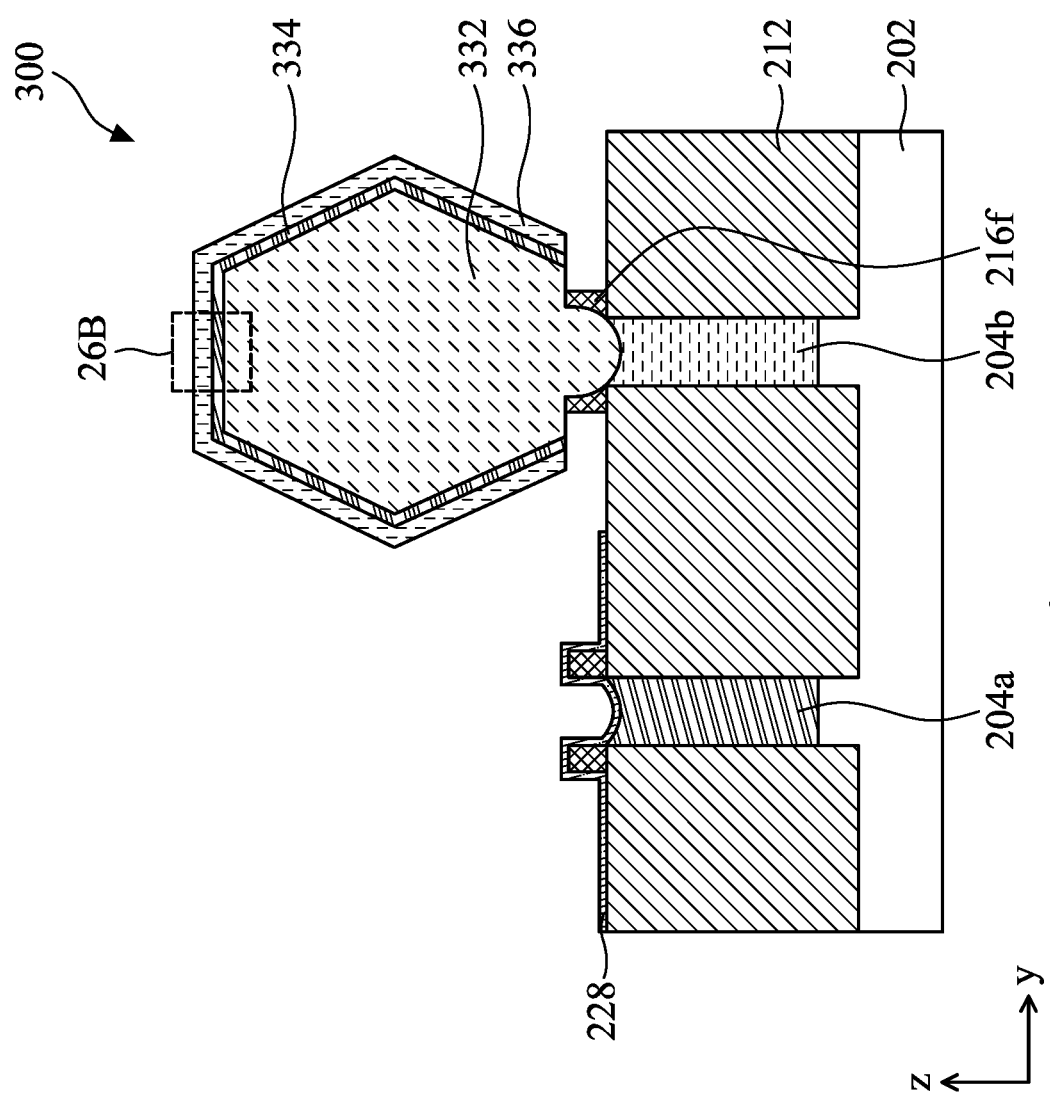

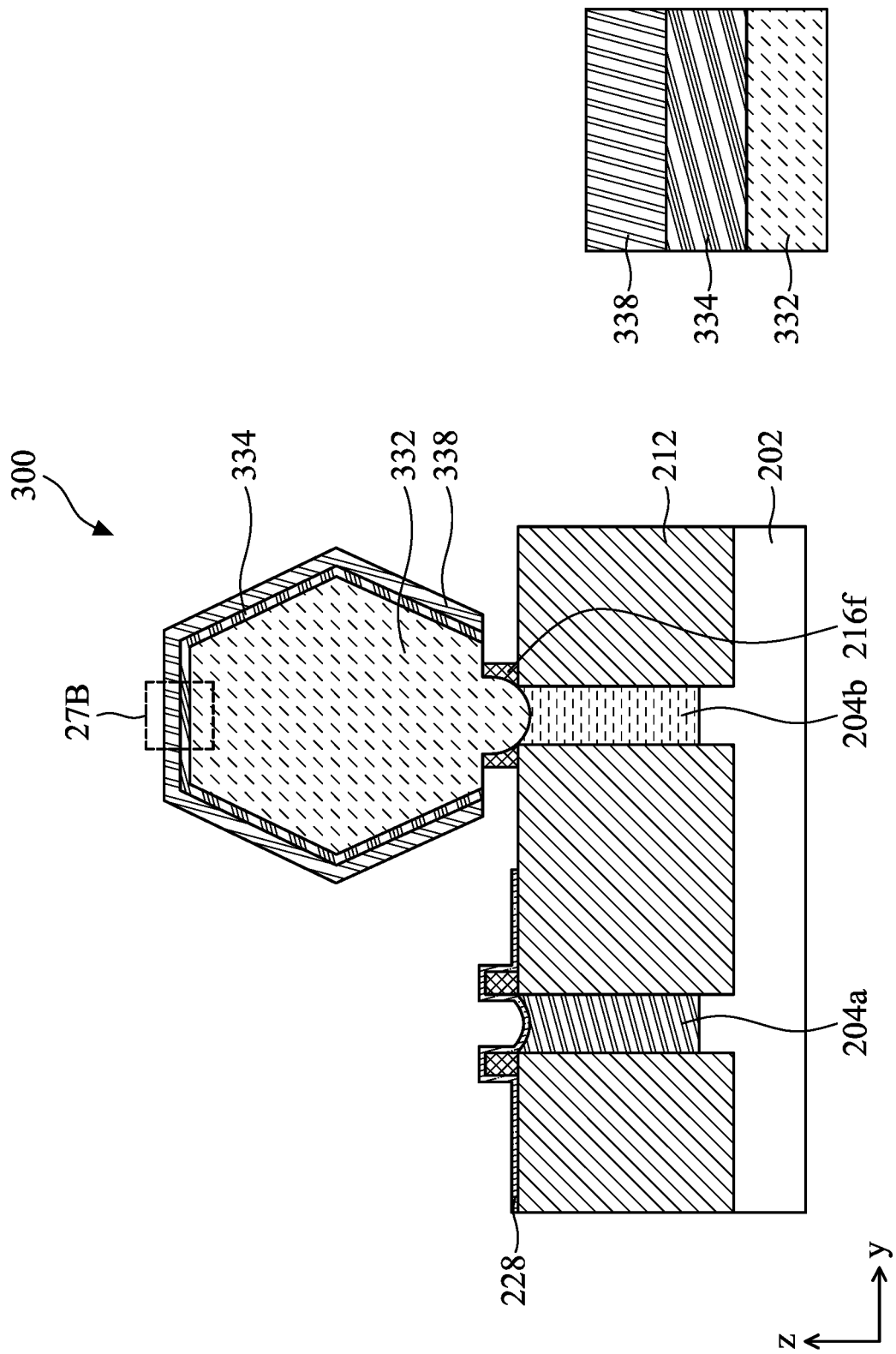

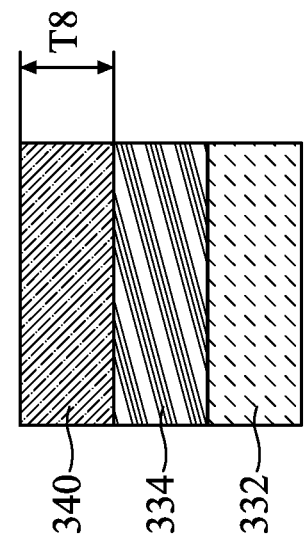
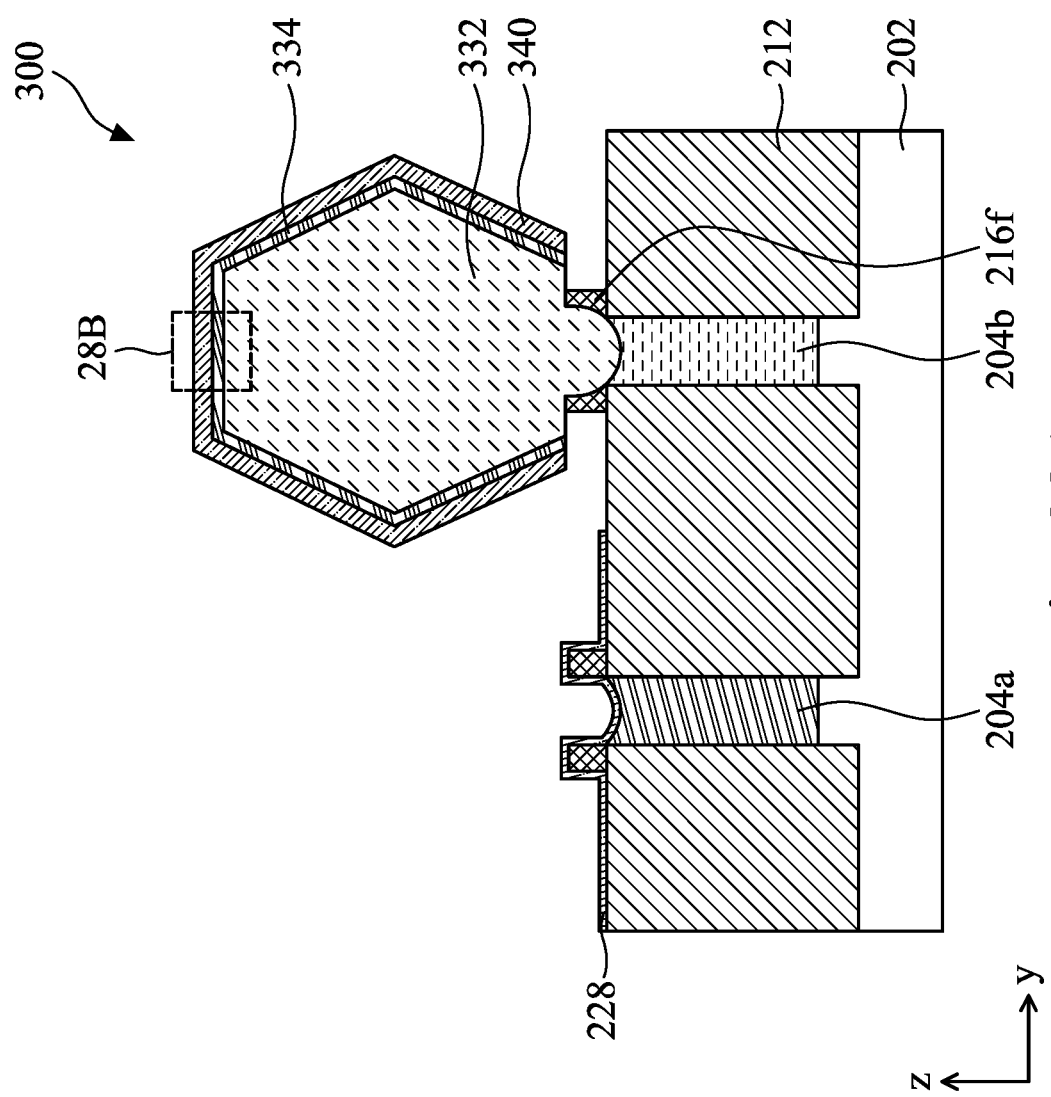

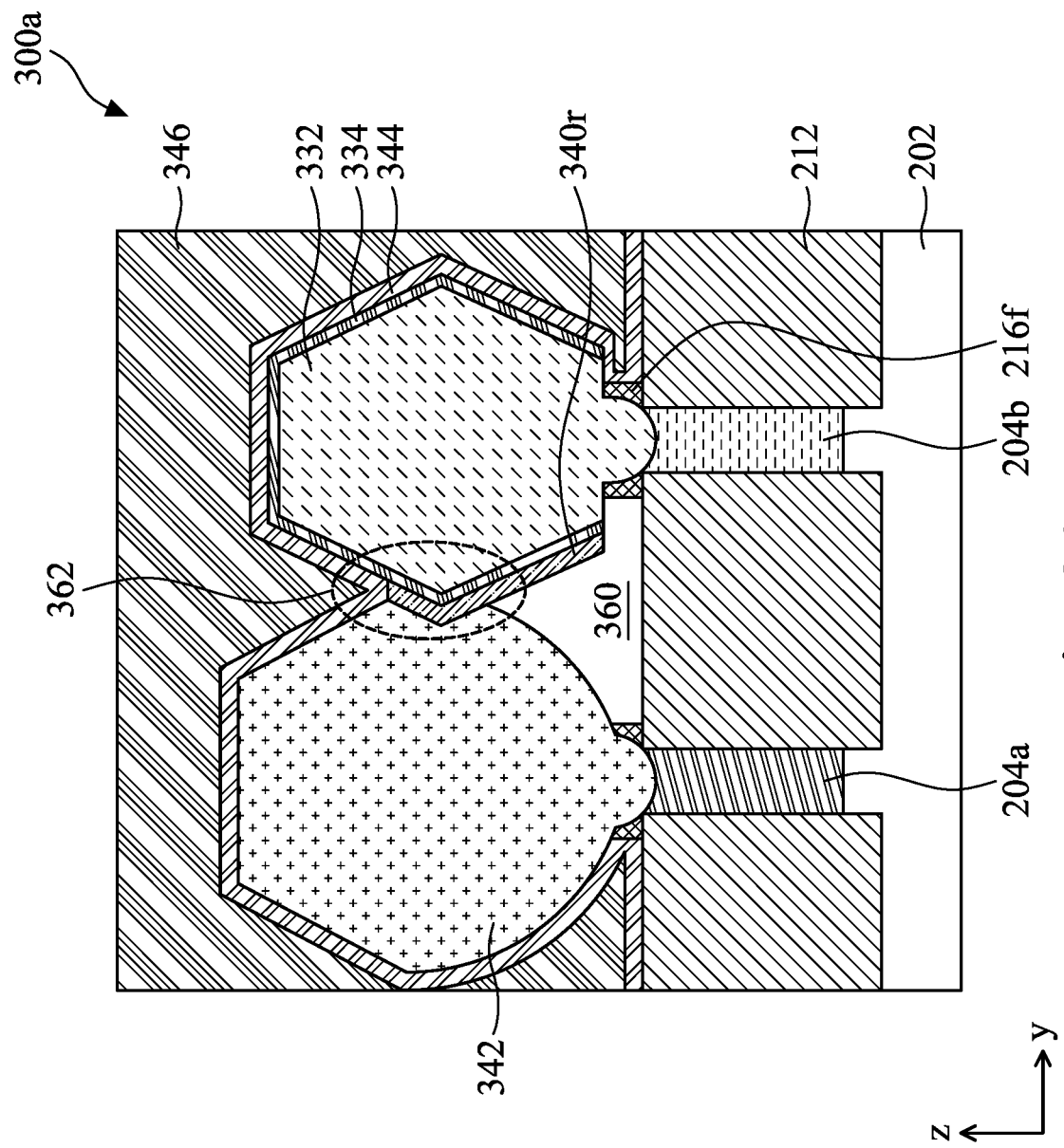

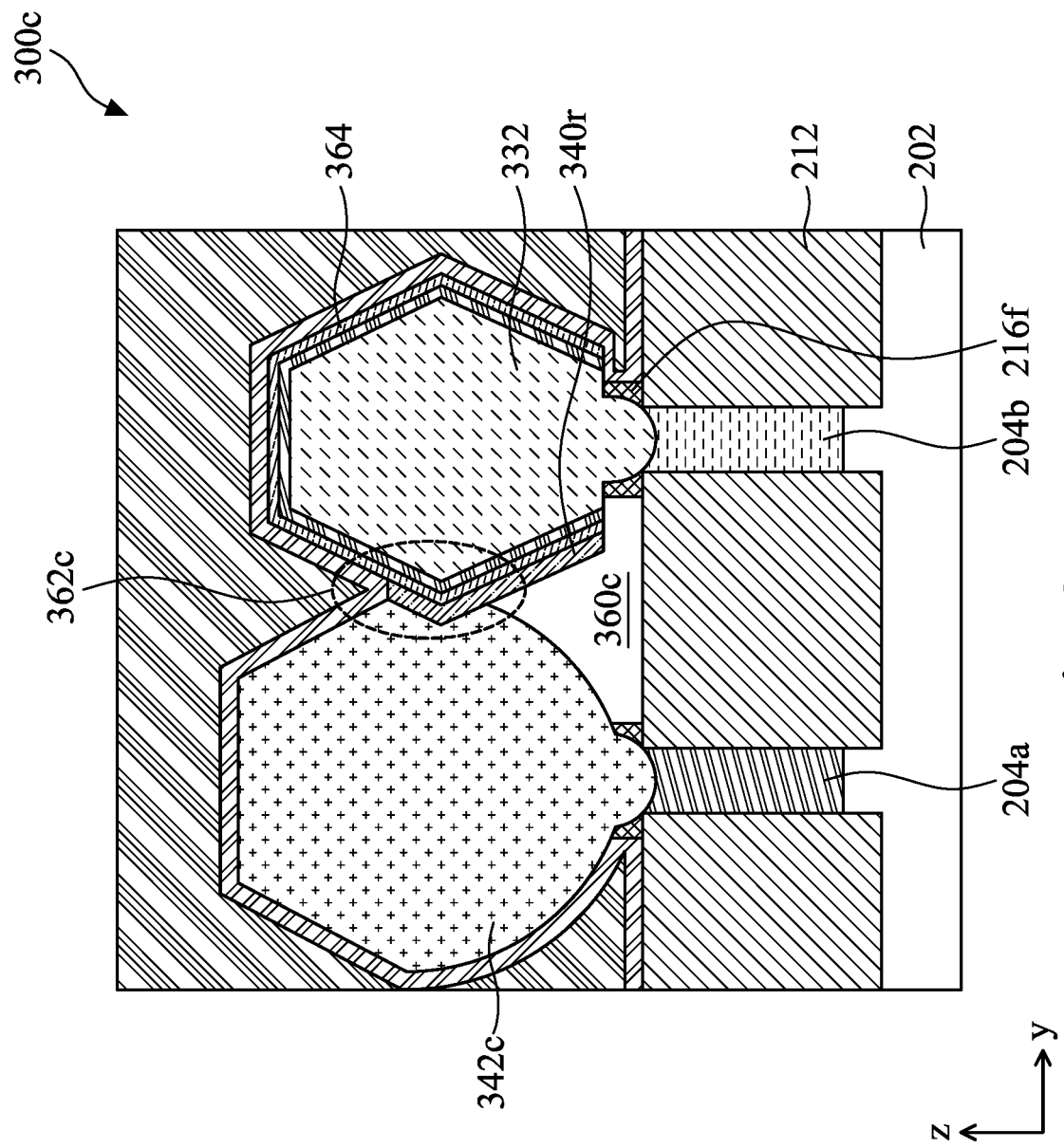

US 11,735,483 B2

1

METHOD FOR FORMING EPITAXIAL SOURCE/DRAIN FEATURES USING A SELF-ALIGNED MASK AND SEMICONDUCTOR DEVICES FABRICATED THEREOF

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. As minimum feature size reduces, patterning of hard masks for forming epitaxial source/drain features has become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-8, 9A-9B, 10A-10B, 11A-11B, 12A-12B, 13A-13B, 14-16, 17A-17B, and 18A-18B schematically illustrate various stages of manufacturing a semiconductor device according to embodiments of the present disclosure.

FIGS. 24A-24D schematically illustrate a semiconductor device according to embodiments of the present disclosure at various stages.

FIGS. 25, 26A-20B, 27A-27B, 28A-28B, and 29-34 schematically illustrate a semiconductor device according to embodiments of the present disclosure at various stages.

2

Figure 35A:
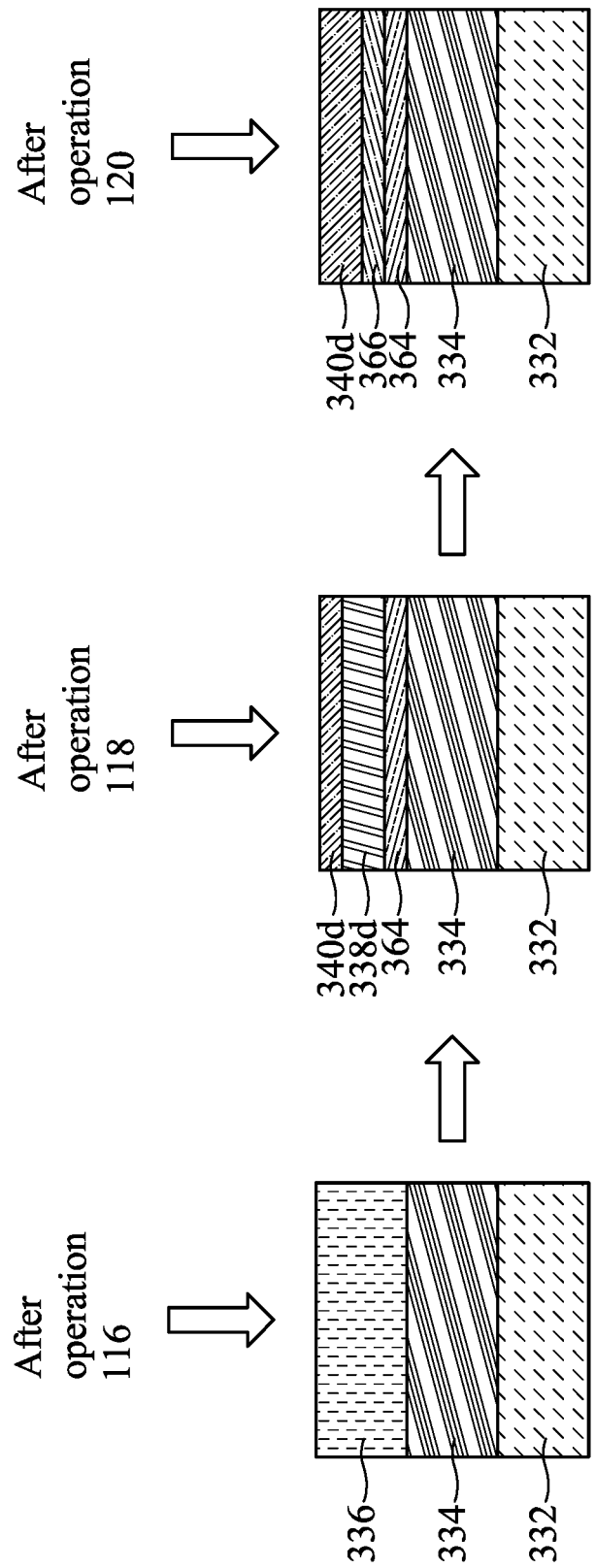
FIGS. 35A-35C schematically illustrate a semiconductor device according to embodiments of the present disclosure at various stages.
Figure 35B:
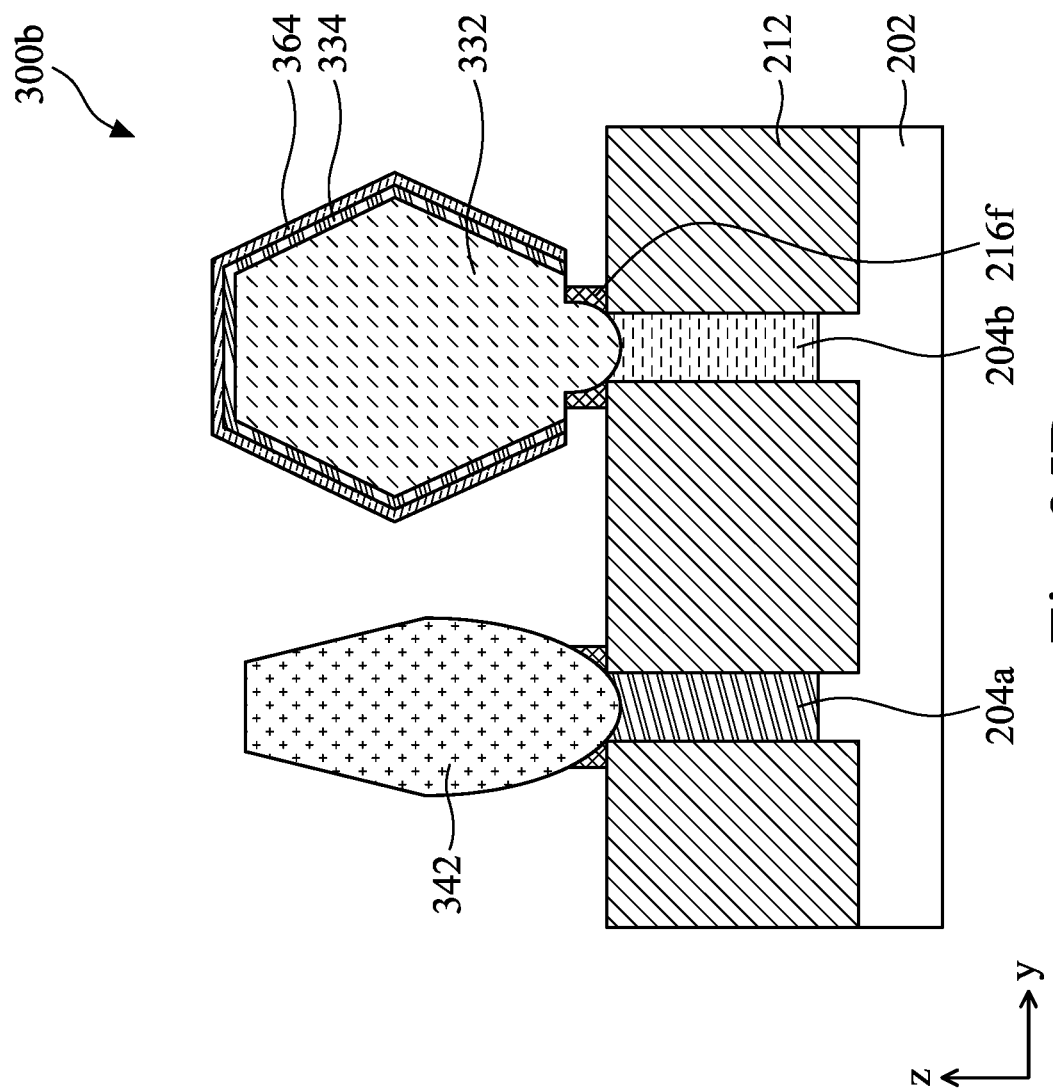
Figure 35C:
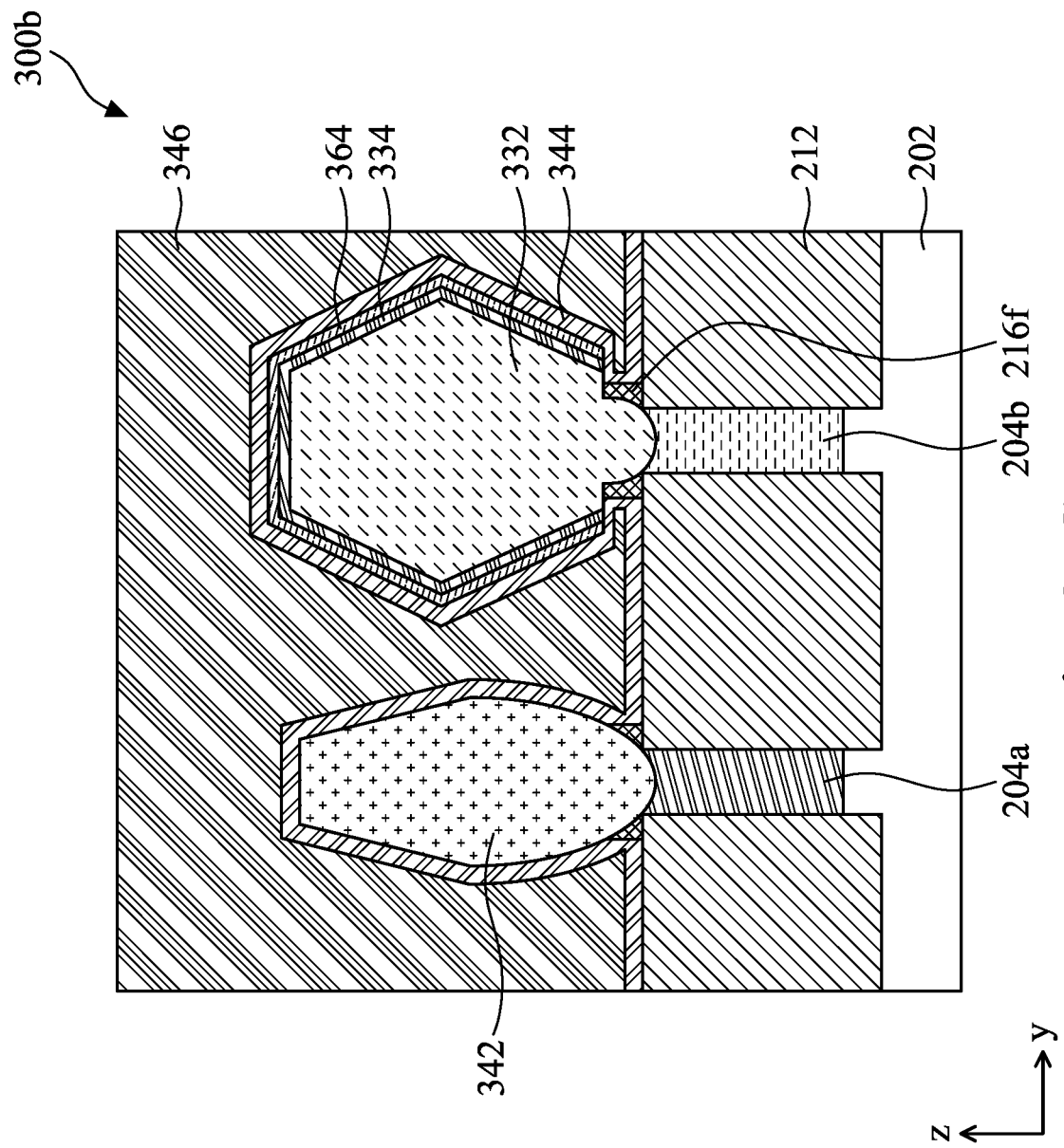
Figure 35D:
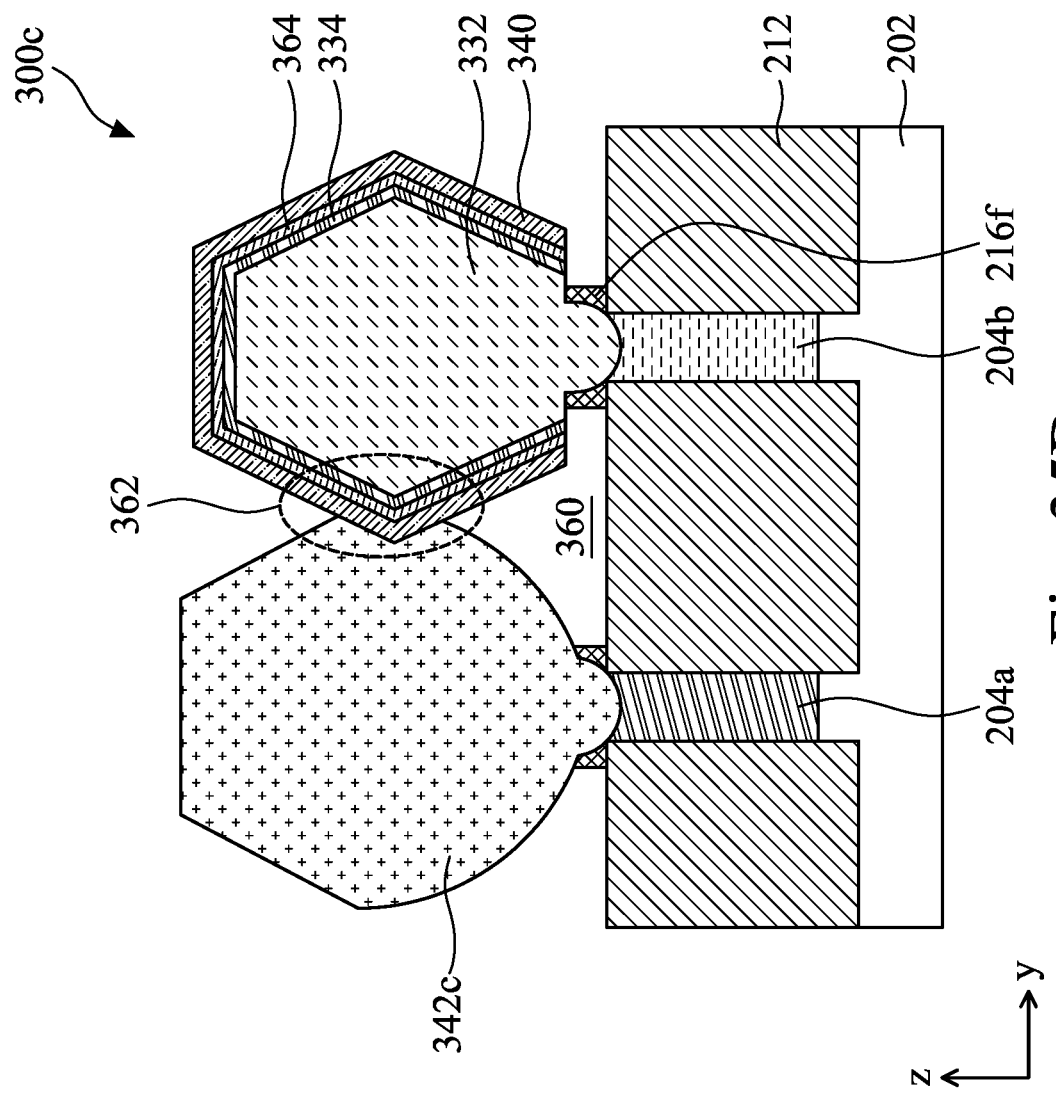

FIGS. 35D-E schematically illustrate a semiconductor device according to embodiments of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Semiconductor devices typically include both N-type devices and P-type devices formed on one common substrate. Traditionally, source/drain features for N-type devices and P-type devices are formed using two patterning processes to form two masks and two epitaxial growing processes. As device size scaling down, the windows of error for patterning have shrunk making it challenging to form N-type and P-type source/drain features using the traditional process. Additionally, the traditional process also lacks flexibility to adapt various volumes, and/or shapes of the source/drain features.

Embodiments of the present disclosure provide a method of forming N-type and P-type source/drain features using one patterned mask and one self-aligned mask to increase windows of error tolerance and provide flexibilities for source/drain features of various shapes and/or volumes. In some embodiments, after forming a first type of source/drain features, a self-aligned mask layer is formed over the first type of source/drain features without using photolithography process, thus, avoid damaging the first type of source/drain features in the patterning process. The self-aligned mask layer may be formed by oxidizing an epitaxial cap layer formed over the first type of source/drain features and an annealing process. The self-aligned mask layer is removed after formation of the second type of source/drain features. In some embodiments, the first type of source/drain features and the second type of source/drain features may be overlapping or bridging with the self-aligned mask layer formed in between.

Figure 1:
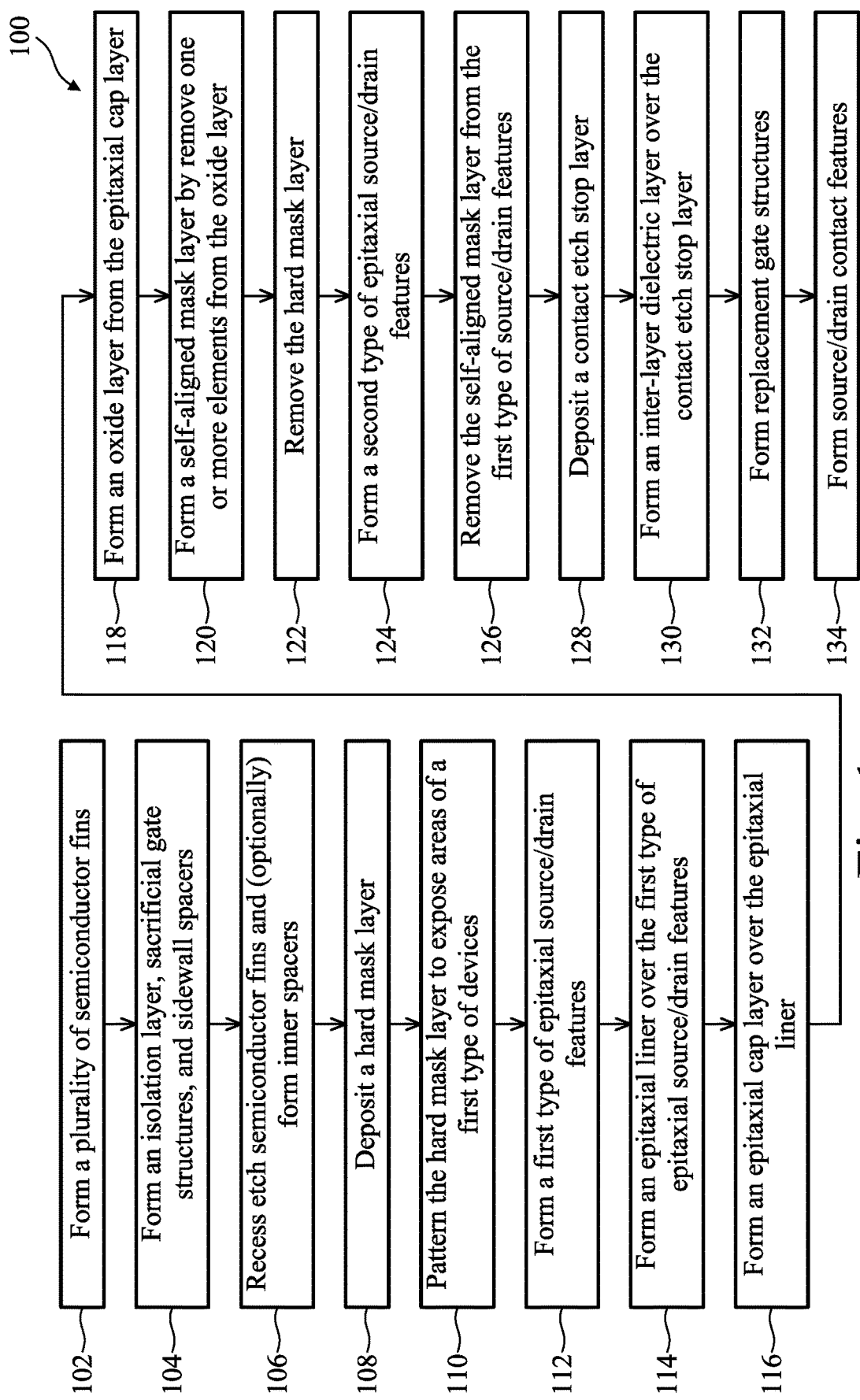
FIG. 1 is a flow chart of a method for manufacturing of a semiconductor device according to embodiments of the present disclosure.

FIG. 1 is a flow chart of a method 100 for manufacturing of a semiconductor device according to embodiments of the present disclosure. FIGS. 2 to 18 schematically illustrate various stages of manufacturing an exemplary semiconductor device 200 according to embodiments of the present disclosure. Particularly, the semiconductor device 200 may be manufactured according to the method 100 of FIG. 1.

Figure 2:
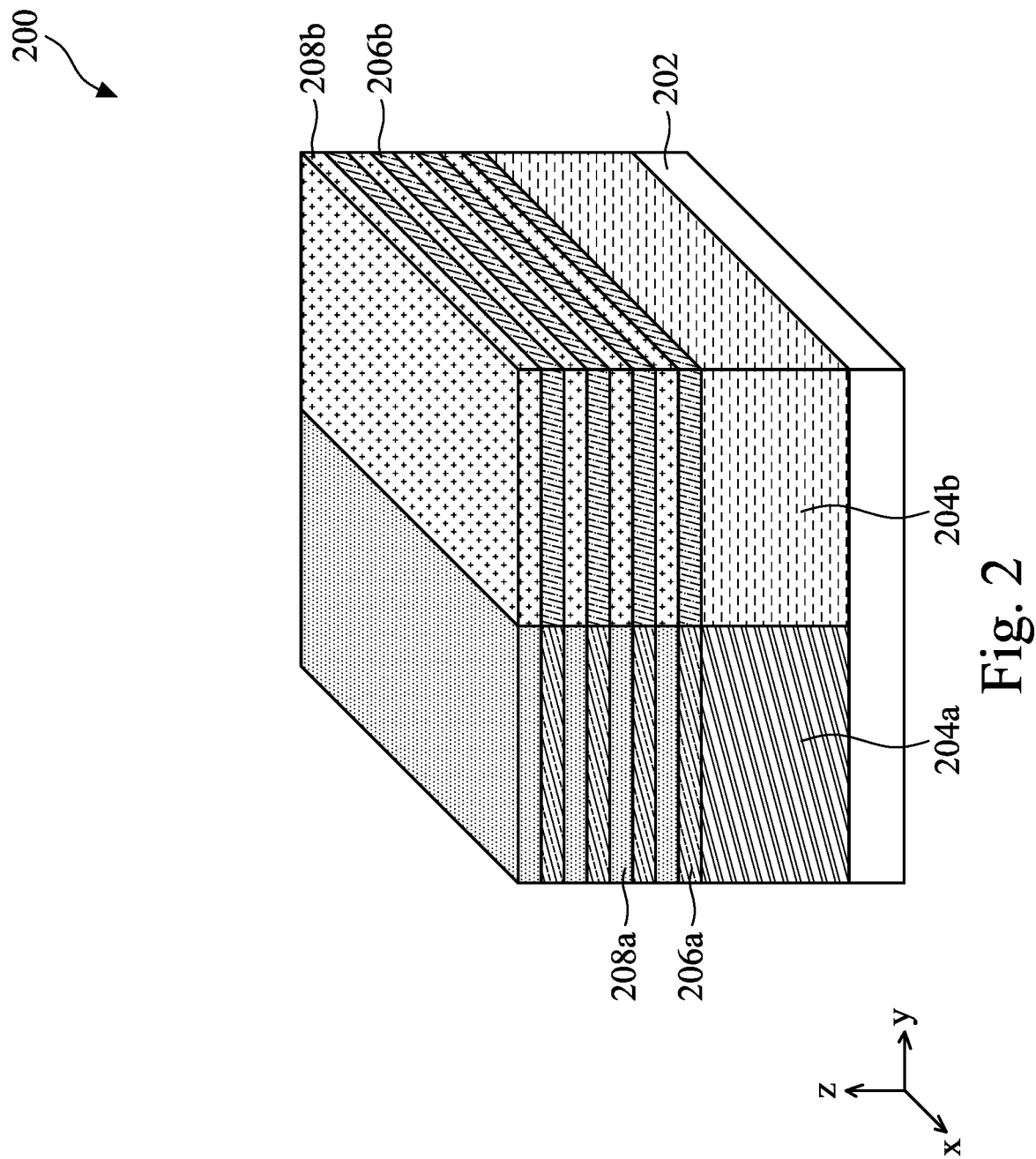
Figure 3:
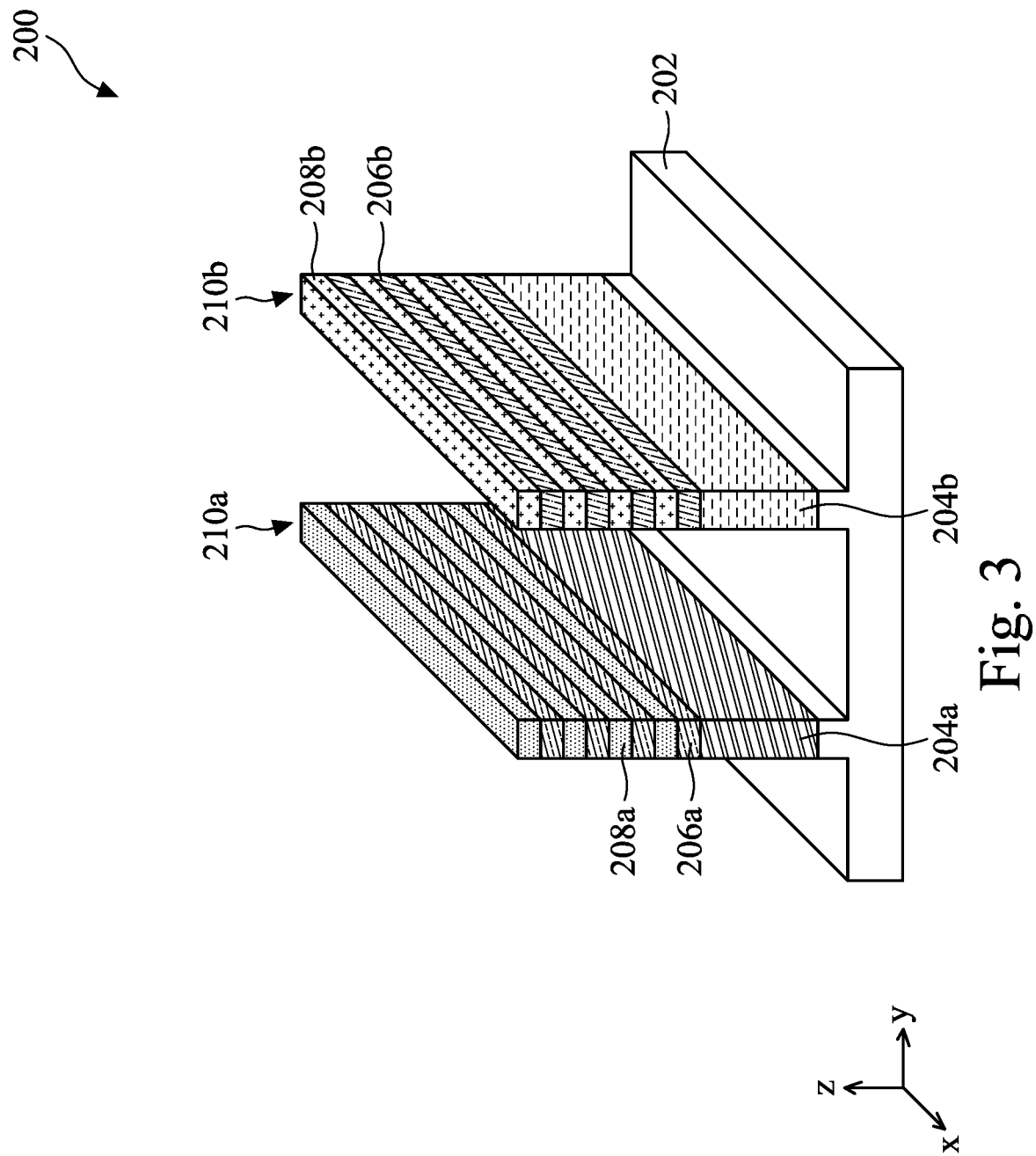

At operation 102 of the method 100, a plurality fin structures are formed on a substrate where a semiconductor device is to be formed. FIGS. 2 and 3 are schematic perspective view of the semiconductor device 200. As shown in FIG. 2, a substrate 202 is provided to form the semiconductor device 200 thereon. The substrate 202 may include a single crystalline semiconductor material such as, but not limited to Si, Ge, SiGe, GaAs, InSb, GaP, GaSb, InAlAs, InGaAs, GaSbP, GaAsSb, and InP. The substrate 202 may include various doping configurations depending on circuit design. In FIG. 2, the substrate 202 includes a p-doped region or p-well 204a and an n-doped region or n-well 204b. One or more n-type devices, such as nFETs, are to be formed over and/or within p-well 204a. One or more p-type devices, such as pFETs, are to be formed over and/or within n-well 204b. FIG. 2 shows that the p-well 204a is in a doped local region of a doped substrate, which is not limiting. In other embodiments, the p-well 204a and the n-well 204b may be separated by one or more insulation bodies, e.g., shallow trench insulation ("STI").

A semiconductor stack including alternating first semiconductor layers 206a and second semiconductor layers 208a is formed over the p-well 204a to facilitate formation of nanosheet channels in a multi-gate n-type device, such as nanosheet channel nFETs. The first semiconductor layers 206a and second semiconductor layers 208a have different compositions. In some embodiments, the two semiconductor layers 206a and 208a provide for different oxidation rates and/or different etch selectivity. In later fabrication stages, portions of the second semiconductor layers 208a form nanosheet channels in a multi-gate device. Four first semiconductor layers 206a and four second semiconductor layers 208a are alternately arranged as illustrated in FIG. 2 as an example. More or less semiconductor layers 206a and 208a may be included depending on the desired number of channels in the semiconductor device to be formed. In some embodiments, the number of semiconductor layers 206a and 208a is between 1 and 10.

In some embodiments, the first semiconductor layer 206a may include silicon germanium (SiGe). The first semiconductor layer 206a may be a SiGe layer including more than 25% Ge in molar ratio. For example, the first semiconductor layer 206a may be a SiGe layer including Ge in a molar ration in a range between 25% and 50%. The second semiconductor layer 208a may include silicon. In some embodiments, the second semiconductor layer 208a may be a Ge layer. The second semiconductor layer 208a may include n-type dopants, such as phosphorus (P), arsenic (As), etc.

Similarly, a semiconductor stack including alternating third semiconductor layers 206b and fourth semiconductor layers 208b is formed over the n-well 204b to facilitate formation of nanosheet channels in a multi-gate p-type device, such as nanosheet channel pFETs.

In some embodiments, the third semiconductor layer 206b may include silicon germanium (SiGe). The third semiconductor layer 206b may be a SiGe layer including more than 25% Ge in molar ratio. For example, the third semiconductor layer 206b may be a SiGe layer including Ge in a molar ration in a range between 25% and 50%. The fourth semiconductor layer 208b may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof. In some embodiments, the fourth semiconductor layer 208b may be a Ge layer. The fourth semiconductor layer 208b may include p-type dopants, boron etc.

The semiconductor layers 206a, 206b, 208a, 208b may be formed by a molecular beam epitaxy (MBE) process, a metalorganic chemical vapor deposition (MOCVD) process, and/or other suitable epitaxial growth processes. The semiconductor stacks over the n-well 204b and the p-well 204a may be formed separately using patterning technology.

Fin structures 210a, 210b are then formed from etching the semiconductor stacks and a portion of the n-well 204b, the p-well 204a underneath respectively, as shown in FIG. 3.

Even though, fin structures 210a, 210b for nanosheet FinFET devices are shown in the semiconductor device 200, embodiments of the present disclosure are also applicable to planar FETs, Fin-FETs, Horizontal Gate All Around (HGAA) FETs, Vertical Gate All Around (VGAA) FETs, and other suitable devices.

Figure 4:
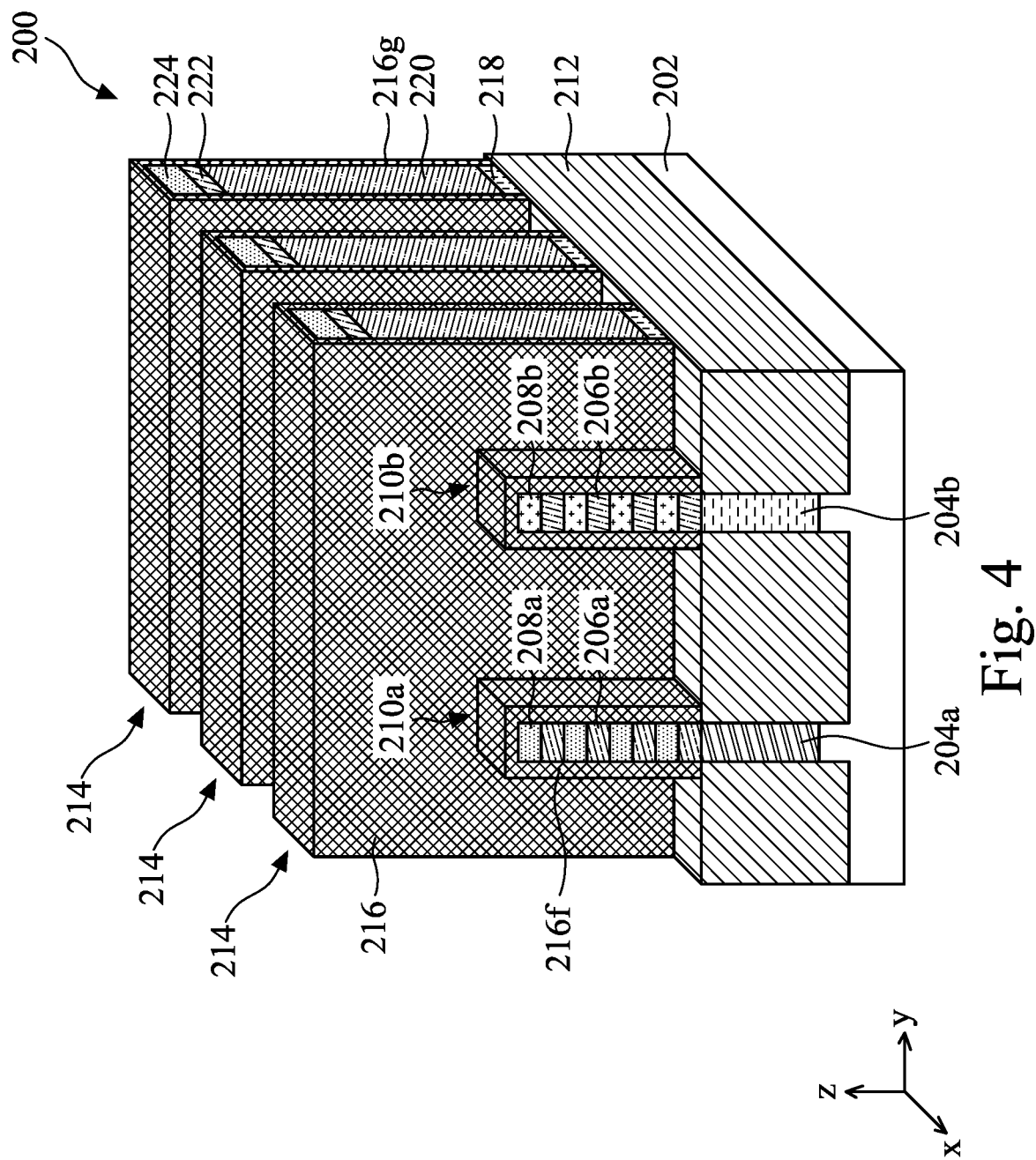

At operation 104, an isolation layer 212, sacrificial gate structures 214, and sidewall spacers 216 are subsequently formed as shown in FIG. 4, which is a schematic view of the semiconductor device 200. The isolation layer 212 is filled in the trenches between the fin structures 210a, 210b and then etched back to below the semiconductor stacks of the fin structures 210a, 210b. The isolation layer 212 may be formed by a high density plasma chemical vapor deposition (HDP-CVD), a flowable CVD (FCVD), or other suitable deposition process. In some embodiments, the isolation layer 212 may include silicon oxide, silicon nitride, silicon oxynitride, fluorine-doped silicate glass (FSG), a low-k dielectric, combinations thereof. In some embodiments, the isolation layer 212 is formed to cover the fin structures 210a, 210b by a suitable deposition process to fill the trenches between the fin structures 210a, 210b, and then recess etched using a suitable anisotropic etching process to expose the active portions of the fin structures 210a, 210b.

The sacrificial gate structures 214 are formed over the isolation layer 212 and over the exposed portions of the fin structures 210a, 210b. The sacrificial gate structures 214 are formed over portions of the fin structures 210a, 210b which are to be channel regions. The sacrificial gate structures 214 may include a sacrificial gate dielectric layer 218, a sacrificial gate electrode layer 220, a pad layer 222, and a mask layer 224.

The sacrificial gate dielectric layer 218 may be formed conformally over the fin structures 210a, 210b, and the isolation layer 212. In some embodiments, the sacrificial gate dielectric layer 218 may be deposited by a CVD process, a sub-atmospheric CVD (SACVD) process, a FCVD process, an ALD process, a PVD process, or other suitable process. The sacrificial gate dielectric layer 218 may include one or more layers of dielectric material, such as $SiO_2$, SiN, a high-k dielectric material, and/or other suitable dielectric material.

The sacrificial gate electrode layer 220 may be blanket deposited on the over the sacrificial gate dielectric layer 218. The sacrificial gate electrode layer 220 includes silicon such as polycrystalline silicon or amorphous silicon. The thickness of the sacrificial gate electrode layer is in a range between about 42 nm and about 200 nm. In some embodiments, the sacrificial gate electrode layer 220 is subjected to a planarization operation. The sacrificial gate electrode layer 220 may be deposited using CVD, including LPCVD and PECVD, PVD, ALD, or other suitable process.

Subsequently, the pad layer 222 and the mask layer 224 are formed over the sacrificial gate electrode layer 220. The pad layer 222 may include silicon nitride. The mask layer 224 may include silicon oxide. Next, a patterning operation is performed on the mask layer 224, the pad layer 222, the sacrificial gate electrode layer 220 and the sacrificial gate dielectric layer 218 to form the sacrificial gate structures 214.

The sidewall spacers 216 are formed on sidewalls of each sacrificial gate structures 214, as shown in FIG. 4. After the sacrificial gate structures 214 are formed, the sidewall spacers 216 are formed by a blanket deposition of one or more insulating material. In some embodiments, the insulating material of the sidewall spacers 216 is a silicon nitride-based material, such as SiN, SiON, SiOCN or SiCN and combinations thereof. The sidewall spacers 216 may include gate sidewall spacers 216g formed on sidewalls of the sacrificial gate structures 214 and fin sidewall spacers 216f formed on sidewalls of the fin structures 210a, 210b.

Figure 5:
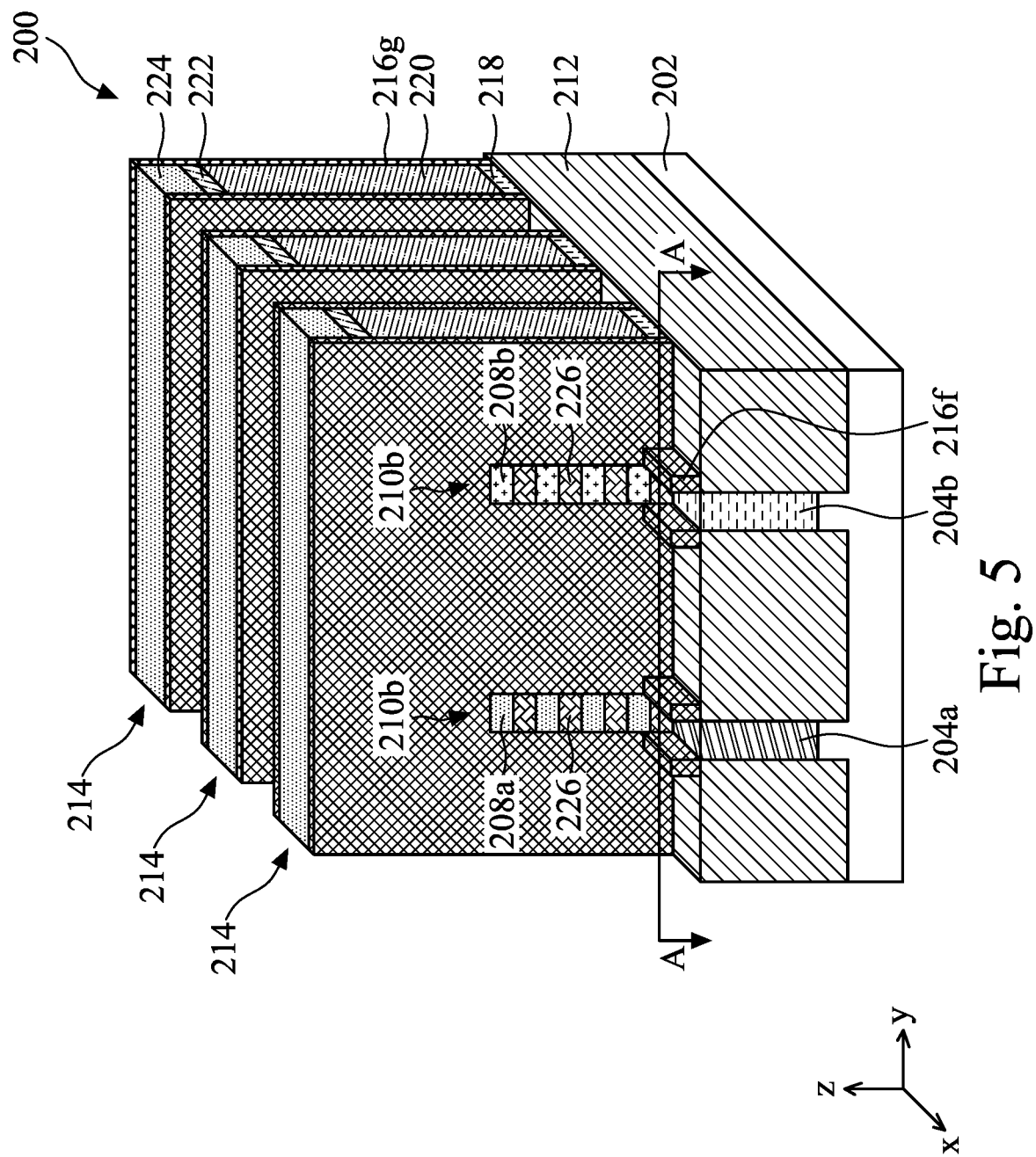

At operation 106, the fin structures 210a, 210b not covered by the sacrificial gate structures 24 are etched back, as shown in FIG. 5, which is a schematic view of the semiconductor device 200. Even though described together in each operation, etching processes for regions for p-type devices, i.e. over the n-well 204b, and for n-type devices, i.e. over the p-well 204a, may be performed separately using patterned masks and different processing recipes.

The fin structures 210a, 210b not covered by the sacrificial gate structures 214 are etched to expose well portions of each fin structure 210a, 210b. In some embodiments, suitable dry etching and/or wet etching may be used to remove the semiconductor layers 206a, 206b, 208a, 208b, together or separately. A portion of fin sidewall spacers 216f may remain after the fin structures 210a, 210b are recessed. A height of the remaining fin sidewall spacers 216f may be used to control the shape of the subsequently formed epitaxial source/drain features.

After recess etch of the fin structures 210a, 210b, inner spacers 226 are formed as shown in FIG. 5. To form the inner spacers 226, the semiconductor layers 206a, 206bb under the gate sidewall spacers 216g are selectively etched from the semiconductor layers 208a, 208b along the horizontal direction, or x-direction, to form spacer cavities. In some embodiments, the semiconductor layers 206a, 206b can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After forming the spacer cavities, the inner spacers 226 are formed in the spacer cavities by conformally deposit and then partially remove an insulating layer. The insulating layer can be formed by ALD or any other suitable method. The subsequent etch process removes most of the insulating layer except inside the cavities, resulting in the inner spacers 226.

Figure 6:
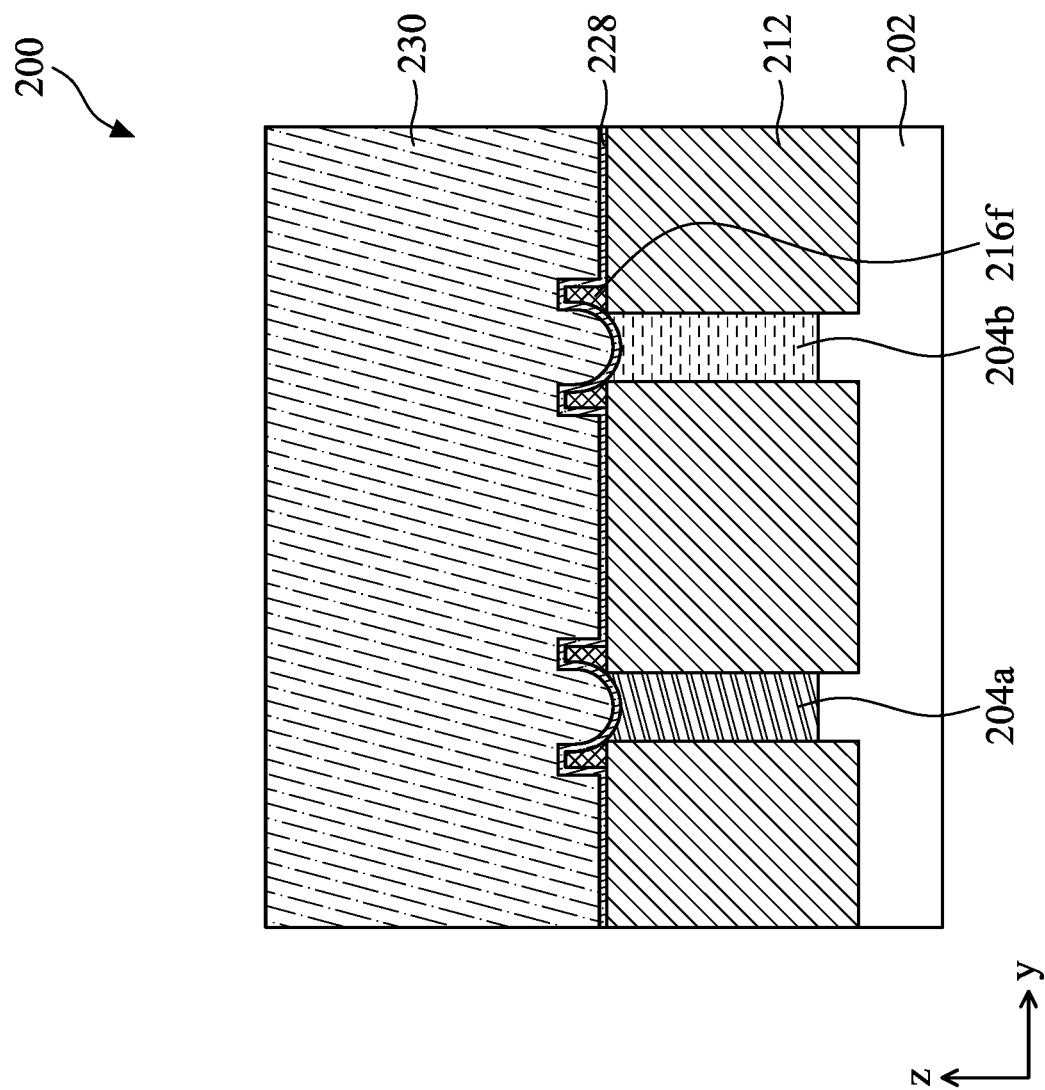

At operation 108, a hard mask layer is deposited. The hard mask layer is to be patterned to subsequently processing areas for one type of devices, such as N-type device areas or P-type device areas. FIG. 6 is a schematic sectional view of the semiconductor device 200 along A-A line in FIG. 5. FIG. 6 schematically demonstrates one example of the semiconductor device 200 after operation 108. As shown in FIG. 6, a hard mask layer 228 is deposited over exposed surfaces on the substrate 202, and a photoresist layer 230 is coated over the hard mask layer 228. In some embodiments, the hard mask layer 228 may include an aluminum oxide ($AlO_x$) layer. Other suitable materials capable of withstanding the processing conditions of epitaxial source/drain formation and with an etch selectivity with a subsequently formed self-aligned mask may be used in the hard mask layer 228.

Figure 7:
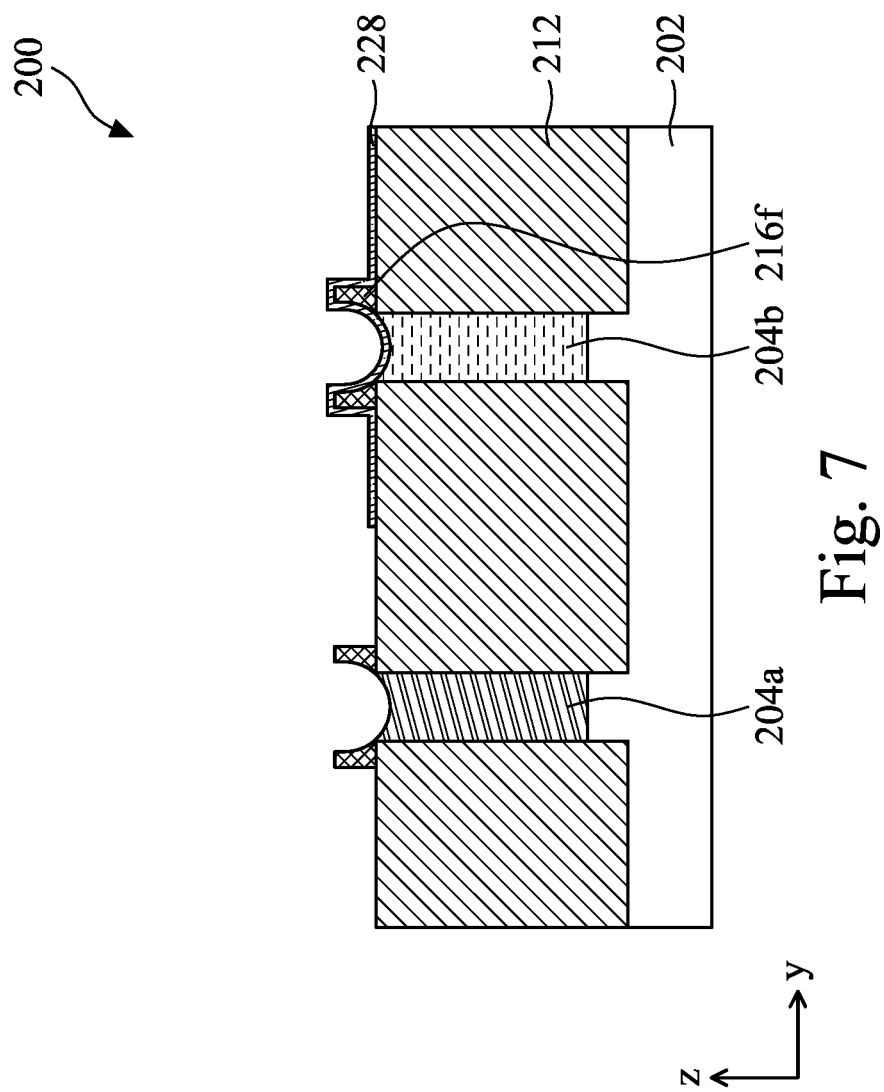

At operation 110, a photolithography process is performed to pattern the hard mask layer 228 to expose s processing areas for one type of devices, such as N-type device areas or P-type device areas. FIG. 7 is a schematic sectional view of the semiconductor device 200 along A-A line in FIG. 5. FIG. 7 schematically demonstrates one example of the semiconductor device 200 after operation 110. As shown in FIG. 7, the hard mask layer 228 is patterned to expose areas over the p-well 204a where N-type devices are to be formed. Alternatively, the n-well 204b areas may be exposed as discussed other examples. After the photolithography process, an etch process is performed to remove the portion of the hard mask layer 228. In some embodiments, the etch process to remove the portion of the hard mask layer 228 includes a wet etch process, a dry etch process, or a combination thereof. The photoresist layer 230 may be removed by a suitable process, such as a wet strip process, prior to forming epitaxial source/drain features.

Figure 8:
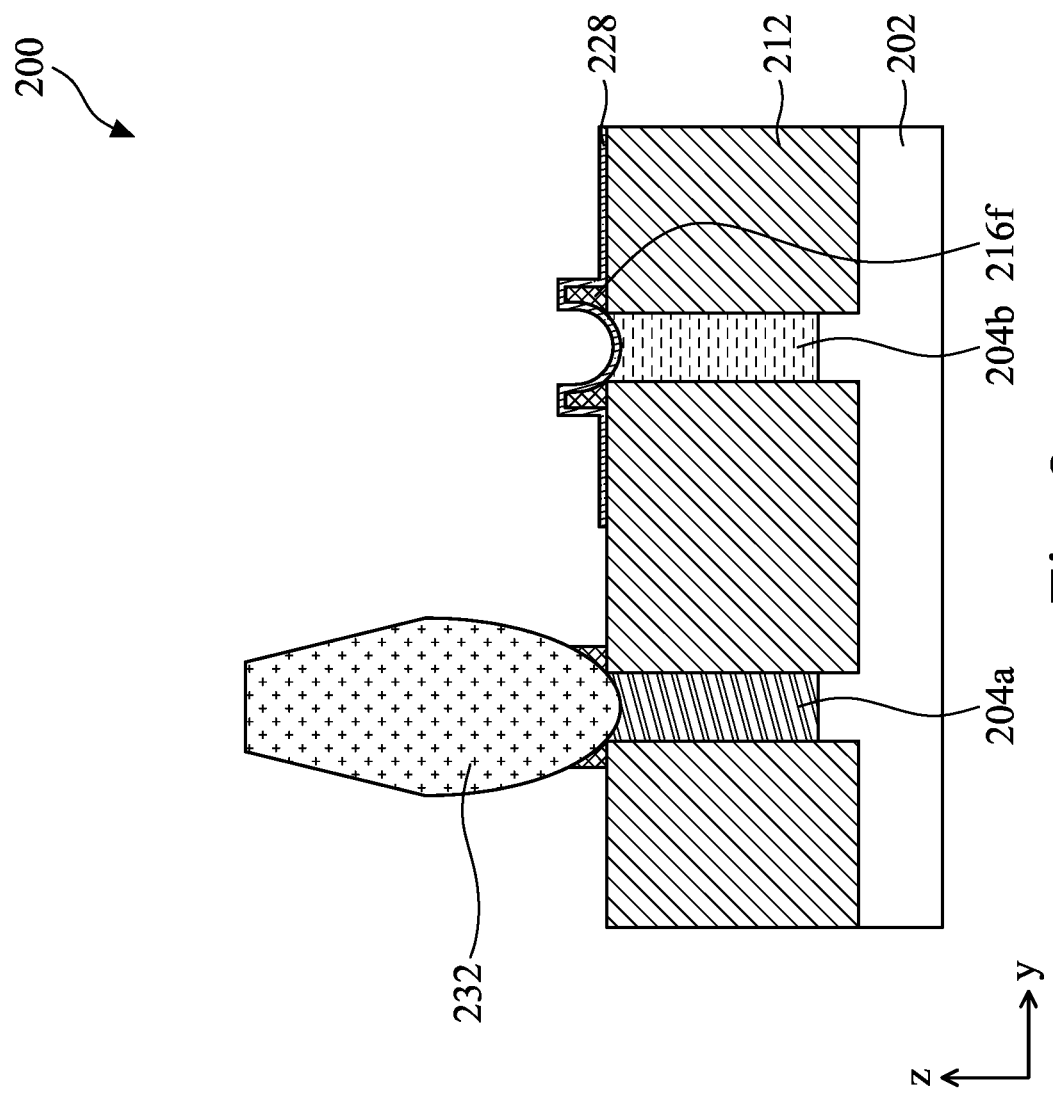

At operation 112, epitaxial source/drain features of a first type of devices are formed. The first type of devices may be N-type devices or P-type devices. FIG. 8 is a schematic sectional view of the semiconductor device 200 along A-A line in FIG. 5. FIG. 8 schematically demonstrates one example of the semiconductor device 200 after operation 112. As shown in FIG. 8, epitaxial source/drain features 232 for N-type devices are formed from exposed surfaces of the fin structure 210*a*.

The epitaxial source/drain features 232 for n-type devices may include one or more layers of Si, SiP, SiC and SiCP. The epitaxial source/drain features 232 also include N-type dopants, such as phosphorus (P), arsenic (As), etc. In some embodiments, the epitaxial source/drain features 232 may be a Si layer includes phosphorus (P) dopants. The epitaxial source/drain features 232 shown in FIG. 8 has an oval shape. However, the epitaxial source/drain features 232 may be other shapes according to the design. The epitaxial source/drain features 232 may be formed by any suitable method, such as by CVD, CVD epitaxy, molecular beam epitaxy (MBE), or any suitable deposition technique.

Figure 9A:
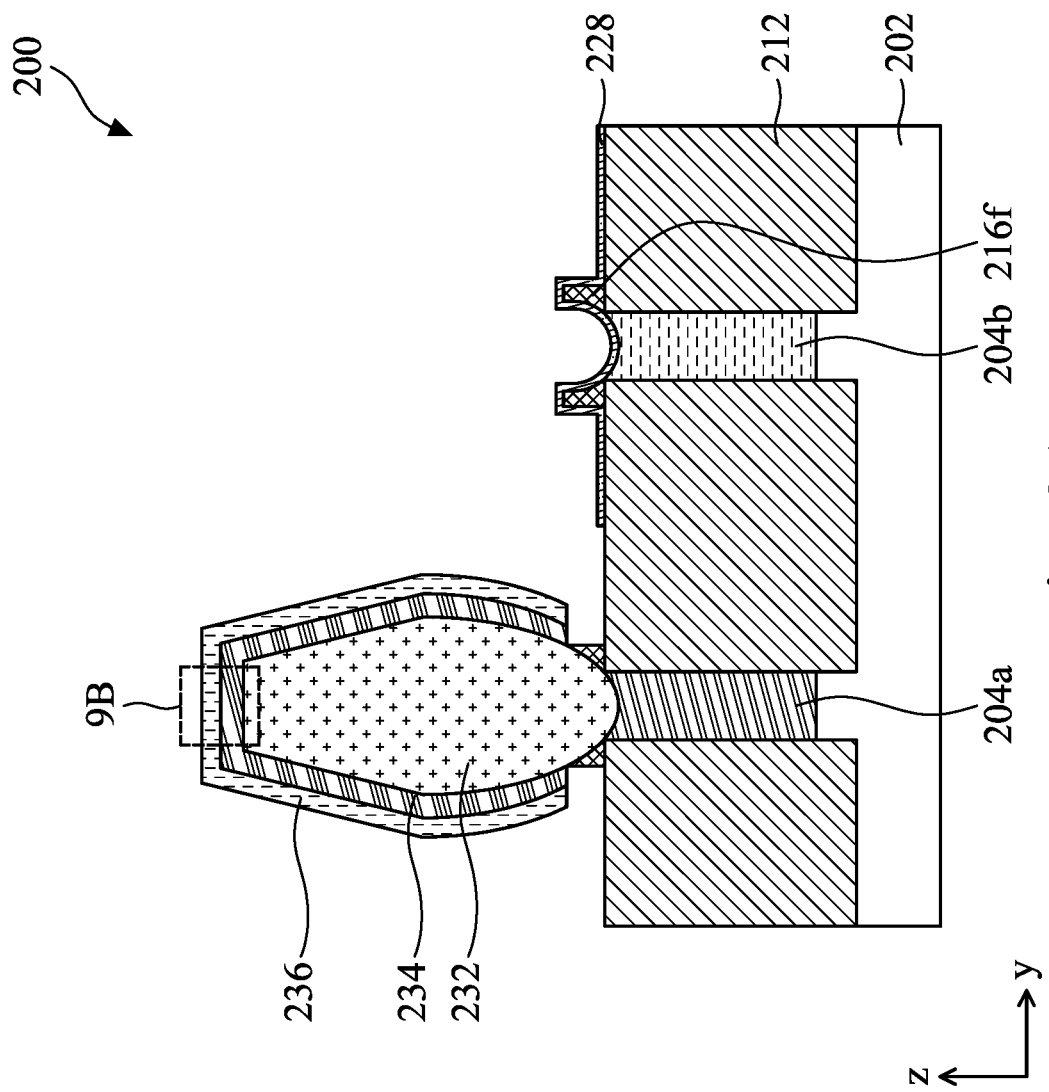

At operation 114, an epitaxial liner is formed over the epitaxial source/drain features for the first type of devices. In some embodiments, the epitaxial liner is formed in-situ with the epitaxial source/drain features for the first type of devices. The first type of devices may be N-type devices or P-type devices. FIG. 9A is a schematic sectional view of the semiconductor device 200 along A-A line in FIG. 5. FIG. 9A schematically demonstrates one example of the semiconductor device 200 after operation 114. As shown in FIG. 9A, an epitaxial liner 234 is formed over the epitaxial source/drain features 232 for N-type devices.

The epitaxial liner 234 is selectively formed on the exposed surfaces of the epitaxial source/drain features 232 by an epitaxial process. The epitaxial liner 234 is substantially conformal over exposed surfaces of the source/drain features 232. The epitaxial liner 234 may be formed by any suitable method, such as by CVD, CVD epitaxy, molecular beam epitaxy (MBE), or any suitable deposition technique. According to some embodiments of the present disclosure, the epitaxial liner 234 is formed in-situ in the same chamber where the epitaxial source/drain features 232 are formed.

In some embodiments, the epitaxial liner 234 is a semiconductor layer of a single crystalline material. The epitaxial liner 234 functions to provide a crystal structural transition between the epitaxial source/drain features 232 and an epitaxial cap layer to be formed at the next operation. The epitaxial liner 234 may also function as a barrier layer to prevent diffusion of dopants in the epitaxial source/drain features 232.

In some embodiments, the epitaxial liner 234 is a dopant free epitaxial semiconductor layer. The epitaxial liner 234 may be formed from other materials that is capable of providing structural transition and/or diffusion barrier, for example, the epitaxial liner 234 may include one or more layers of Si, Ge, SiGe, GaAs, InSb, GaP, GaSb, InAlAs, InGaAs, GaSbP, GaAsSb, and InP, depending on the material selection in the epitaxial source/drain features 232 and the subsequent layer. In one embodiment, the epitaxial liner 234 is a dopant free epitaxial silicon layer.

Figure 9B:
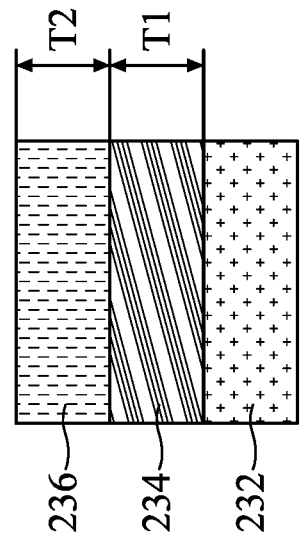

FIG. 9B is a partial enlarged view of the FIG. 9A within a region marked by 9A. As shown in FIG. 9B, the epitaxial liner 234 may have a thickness T1. In some embodiments, the thickness T1 of the epitaxial liner 234 is in a range between 1 nm and 5 nm. A thickness less than 1 nm may not provide enough transitional and/or barrier benefit. A thickness greater than 5 nm would not provide additional benefit.

At operation 116, an epitaxial cap layer is formed over the epitaxial liner. In some embodiments, the epitaxial cap layer is formed in-situ with the epitaxial liner and the epitaxial source/drain features for the first type of devices. The epitaxial cap layer is subsequently oxidized to form a self-aligned mask over the epitaxial source/drain features for the first type of devices. In some embodiments, the epitaxial cap layer includes materials having different oxidation rates and/or different etch selectivity with the epitaxial liner and the epitaxial source/drain features for the first type of devices. In some embodiments, the epitaxial cap layer may be formed from materials suitable for source/drain features of a second type of devices. For example, when the first type of the devices are N-type devices, the epitaxial cap layer is formed from material suitable for source/drain features of P-type devices; and when the first type of the devices are P-type devices, the epitaxial cap layer is formed from material suitable for source/drain features of N-type devices.

FIG. 9A schematically demonstrates one example of the semiconductor device 200 after operation 116. As shown in FIG. 9A, an epitaxial cap layer 236 is selectively formed on the exposed surfaces of the epitaxial liner 234 by an epitaxial process. The epitaxial cap layer 236 may be substantially conformal.

The epitaxial cap layer 236 may be formed by any suitable method, such as by CVD, CVD epitaxy, molecular beam epitaxy (MBE), or any suitable deposition technique. According to some embodiments of the present disclosure, the epitaxial cap layer 236 is formed in-situ in the same chamber where the epitaxial source/drain features 232 and the epitaxial liner 234 are formed.

In some embodiments, the epitaxial cap layer 236 includes semiconductor materials having different oxidation rates and/or different etch selectivity with the epitaxial liner 234 and the epitaxial source/drain features 232. The epitaxial cap layer 236 are formed from material that can be epitaxially grown from the epitaxial liner 234 and may be selectively oxidized from the epitaxial liner 234.

The epitaxial cap layer 236 may include silicon, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP. In some embodiments, the epitaxial cap layer 236 may include silicon germanium (SiGe). For example, the epitaxial cap layer 236 may be a SiGe layer including Ge in a molar ration in a range between 20% and 50%.

As shown in FIG. 9B, the epitaxial cap layer 236 may have a thickness T2. In some embodiments, the thickness T2 of the epitaxial cap layer 236 is in a range between 2 nm and 10 nm. A thickness less than 2 nm cannot form a hard mask thick enough to protect the epitaxial source/drain features 232 during subsequent processes. A thickness greater than 10 nm would not provide additional benefit. In some embodiments, a ratio of the thickness T2 of the epitaxial cap layer 236 over the thickness T1 of the epitaxial liner 234 may be in a range between 0.4 and 10. A ratio T2:T1 lower than 0.4 may not be enough to form a hard mask sufficient enough to protect the epitaxial source/drain features 232 during subsequent processes. A ratio T2:T1 greater than 10 would increase operation cost without additional benefit.

The expression "epitaxy layer" refers to a layer or structure of single crystal material. Likewise, the expression "epitaxially grown" refers to a layer or structure of single crystal material.

At operation 118, an oxidation treatment is performed to selectively oxidize the epitaxial cap layer. FIG. 10A is a schematic sectional view of the semiconductor device 200 along A-A line in FIG. 5. FIG. 10A schematically demonstrates one example of the semiconductor device 200 after operation 118. FIG. 10B is a partial enlarged view of the FIG. 10A within a region marked by 10B. As shown in FIGS. 10A-10B, an oxide layer 238 is formed from the epitaxial cap layer 236 while the epitaxial liner 234 is substantially unaffected by the oxidation treatment. In some embodiments, the oxide layer 238 may include SiGeOx.

As described above, the epitaxial cap layer 236 and the epitaxial liner 234 have different oxidation rates. In this case, the epitaxial cap layer 236 may include a material having a first oxidation rate, and the epitaxial liner 234 may include a material having a second oxidation rate less than the first oxidation rate. By way of example, in embodiments where the epitaxial cap layer 236 includes SiGe, and where the epitaxial liner 234 include Si, the faster SiGe oxidation rate as compared to Si ensures that the SiGe layer becomes fully oxidized while minimizing or eliminating the oxidization of the epitaxial liner 234. In some embodiment, the epitaxial cap layer 236 may be partially oxidized instead of fully oxidized to achieve processing efficiency. Situations of partial oxidization are discussed in the FIG. 22A.

The formation of the oxide layer 238 may be performed using wet oxidation, dry oxidation, plasma oxidation, for example, decoupled plasma oxidation (DPO), or a combination thereof. In some embodiments, a low thermal budget and/or reduced diffusion of oxygen are performed at operation 118 to prevent re-crystalizing of the epitaxial source/drain features 232.

In some embodiments, a wet steam oxidation process is performed to form the oxide layer 238. For example, a wet steam oxidation process may be performed using water vapor or steam as an oxidant. In one exemplary process, the wet steam oxidation process may be performed at atmosphere pressure (AP), within a temperature range of about 400-800° C., and for a time from about 1 hour and 4 hours. The temperature and reaction time may be adjusted to achieve desired oxidizing percentage. To achieve the same amount of oxidizing percentage, reacting at a higher temperature will need a shorter time, and reacting at a lower temperature will need a longer time. The wet steam oxidation process is performed at a temperature lower than abut 800° C. A temperature higher than 800° C. may alter crystalline structure of the epitaxial source/drain features 232. A temperature lower than 400° C. may take too long to achieve the desired oxidation thus increasing manufacturing cost.

In some embodiments, a dry oxidation process is performed to form the oxide layer 238. The dry oxidation process may be performed using oxygen as an oxidant. In one exemplary process, the dry oxidation process may be performed at atmosphere pressure (AP), within a temperature range of about 400-800° C. The dry oxidation process is performed at a temperature lower than abut 800° C. A temperature higher than 800° C. may alter crystalline structure of the epitaxial source/drain features 232. A temperature lower than 400° C. may take too long to achieve the desired oxidation thus increasing manufacturing cost.

In some embodiments, the oxidation treatment process may be performed in a plasma containing environment, such as decoupled plasma oxidation using inductively coupled plasma processing. The oxidation treatment may be performed by using an oxygen containing gas mixture in a processing environment to react the epitaxial cap 236. In some embodiments, the oxygen containing gas mixture includes at least one of an oxygen containing gas with or without an inert gas. Suitable examples of the oxygen containing gas include $O_2$, $N_2$, $NH_3$, and the like. Suitable examples of the inert gas supplied with the gas mixture include at least one of Ar, He, Kr, and the like. In an exemplary embodiment, the oxygen containing gas supplied in the oxygen containing gas mixture is $O_2$ gas. During the oxidation treatment process, several process parameters may be regulated to control the oxidation process. In one example, the oxidation treatment is performed in a relatively low pressure, such as a pressure between about 0.5 Pa and about 10 Pa. In some embodiments, the decoupled plasma oxidation may be performed by applying a bias to the substrate to achieve desired step coverage. For example, a bias power in a range between 3 watts and about 10 watts.

It is noted that the oxidation process conditions provided herein are merely exemplary and are not meant to be limiting.

Figure 11A:
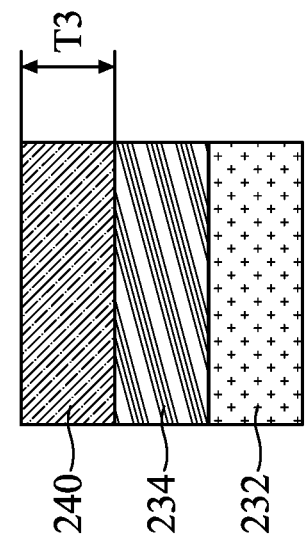
Figure 11B:
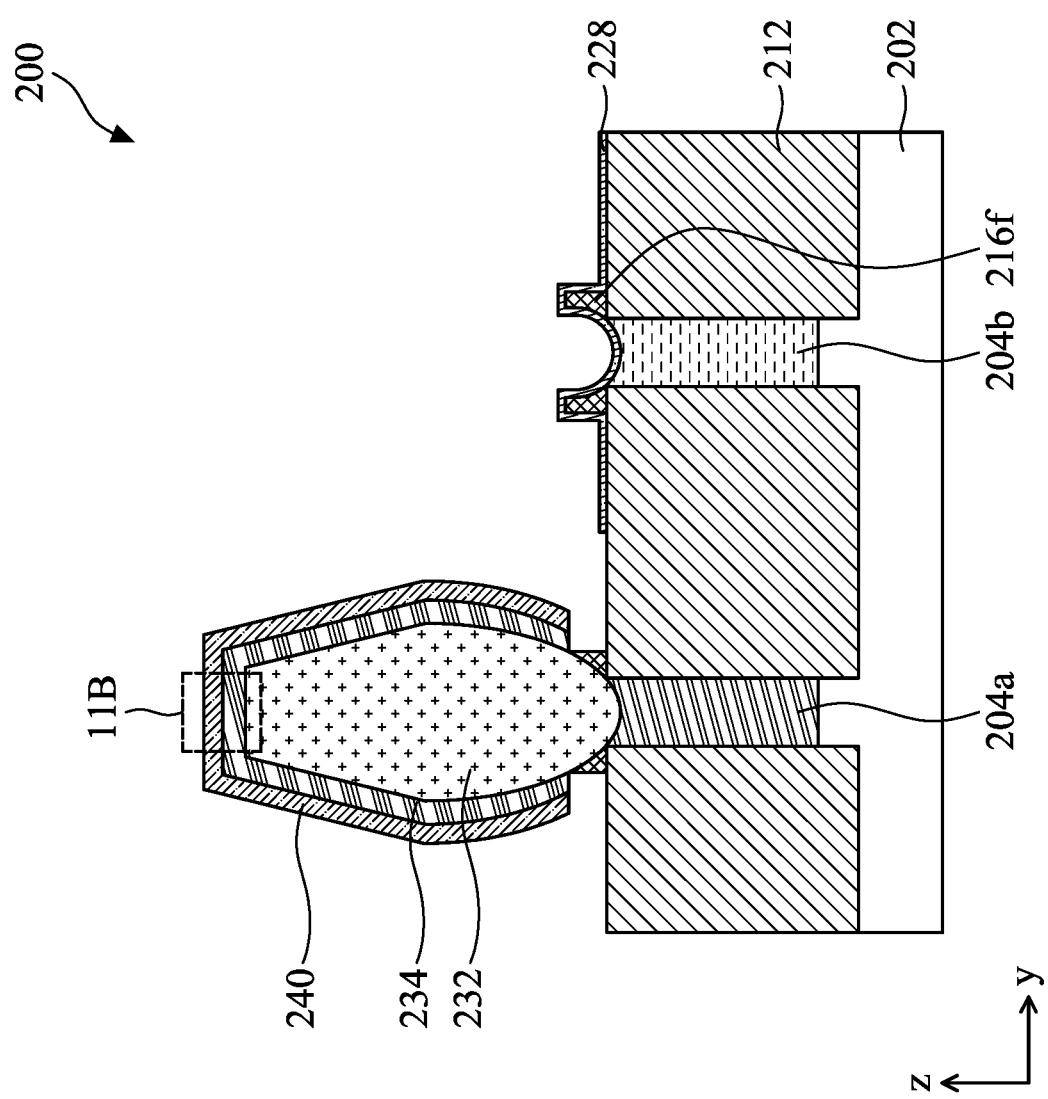

At operation 120, an anneal process is performed to remove one or more elements from at least a topmost portion of the oxide layer, resulting in a self-aligned mask layer. With the one or more elements removed from at least a topmost portion, the self-aligned mask layer may gain etch selectivity relative to subsequently formed source/drain features of a second type of devices. FIG. 11A is a schematic sectional view of the semiconductor device 200 along A-A line in FIG. 5. FIG. 11A schematically demonstrates one example of the semiconductor device 200 after operation 120. As shown in FIG. 11A, a self-aligned mask layer 240 is generated from the oxide layer 238 covering the epitaxial source/drain features 232. FIG. 11B is a partial enlarged view of the FIG. 11A within a region marked by 11B.

In some embodiments, the anneal process at operation removes Ge from the oxide layer 238 including SiGeOx resulting in the self-aligned mask layer 240 including SiOx. In some embodiments, the anneal process substantially removes all Ge from the oxide layer 238, the entire portion of the oxide layer 238 is converted to the self-aligned mask layer 240. In other embodiments, to be discussed later, Ge is only removed from topmost portion of the oxide layer 238, a portion of SiGeOx remains between the self-aligned mask layer 240 and the epitaxial liner 234.

As shown in FIG. 11B, the self-aligned mask layer 240 may have a thickness T3. In some embodiments, the thickness T3 of the self-aligned mask layer 240 is in a range between 2 nm and 10 nm. A thickness less than 2 nm is not thick enough to protect the epitaxial source/drain features 232 during subsequent processes. A thickness greater than 10 nm would not provide additional benefit. In some embodiment, the self-aligned mask layer 240 may be generated by removing Ge from a portion of the oxide layer 238 instead of from the entire thickness of the oxide layer 238 to achieve processing efficiency. Situations of partial Ge removal or savaging are discussed in the FIG. 21A.

In one exemplary process, the anneal process may be performed using $N_2$ as reactant, at atmosphere pressure (AP), within a temperature range of about 600-800° C., and for a time from about 0.5 hour and 2 hours. The temperature and reaction time may be adjusted to achieve desired material removal rate. The anneal process is performed at a temperature lower than about 800° C. A temperature higher than 800° C. may alter crystalline structure of the epitaxial source/drain features 232. A temperature lower than 600° C. may take too long to achieve the desired removal percentage thus increasing manufacturing cost.

Figures 12A, 12B:
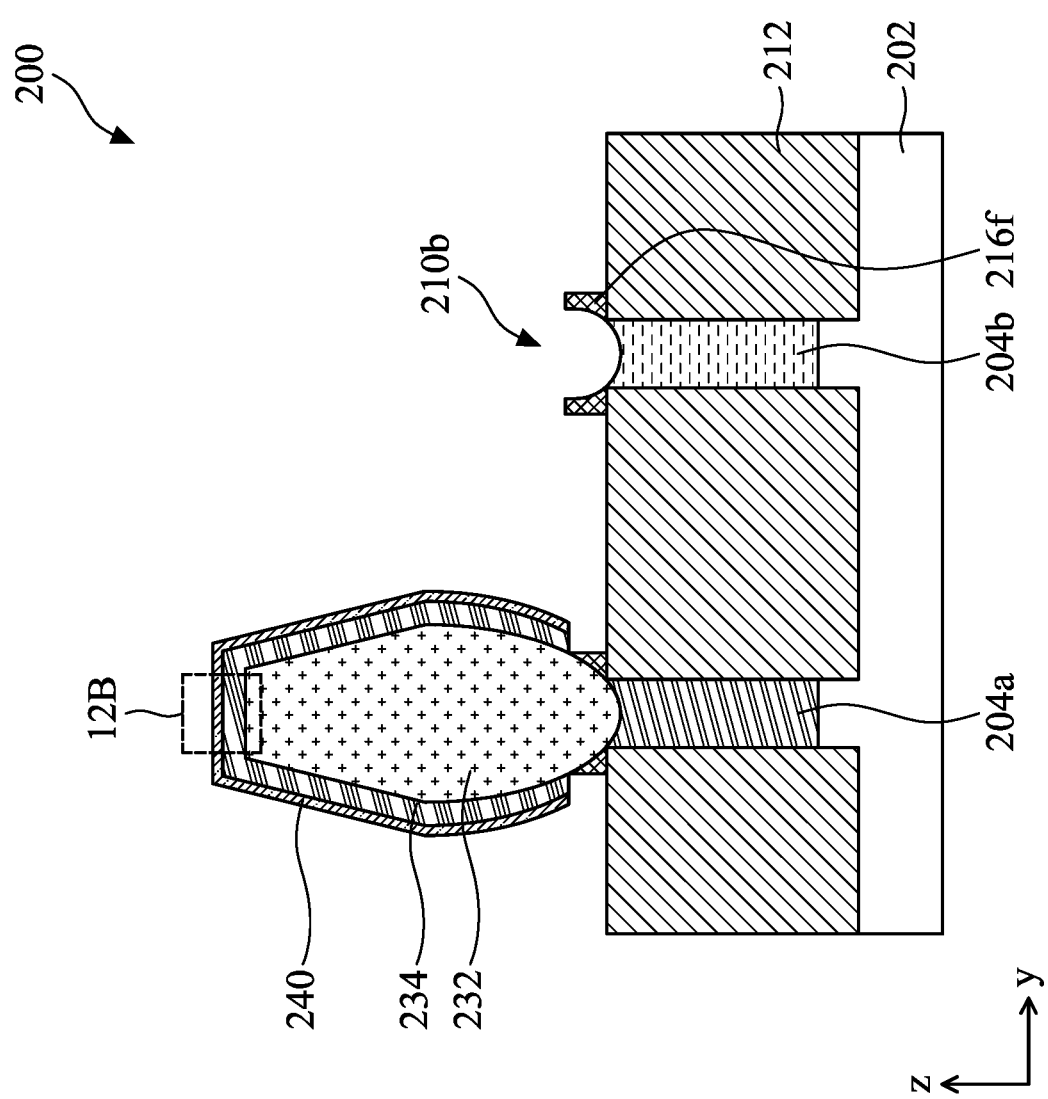

At operation 122, the hard mask layer covering areas other than the first type of devices is removed. FIG. 12A is a schematic sectional view of the semiconductor device 200 along A-A line in FIG. 5. FIG. 12A schematically demonstrates one example of the semiconductor device 200 after operation 122. FIG. 12B is a partial enlarged view of the FIG. 12A within a region marked by 12B. As shown in FIG.

12A, the patterned hard mask layer 228 is removed exposing the fin structure 210b over the n-well 204b for subsequent formation of source/drain features for P-type devices.

In some embodiments, the etch process to remove the portion of the hard mask layer 228 includes a wet etch process, a dry etch process, or a combination thereof. During the etch process, the self-aligned mask layer 240 protects the epitaxial source/drain features 232. In some embodiments, the self-aligned mask layer 240 may incur some thickness loss during the etch process to remove the hard mask layer 228. As shown in FIG. 12B, after removal of the hard mask layer 228, the self-aligned mask layer 240 may have a thickness T4 which is thinner than the thickness T3 prior to removal of the hard mask layer 228.

At operation 124, the epitaxial source/drain features for the second type of devices are formed with the self-aligned mask layer covering the epitaxial source/drain features for the first type of devices. As discussed above, the first type of devices are N-type devices and the second type of devices are P-type devices. Alternatively, the first type of devices are P-type devices and the second type of devices are N-type devices.

FIG. 13A is a schematic sectional view of the semiconductor device 200 along A-A line in FIG. 5. FIG. 13A schematically demonstrates one example of the semiconductor device 200 after operation 124. FIG. 13B is a partial enlarged view of the FIG. 13A within a region marked by 13B. As shown in FIG. 13A, epitaxial source/drain features 242 for P-type devices are formed by epitaxial growth from exposed surfaces of the fin structure 210b.

In some embodiments, a cleaning process is performed to the semiconductor device 200 prior to epitaxially growing the epitaxial source/drain features 242, for example to remove native oxide formed on the surfaces of the fin structure 210b. The cleaning process includes applying diluted hydrofluoric acid (HF) to the surfaces of the semiconductor device 200 for about several tens of seconds. In some embodiments, the cleaning process also includes plasma cleaning using a SiCoNi:NF3/NH3 plasma with a Ar/He/H2 as carrier gas. The SiCoNi plasma cleaning may be performed in-situ in the chamber where the epitaxial deposition is performed.

After the cleaning process, the epitaxial source/drain features 242 may be formed by any suitable method, such as by CVD, CVD epitaxy, molecular beam epitaxy (MBE), or any suitable deposition technique. In some embodiments, the epitaxial source/drain features 242. The epitaxial source/drain features 242 for the p-type devices may include one or more layers of Si, SiGe, Ge with p-type dopants, such as boron (B), for a p-type device, such as pFET. In some embodiments, the epitaxial source/drain features 242 may be SiGe material including boron as dopant.

The self-aligned mask layer 240 acts as a protection layer for the epitaxial source/drain features 232 during cleaning process and epitaxial deposition at operation 124. The oxide material in the self-aligned mask layer 240 covers the epitaxial source/drain features 232 so that no additional epitaxy layer is grown on the epitaxial source/drain features 232. The self-aligned mask layer 240 also withstands the cleaning process prior to forming the epitaxial source/drain features 242.

In some embodiments, the self-aligned mask layer 240 may incur some thickness loss during processes at operation 124. As shown in FIG. 13B, after removal of the hard mask layer 228, the self-aligned mask layer 240 may have a thickness T5 which is thinner than the thickness T4 prior to forming the epitaxial source/drain features 242.

Figure 14:
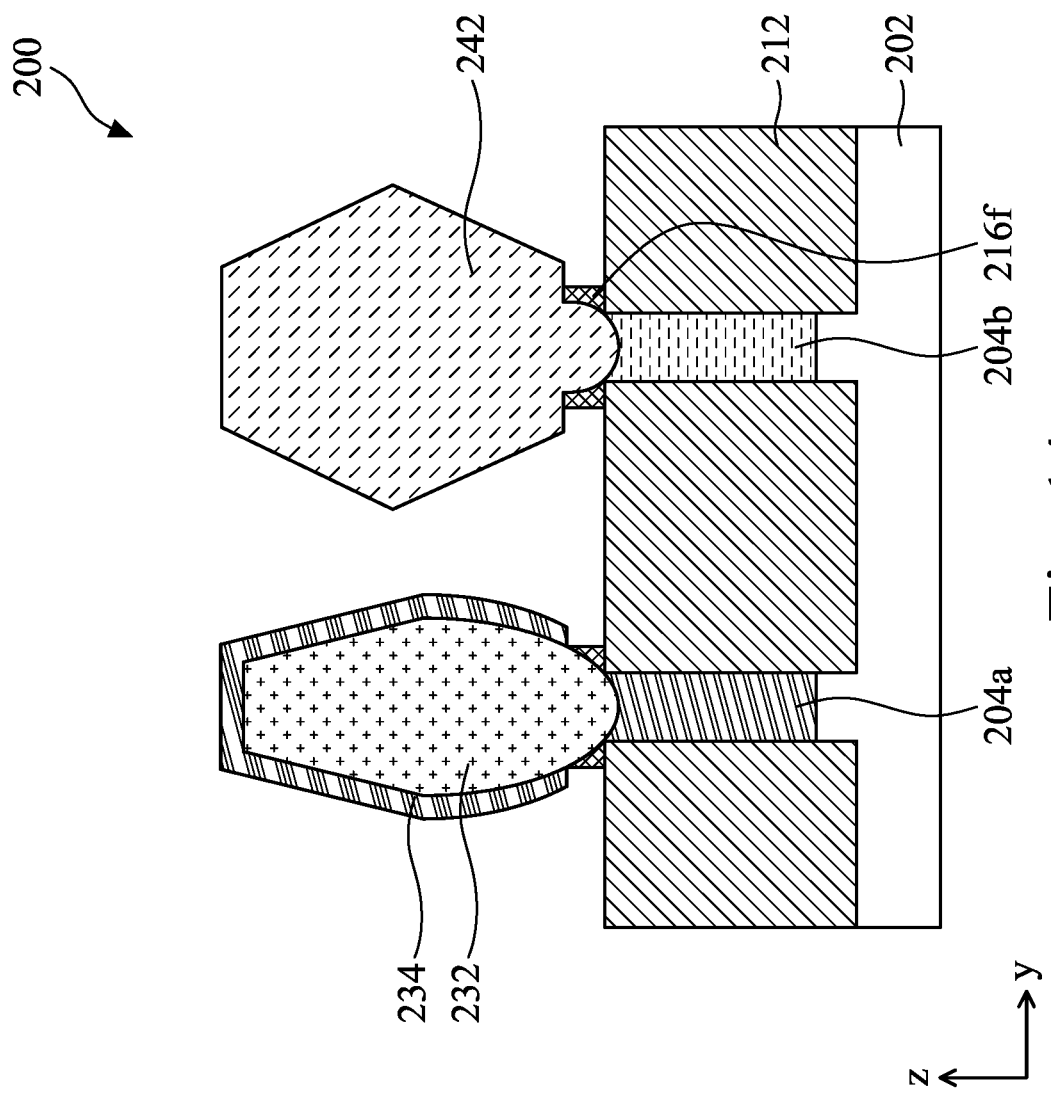

At operation 126, the self-aligned mask layer is removed. A suitable etching method may be used to selectively remove the self-aligned mask layer and expose to epitaxial materials underneath. FIG. 14 is a schematic sectional view of the semiconductor device 200 along A-A line in FIG. 5. FIG. 14 schematically demonstrates one example of the semiconductor device 200 after operation 126. Remainder of the self-aligned mask layer 240 is removed exposing the epitaxial liner 234.

In some embodiments, the self-aligned mask layer 240 may be removed using a halogen containing etchant. For example, a dry etching process using halogen etching gases, such as chlorine ($Cl_2$), sulfur hexafluoride ($SF_6$), or a combination. After removal of the self-aligned mask layer 240, the epitaxial liner 234 is exposed, as shown in FIG. 14.

Figure 15:
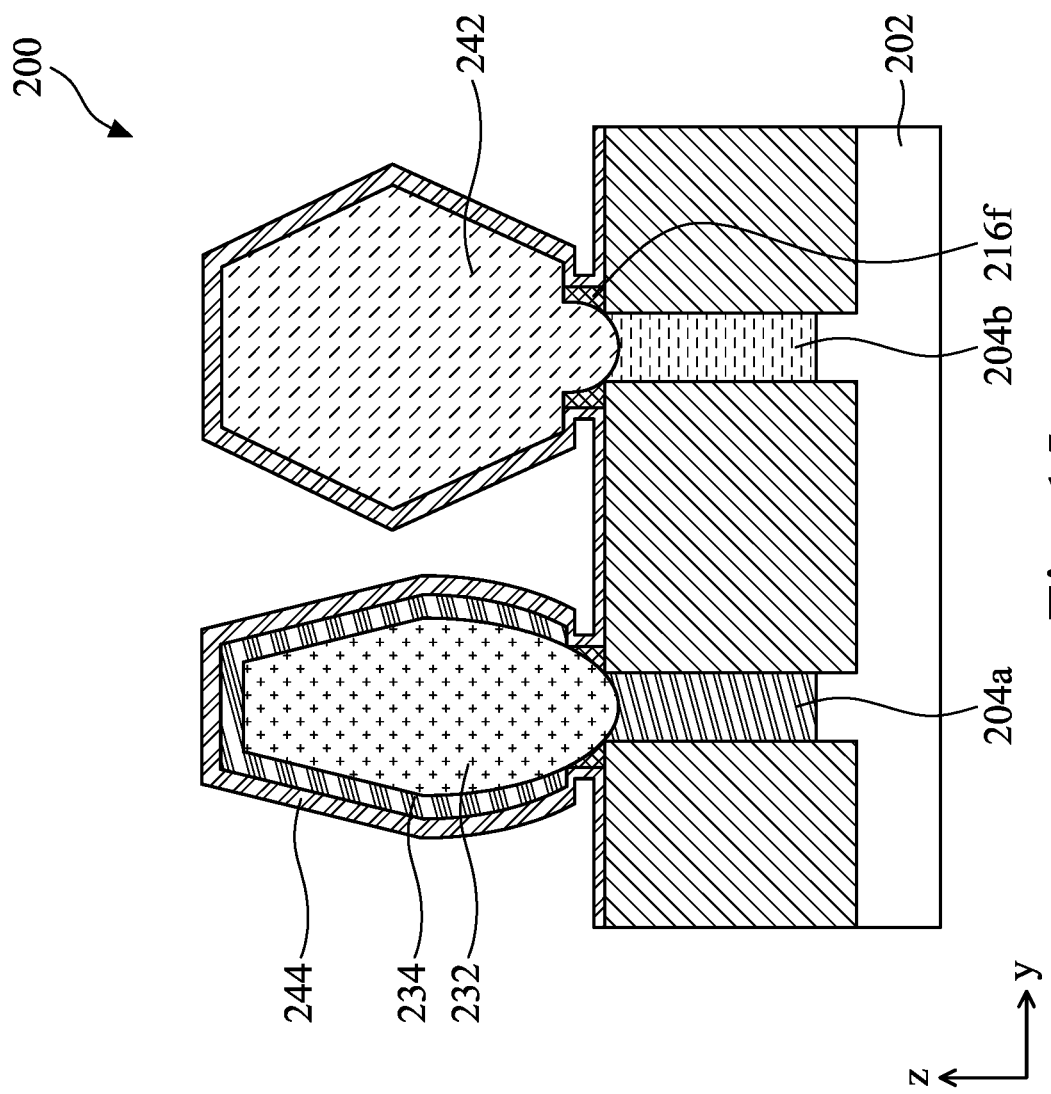

At operation 128, a contact etch stop layer (CESL) is conformally formed over the semiconductor substrate. FIG. 15 is a schematic sectional view of the semiconductor device 200 along A-A line in FIG. 5. FIG. 15 schematically demonstrates one example of the semiconductor device 200 after operation 128. A CESL 244 is formed over exposed surfaces of the semiconductor device 200. The CESL 244 is formed on the epitaxial source/drain features 242, the epitaxial liner 234, the sidewall spacers 216, and the isolation layer 212. The CESL 244 may include $Si_3N_4$, SiON, SiCN or any other suitable material, and may be formed by CVD, PVD, or ALD. As shown in FIG. 15, the epitaxial liner 234 is between the CESL 244 and the epitaxial source/drain features 232.

Figure 16:
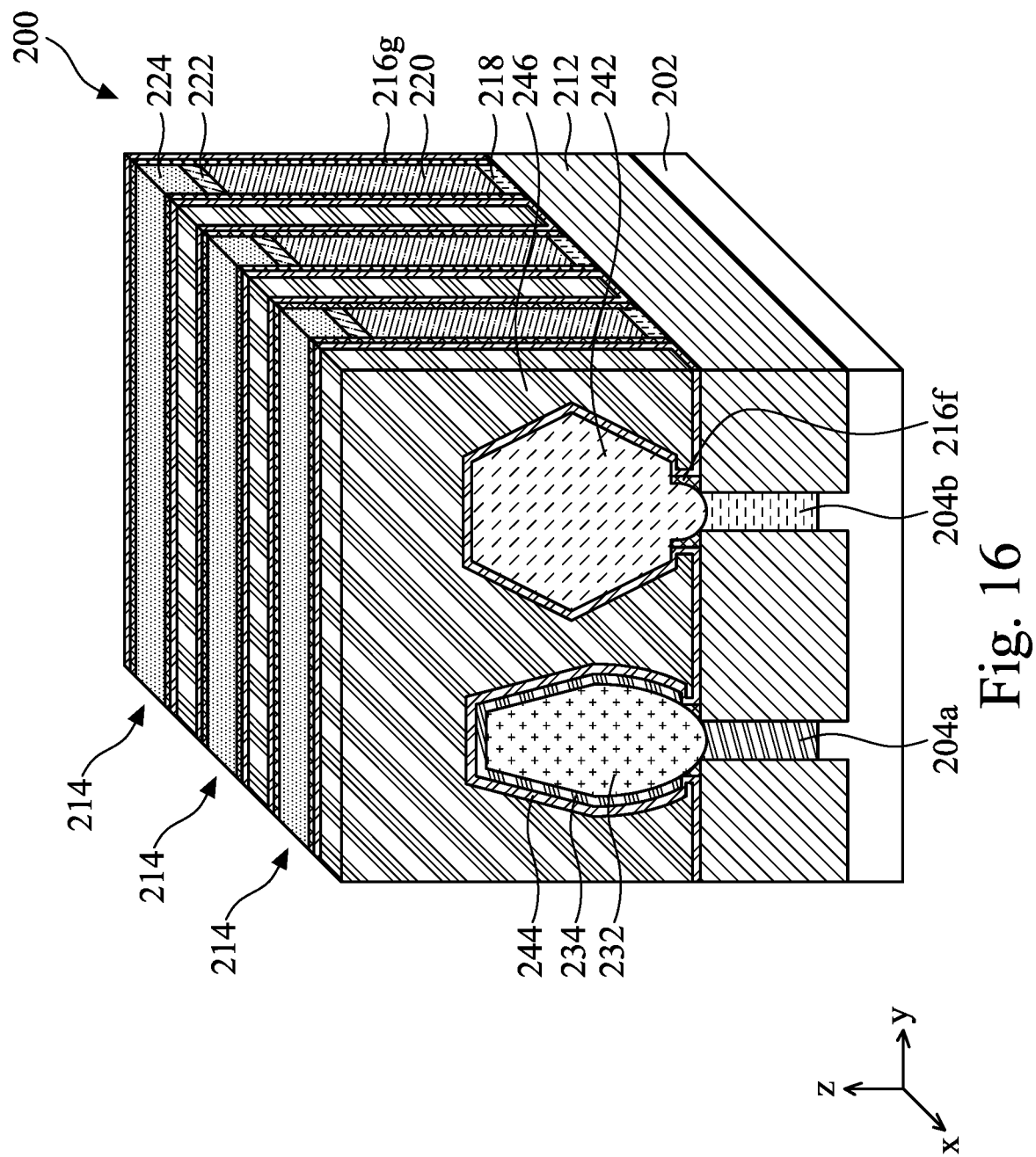

At operation 130, an interlayer dielectric (ILD) layer is formed over the contact etch stop layer. FIG. 16 is a schematic perspective view of the semiconductor device 200. FIG. 16 schematically demonstrates one example of the semiconductor device 200 after operation 130. In FIG. 16, an ILD layer 246 is formed over the CESL 244. after operation 130. The materials for the ILD layer 246 include compounds comprising Si, O, C, and/or H, such as silicon oxide, SiCOH and SiOC. Organic materials, such as polymers, may be used for the ILD layer 246. In some embodiments, the ILD layer 246 may be formed by flowable CVD (FCV). As shown in FIG. 15, the ILD layer 246 protects the epitaxial source/drain features 232, 242 during the removal of the sacrificial gate structures 214.

Figure 17A:
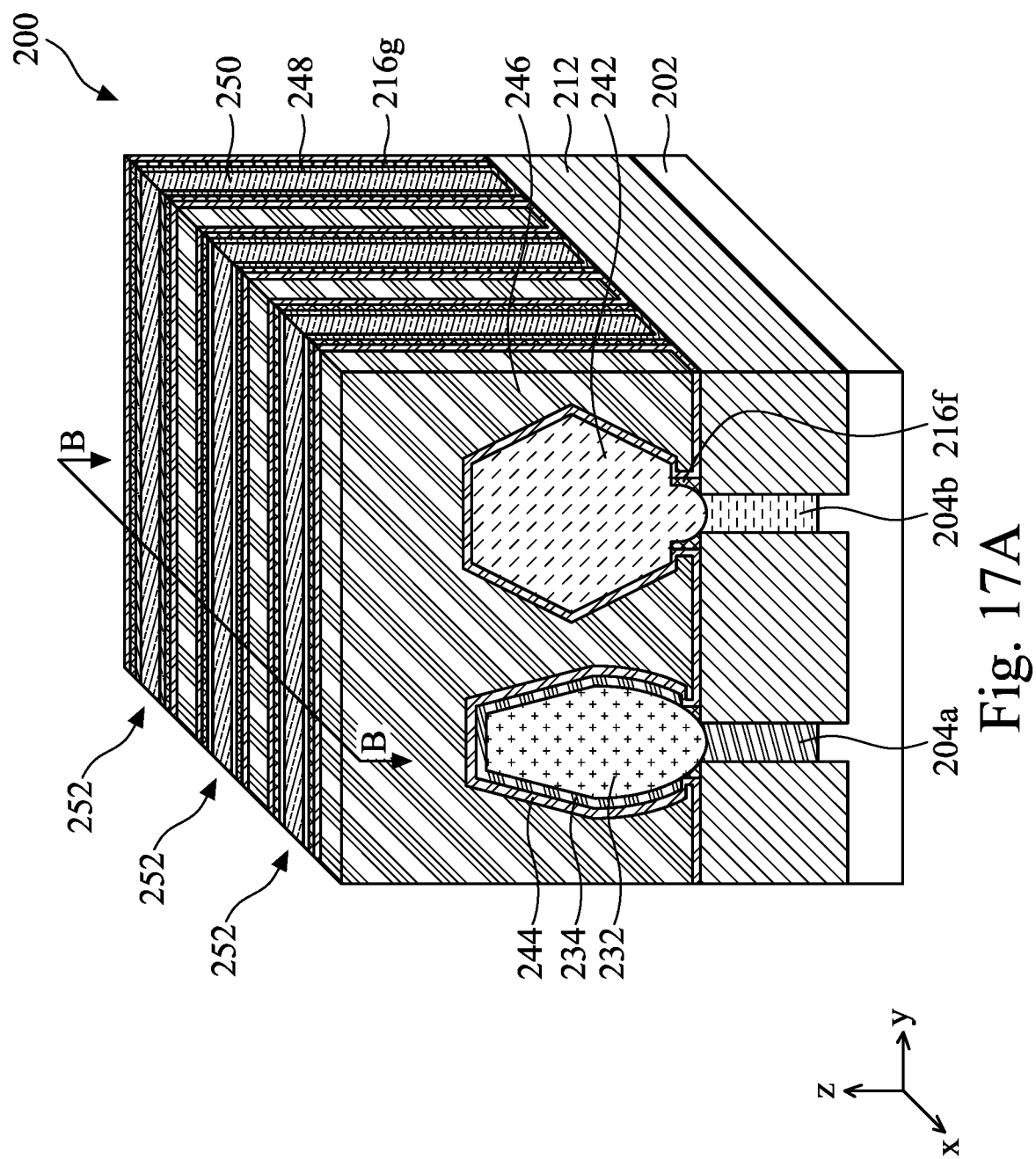
Figure 17B:
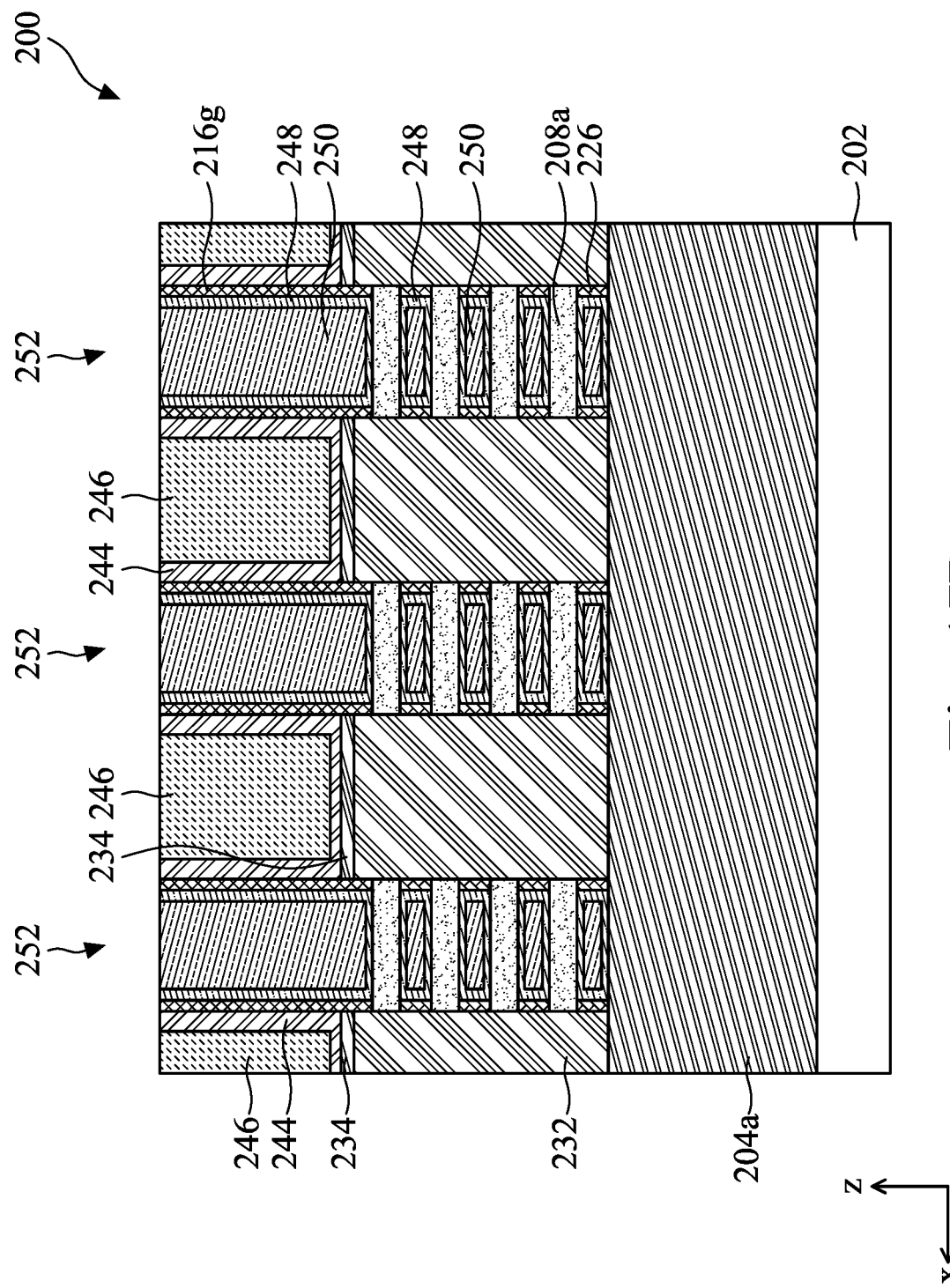

At operation 132, the sacrificial gate structures are removed and replacement gate structures are formed. FIG. 17A is a schematic perspective view of the semiconductor device 200. FIG. 17B is a schematic sectional view of the semiconductor device 200 along line B-B in FIG. 17A. FIGS. 17A-17B schematically demonstrates one example of the semiconductor device 200 after operation 132.

The sacrificial gate dielectric layer 218 and the sacrificial gate electrode layer 220 are removed using dry etching, wet etching, or a combination. The semiconductor layers 206a, 206b are exposed and subsequently removed resulting in gate cavities surrounding nanosheets of the semiconductor layers 208a, 208b. Replacement gate structures 252 are then filled in the gate cavities. The replacement gate structures 252 including a gate dielectric layer 248 and a gate electrode layer 250.

The gate dielectric layer 248 is formed on exposed surfaces in the gate cavities. The gate dielectric layer 248 may have different composition and dimensions for N-type devices and P-type devices and are formed separately using patterned mask layers and different deposition recipes. The gate dielectric layer 248 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 248 may be formed by CVD, ALD or any suitable method.

The gate electrode layer 250 is formed on the gate dielectric layer 248 to fill the gate cavities. The gate electrode layer 250 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 250 may be formed by CVD, ALD, electro-plating, or other suitable method. After the formation of the gate electrode layer 250, a planarization process, such as a CMP process, is performed to remove excess deposition of the gate electrode material and expose the top surface of the ILD layer 246.

Figure 18A:
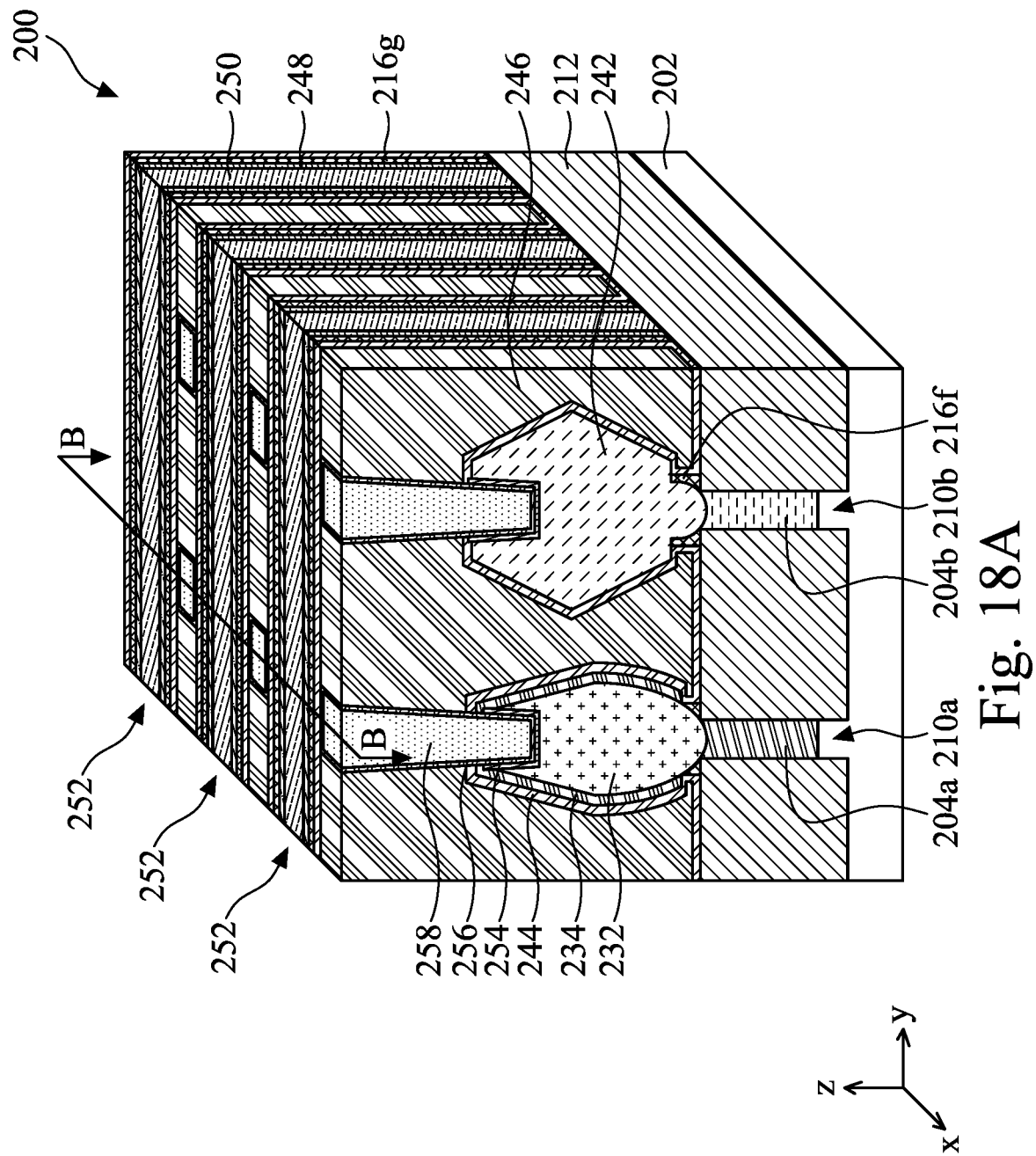
Figure 18B:
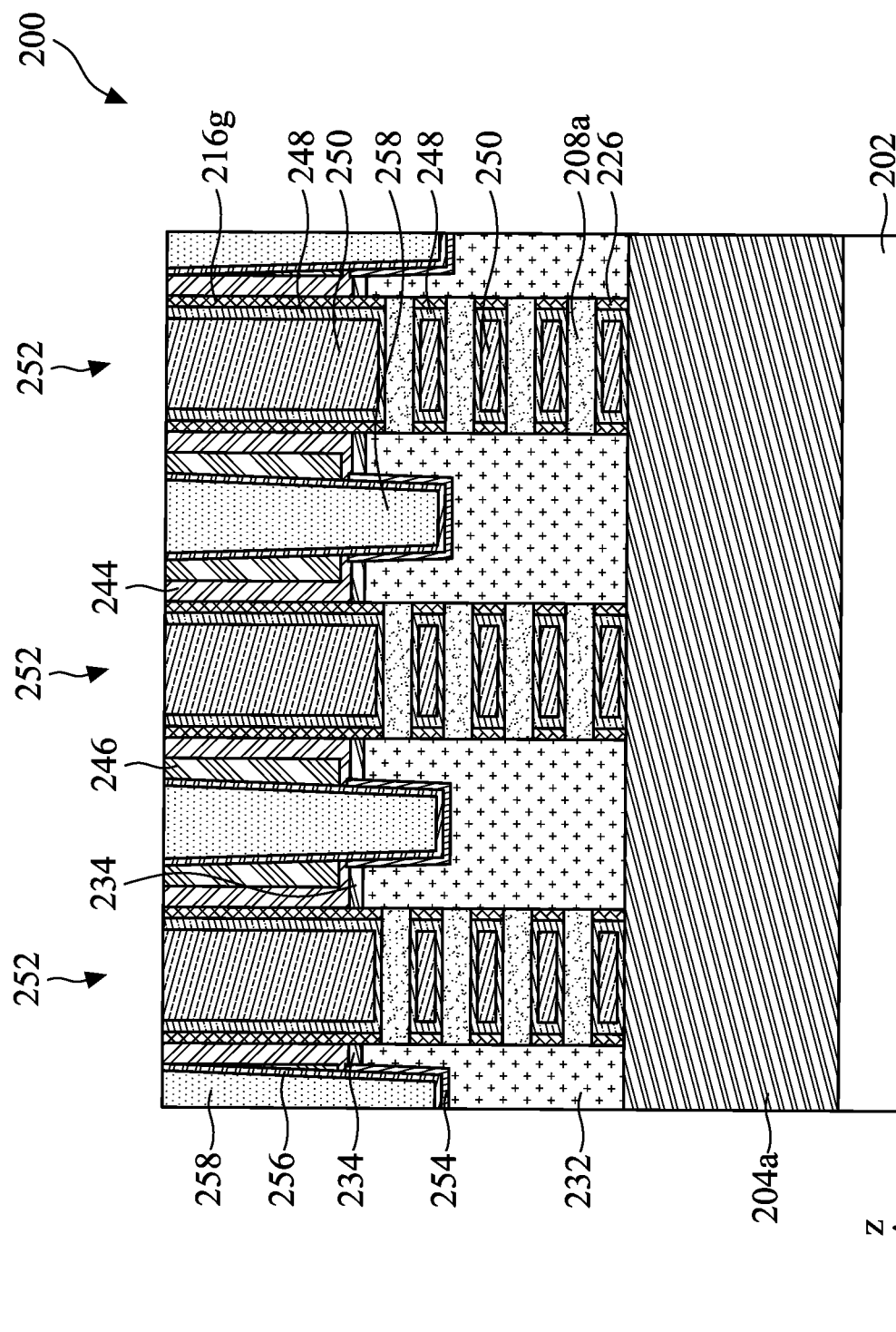

At operation 134, source/drain contact features are formed. FIG. 18A is a schematic perspective view of the semiconductor device 200. FIG. 18B is a schematic sectional view of the semiconductor device 200 along line B-B in FIG. 18A. FIGS. 18A-18B schematically demonstrates one example of the semiconductor device 200 after operation 134.

Contact holes may be formed through the ILD layer 246, the CESL 244, and the epitaxial liner 234 if present, to expose the epitaxial source/drain features 232, 242, and subsequently filled with a conductive material. Suitable photolithographic and etching techniques are used to form the contact holes through various layers. After the formation of the contact holes, a silicide layer 254 is selectively formed over surfaces of the epitaxial source/drain features 232, 242 exposed by the contact holes. The silicide layer 254 may be formed by depositing a metal source layer to cover exposed surfaces including the exposed surfaces of the epitaxial source/drain features 232, 242 and the epitaxial liner 234 (if present) and performing a rapid thermal annealing process. In some embodiments, the metal source layer includes a metal layer selected from W, Co, Ni, Ti, Mo, and Ta, or a metal nitride layer selected from tungsten nitride, cobalt nitride, nickel nitride, titanium nitride, molybdenum nitride, and tantalum nitride. After the formation of the metal source layer, a rapid thermal anneal process is performed. During the rapid anneal process, the portion of the metal source layer over the epitaxial source/drain features 232, 242 and the epitaxial liner 234 (if present), reacts with silicon in the epitaxial source/drain features 232, 242 and the epitaxial liner 234 (if present) to form the silicide layer 254. Unreacted portion of the metal source layer is then removed. In some embodiments, the silicide layer 88 includes one or more of WSi, CoSi, NiSi, TiSi, MoSi, and TaSi.

After formation of the silicide layer 254, a conductive material is deposited to fill contact holes and form the source/drain contact features 258. Optionally, a barrier layer 256 may be formed in the contact holes prior to forming the source/drain contact features 258. In some embodiments, the conductive material layer for the gate contact may be formed by CVD, PVD, plating, ALD, or other suitable technique. In some embodiments, the conductive material for the source/drain contact features 258 includes TiN, TaN, Ta, Ti, Hf, Zr, Ni, W, Co, Cu, Ag, Al, Zn, Ca, Au, Mg, Mo, Cr, or the like. Subsequently, a CMP process is performed to remove a portion of the conductive material layer above a top surface of the ILD layer 246.

In the method 100 discussed above, when sequentially forming N-type devices and P-type devices on a substrate, a self-aligned mask layer is used to cover first formed source/drain features while forming subsequent source/drain features, thus avoiding performing a patterning process over the first formed source/drain features. As a result, the first formed source/drain features will not be cut or otherwise damaged by a patterning process even if the first formed source/drain features extend beyond window of errors because of size and/shape variation. In conventional technology, if the first formed source/drain features are cut during mask patterning, the cut surface would not be covered by the mask, which may lead to short circuits between the first formed source/drain features and subsequently formed source/drain features if neighboring source/drain features overlap, or bridge, with each other.

Figure 19:
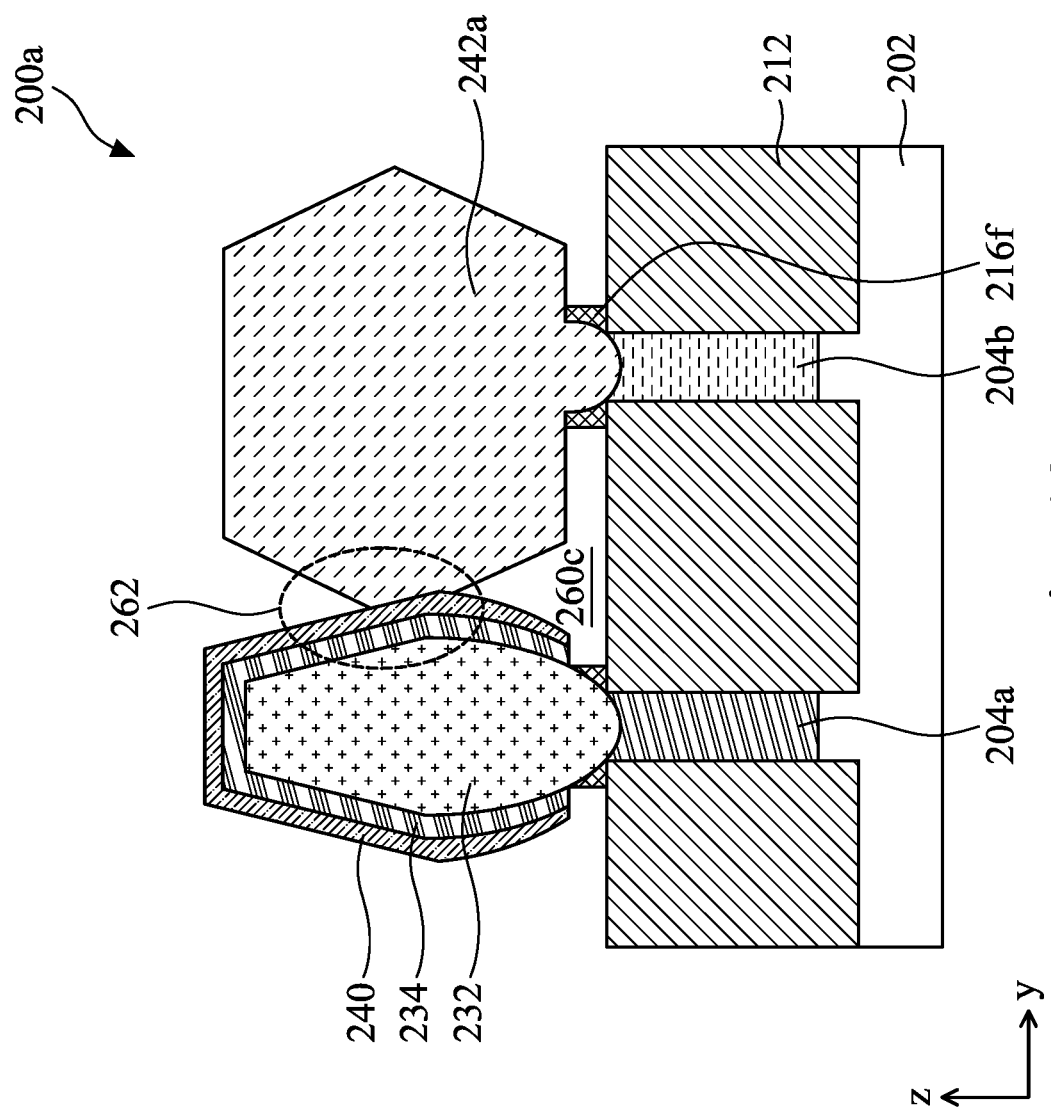
FIGS. 19-20 schematically illustrate a semiconductor device according to embodiments of the present disclosure at various stages.
Figure 20:
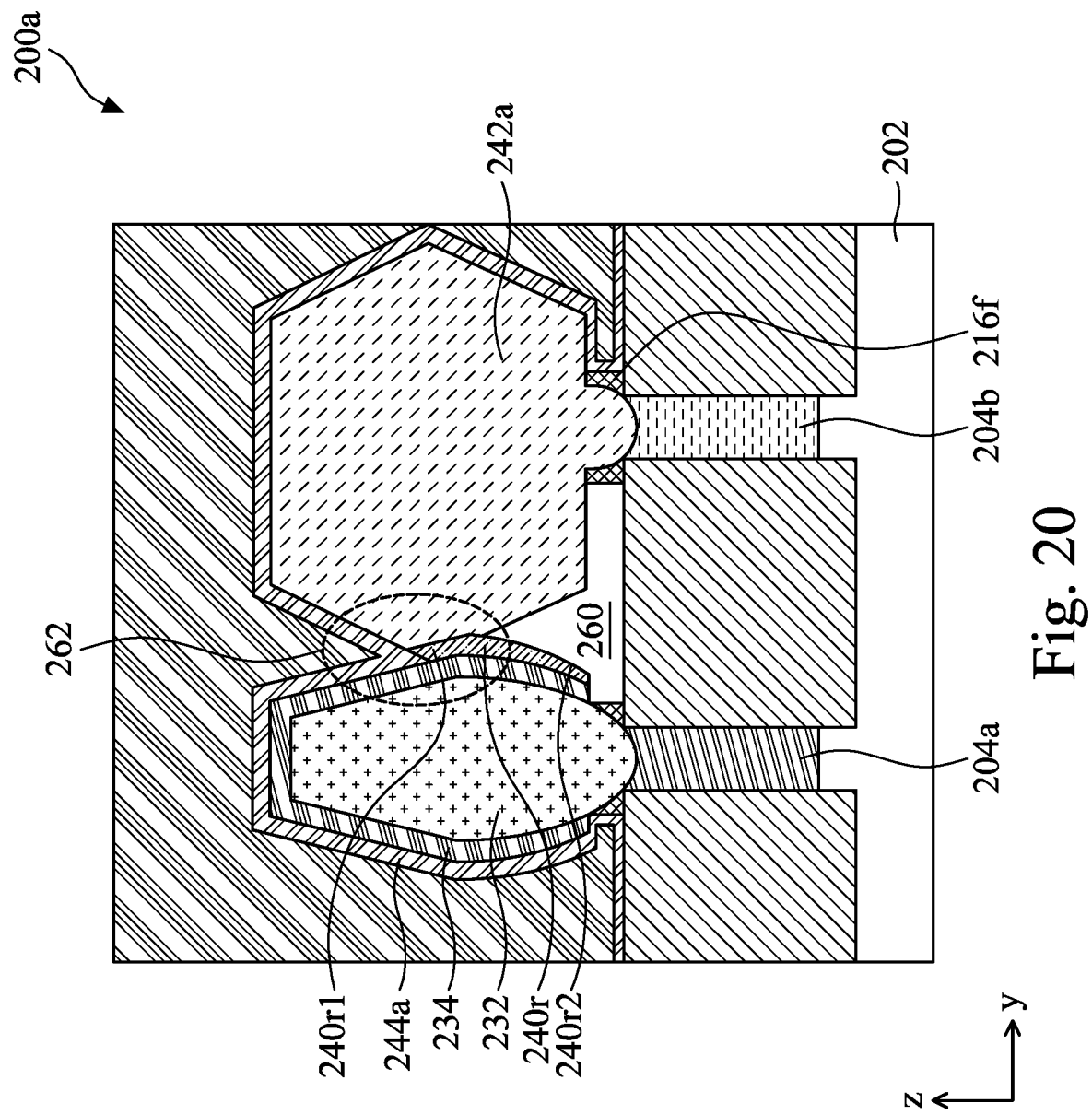

Embodiments of the present disclosure may be used to form overlapping or bridging source/drain features without causing short circuits. FIGS. 19-20 schematically illustrate a semiconductor device 200a according to embodiments of the present disclosure at various stages. The semiconductor device 200a may be manufactured using the method 100. FIG. 19 schematically demonstrates one example of the semiconductor device 200a after operation 124 of the method 100. FIG. 20 schematically demonstrates one example of the semiconductor device 200a after operation 128 of the method 100.

The semiconductor device 200a is similar to the semiconductor device 200 until reaching operation 124, where epitaxial source/drain features 242a for P-type devices overlap or bridge the epitaxial source/drain features 232 for N-type devices. As shown in FIG. 19, the self-aligned mask layer 240 acts as a protection layer for the epitaxial source/drain features 232 during operation 124. In a region 262 where the epitaxial source/drain features 242a overlap with the epitaxial source/drain features 232, the self-aligned mask layer 240 is disposed between the epitaxial source/drain features 242a overlap with the epitaxial source/drain features 232 preventing direct contact. The epitaxial liner 234 is also disposed between the epitaxial source/drain features 242a overlap with the epitaxial source/drain features 232 preventing diffusion of dopants. In some embodiments, an air gap 260c may form between the epitaxial source/drain feature 242a and the epitaxial source/drain feature 232.

At operation 126, the self-aligned mask layer 240 is removed partially removed from the semiconductor device 200a. As shown in FIG. 20, a self-aligned mask portion 240r remains on the epitaxial source/drain features 232. The self-aligned mask portion 240r may include the portions where the epitaxial source/drain feature 242a and the epitaxial source/drain feature 232 merge and where the self-aligned mask layer 240 is exposed to the air gap 260c.

At operation 128, a CESL 244a is formed over exposed surfaces of the semiconductor device 200a. As shown in FIG. 20, the CESL 244a is formed on exposed surfaces of the epitaxial source/drain features 242a, the epitaxial liner 234, the sidewall spacers 216, and the isolation layer 212. Surfaces of the epitaxial source/drain features 242a not covered by the CESL 244a are exposed to the self-aligned mask portion 240r or the air gap 260c, thus, presenting no venerability of forming short circuits with the neighboring epitaxial source/drain feature 232. In some embodiments, the epitaxial source/drain feature 242a and the epitaxial source/drain feature 232 merges at where the epitaxial source/drain features 232 is the widest along the Y-axis with a corner or is curved in the cross section. As a result, the self-aligned mask portion 240r remained in the semiconductor device 200a also includes a corner or is curved. For example, the self-aligned mask portion 240r may include a first section 240r1 facing the CESL 244a and a second section 240r2 facing the air gap 260c. The first section 240r1 and the second section 240r2 form an angle. In some embodiments, the self-aligned mask portion 240r may have a thickness in a range between in a range between 2 nm and 10 nm. Alternatively, a low pressure removal process may be performed to remove the self-aligned mask portion 240r forming an air gap between the epitaxial source/drain feature 242a and the epitaxial source/drain feature 232.

Figure 21A:
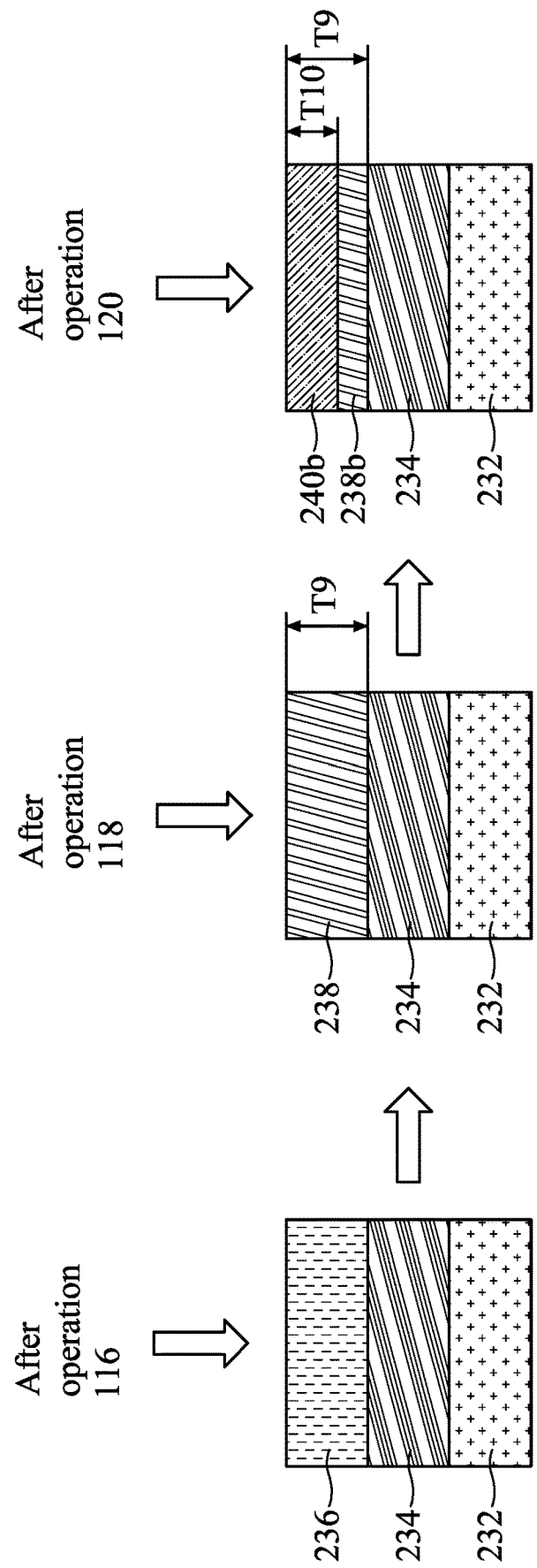
FIGS. 21A-21C schematically illustrate a semiconductor device according to embodiments of the present disclosure at various stages.
Figure 21B:
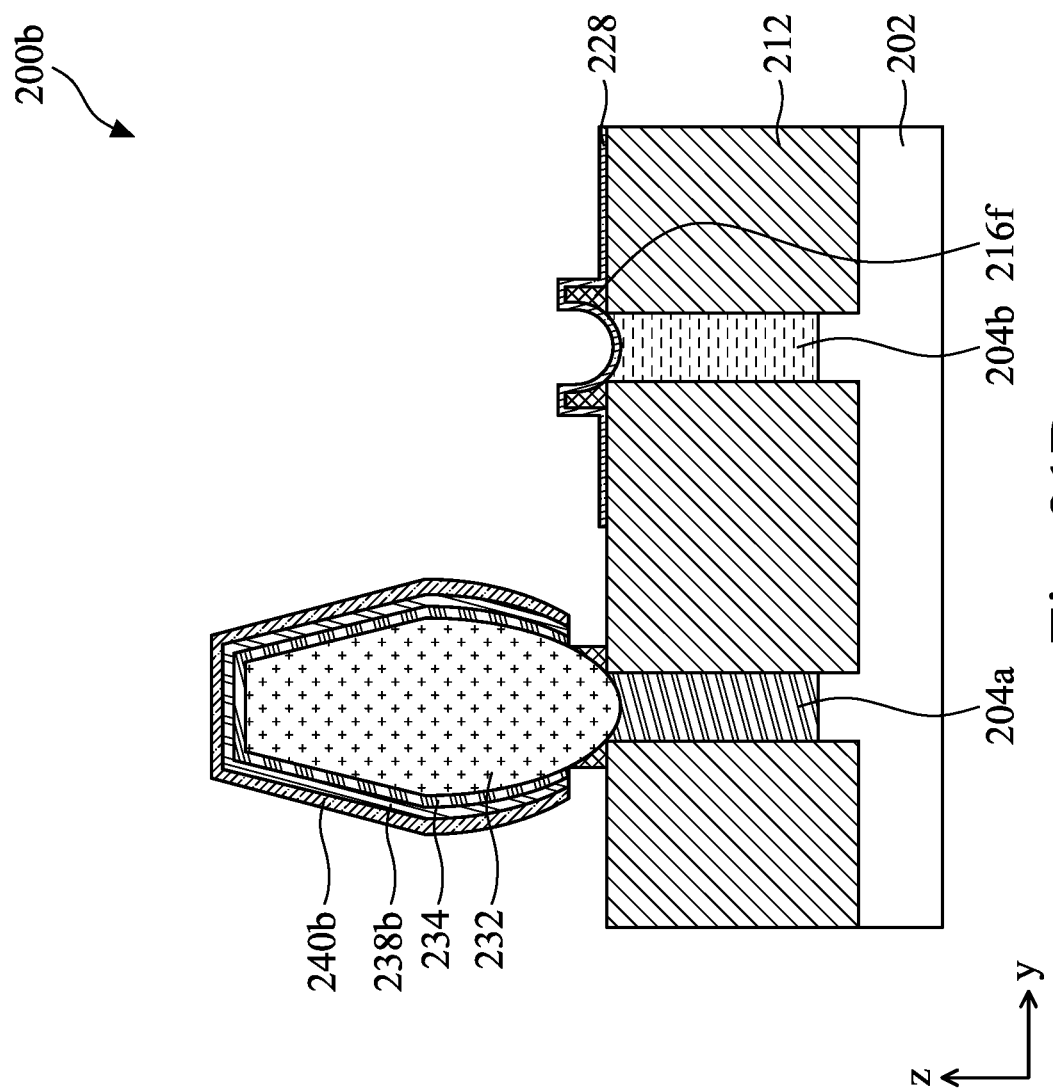
Figure 21C:
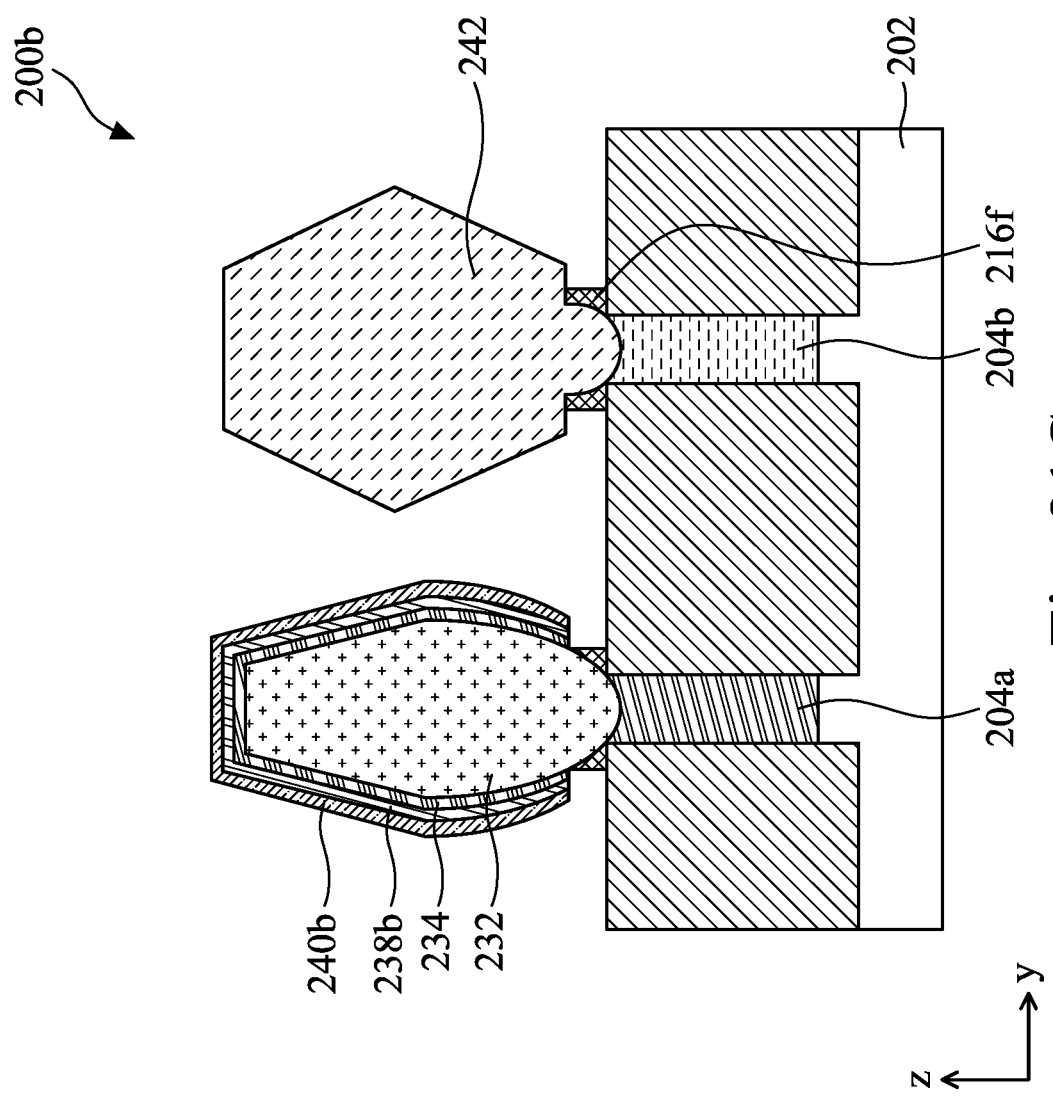

In the embodiments discussed above, semiconductor elements other than silicon are substantially removed from the oxide layer 238 at operation 120 of the method 100. Alternatively, the anneal process at operation 120 may be performed to remove the one or more semiconductor elements from a portion of the oxide layer 238. By removing a portion of the one or more semiconductor elements, annealing time and/or temperature at operation 120 may be reduced, thus, improving manufacturing efficiency and/or reducing potential harm from the high temperature. FIGS. 21A-C schematically illustrate a semiconductor device 200b manufactured by removing a portion of Ge from the oxide layer 238 at operation 120 in the method 100.

FIG. 21A schematically demonstrates sectional views of changes of the epitaxial cap layer 236 after operations 116, 118, and 120 in the semiconductor device 200b according to embodiments of the present disclosure. FIG. 21B schematically demonstrates one example of the semiconductor device 200b after operation 120 of the method 100. FIG. 21C schematically demonstrates one example of the semiconductor device 200b after operation 124 of the method 100.

The semiconductor device 200b is similar to the semiconductor device 200 until reaching operation 120, where the anneal process only removes Ge from a top portion of the oxide layer 238. As shown in FIG. 21A, by adjusting time and/or temperature of the anneal process at operation 120, Ge in the oxide layer 238 may be removed at various percentages forming a self-aligned mask layer 240b of various thicknesses and with an oxide layer 238b remaining as a mixture of SiGeOx. In some embodiments, the annealing process at operation 120 may stop when the self-aligned mask layer 240b reaches a thickness sufficient for protecting the epitaxial source/drain feature 232 and a thickness of mixed oxide layer 238b underneath the self-aligned mask layer 240b. The mixed oxide layer 238 may have a thickness T9 after operation 118. The self-aligned mask layer 240b may have a thickness T10 after operation 120. In some embodiments, a ratio of the thickness T10 over T9 may be a range between 0.5 and 0.95. When the ratio T10:T9 is lower than 0.5, the self-aligned mask layer 240b may not be thick enough to endure the subsequent processes to protect the epitaxial source/drain features 232. When the ratio T10:T9 is greater than 0.95, the time for performing operation 120 may be too long thus increasing the cost of without obvious additional benefit.

As shown in FIGS. 21A and 21B, the self-aligned mask layer 240b is formed over the oxide layer 238b and the epitaxial liner 234 after operation 120. The self-aligned mask layer 240b acts as a protection layer for the epitaxial source/drain features 232 during operation 124. The self-alignment mask layer 240b may incur some thickness loss during operation 124, as shown in FIG. 21C.

In some embodiments, remainder of the self-aligned mask layer 240b and the oxide layer 238b are removed from the semiconductor device 200b at operation 126. After operation 126, the semiconductor device 200b would be substantially the same as the semiconductor device 200 as shown in FIG. 14. The resulting semiconductor device 200b would be substantially similar to the semiconductor device 200.

Figure 21D:
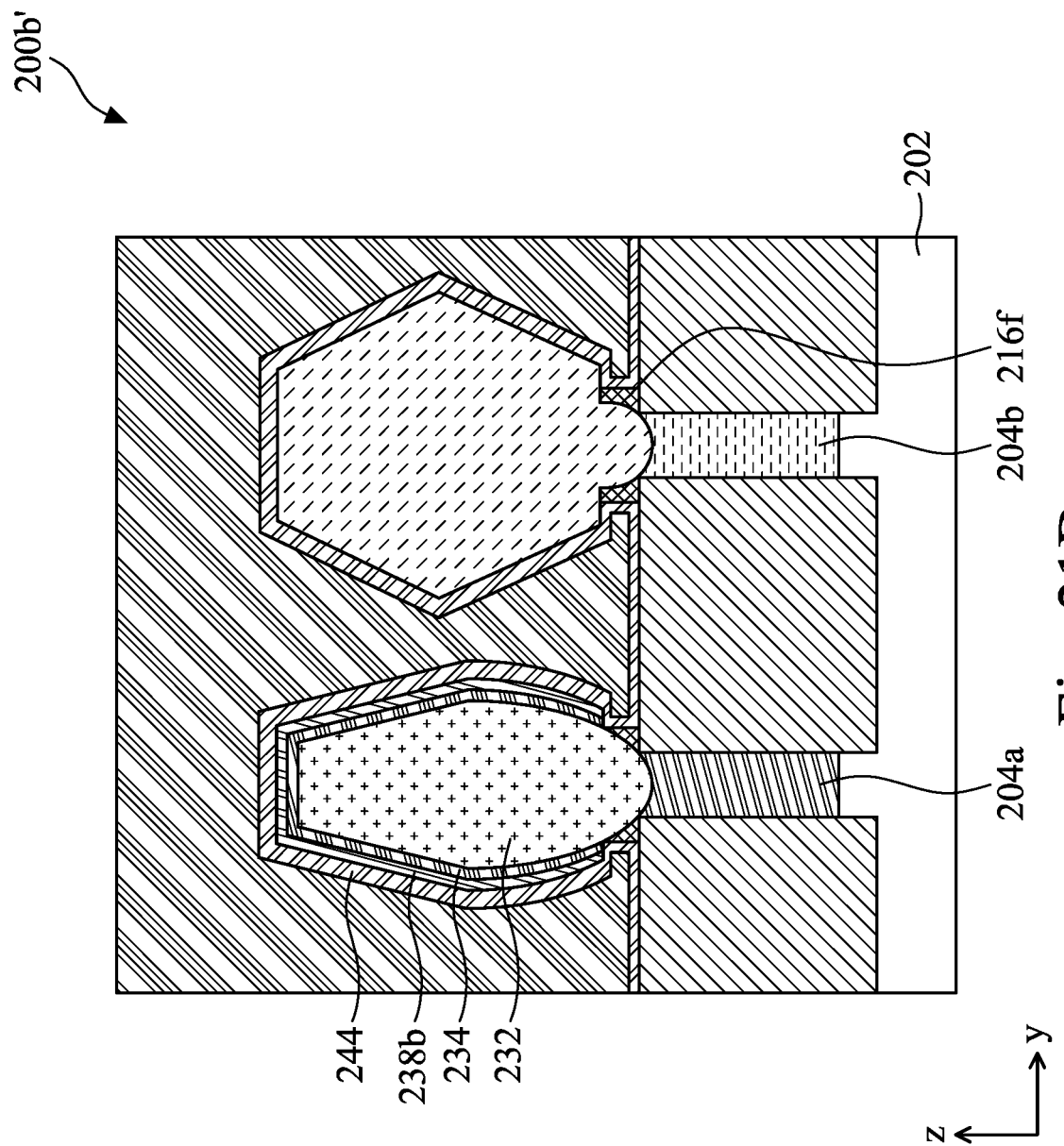
FIG. 21D schematically illustrates a semiconductor device according to embodiments of the present disclosure.

Alternatively, at least a portion of the oxide layer 238b may remain after operation 126, and remain in the resulting semiconductor devices. FIG. 21D schematically demonstrates one example of a semiconductor device 200b' with at least a portion of the oxide layer 238 remains between the epitaxial liner 234 and the CESL 244.

Figure 21E:
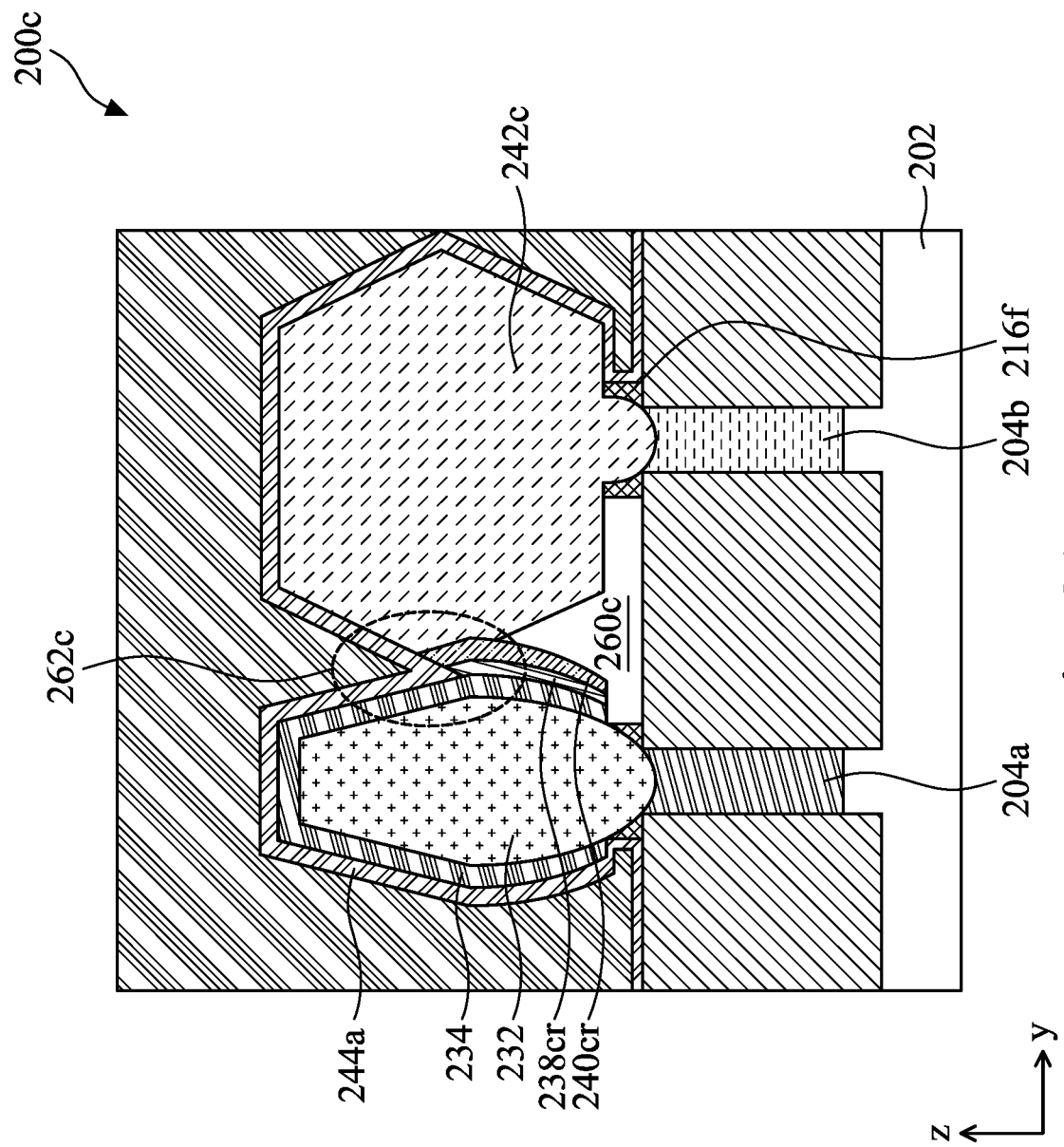
FIG. 21E schematically illustrates a semiconductor device according to embodiments of the present disclosure.

FIG. 21E schematically illustrates a semiconductor device 200c according to embodiments of the present disclosure. The semiconductor device 200c is similar to the semiconductor device 200 until reaching operation 124, where epitaxial source/drain features 242c for P-type devices overlap or bridge the epitaxial source/drain features 232 for N-type devices. At operation 124, the self-aligned mask layer 240b acts as a protection layer for the epitaxial source/drain features 232. In a region 262c where the epitaxial source/drain features 242c overlap with the epitaxial source/drain features 232, the self-aligned mask layer 240b and the oxide layer 238b disposed between the epitaxial source/drain features 242c overlap with the epitaxial source/drain features 232 preventing direct contact. In some embodiments, an air gap 260c may form between the epitaxial source/drain feature 242c and the epitaxial source/drain feature 232.

At operation 126, the self-aligned mask layer 240b and the oxide layer 238b are removed partially removed from the semiconductor device 200c. As shown in FIG. 21E, a self-aligned mask portion 240cr and an oxide layer portion 238cr remain on the epitaxial source/drain features 232. The self-aligned mask portion 240cr and oxide layer portion 238cr may include the portions where the epitaxial source/drain feature 242c and the epitaxial source/drain feature 232 overlap and where the self-aligned mask layer 240 is exposed to the air gap 260c. Similar to the self-aligned mask portion 240r, the self-aligned mask portion 240cr and oxide layer portion 238cr may also include a corner or curved portion.

Figure 22A:
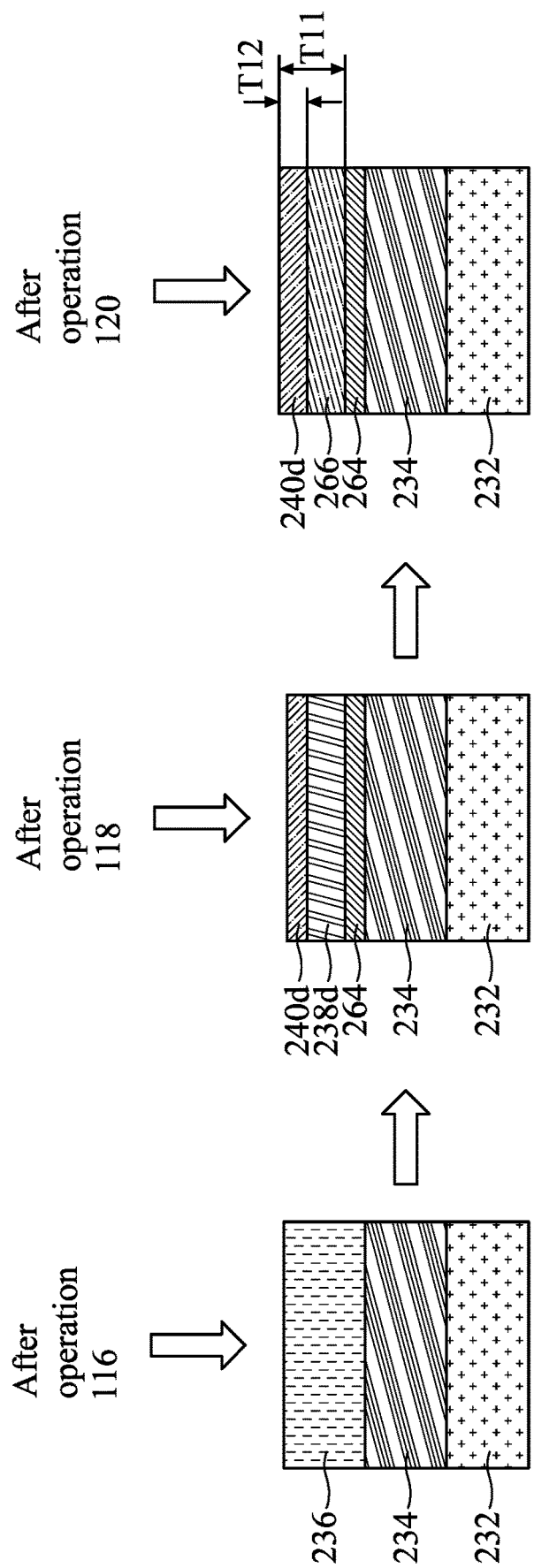
FIGS. 22A-22D schematically illustrate a semiconductor device according to embodiments of the present disclosure at various stages.
Figure 22B:
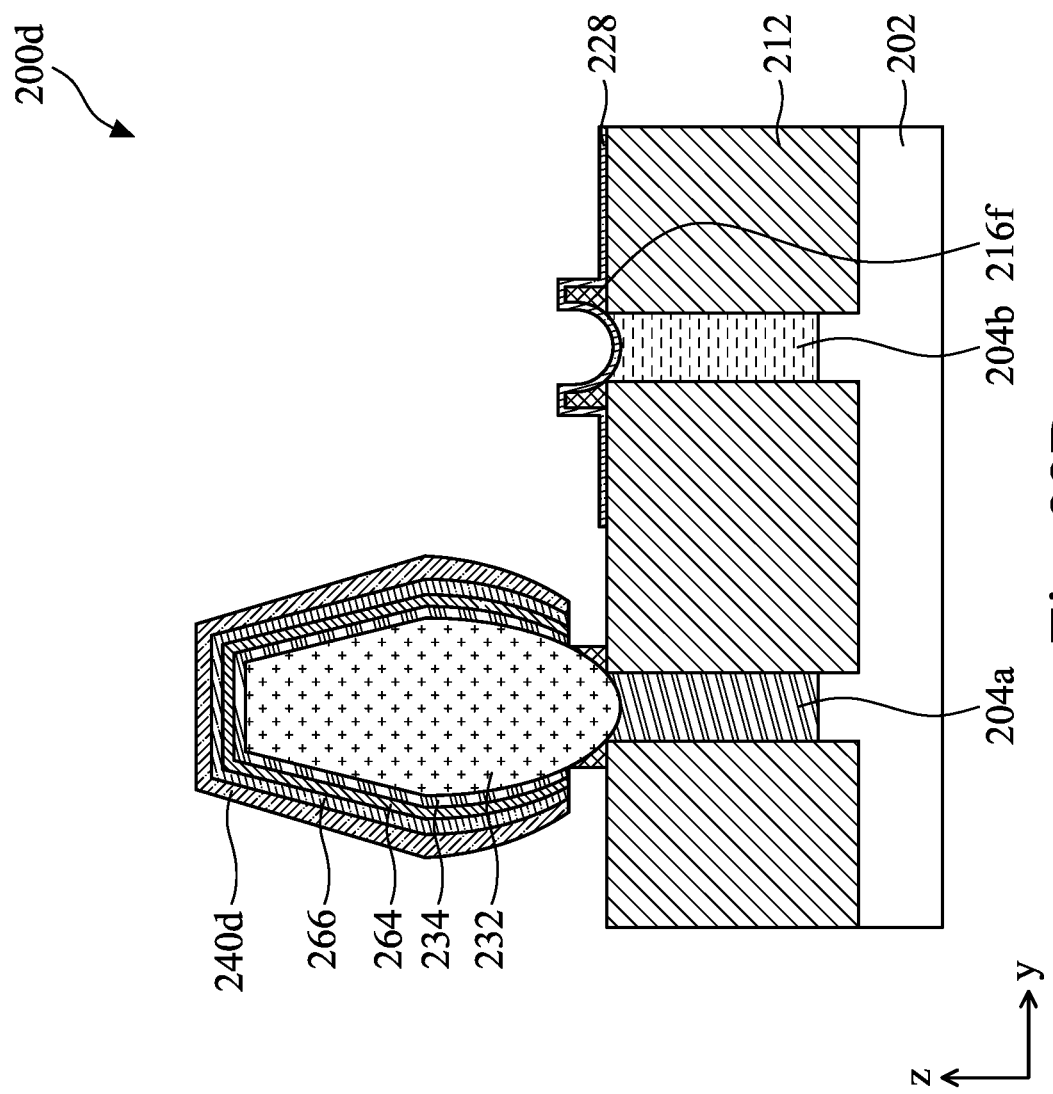
Figure 22C:
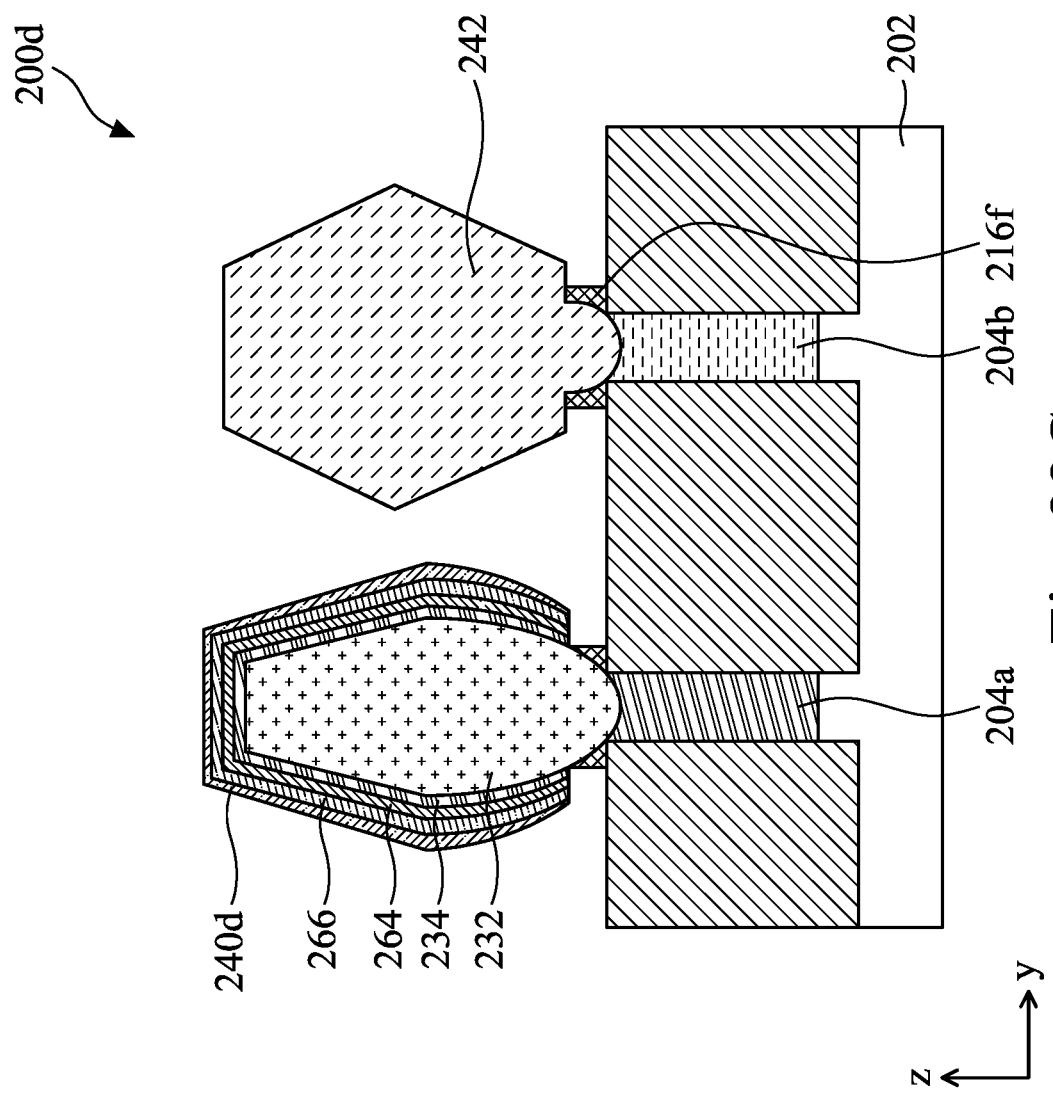
Figure 22D:
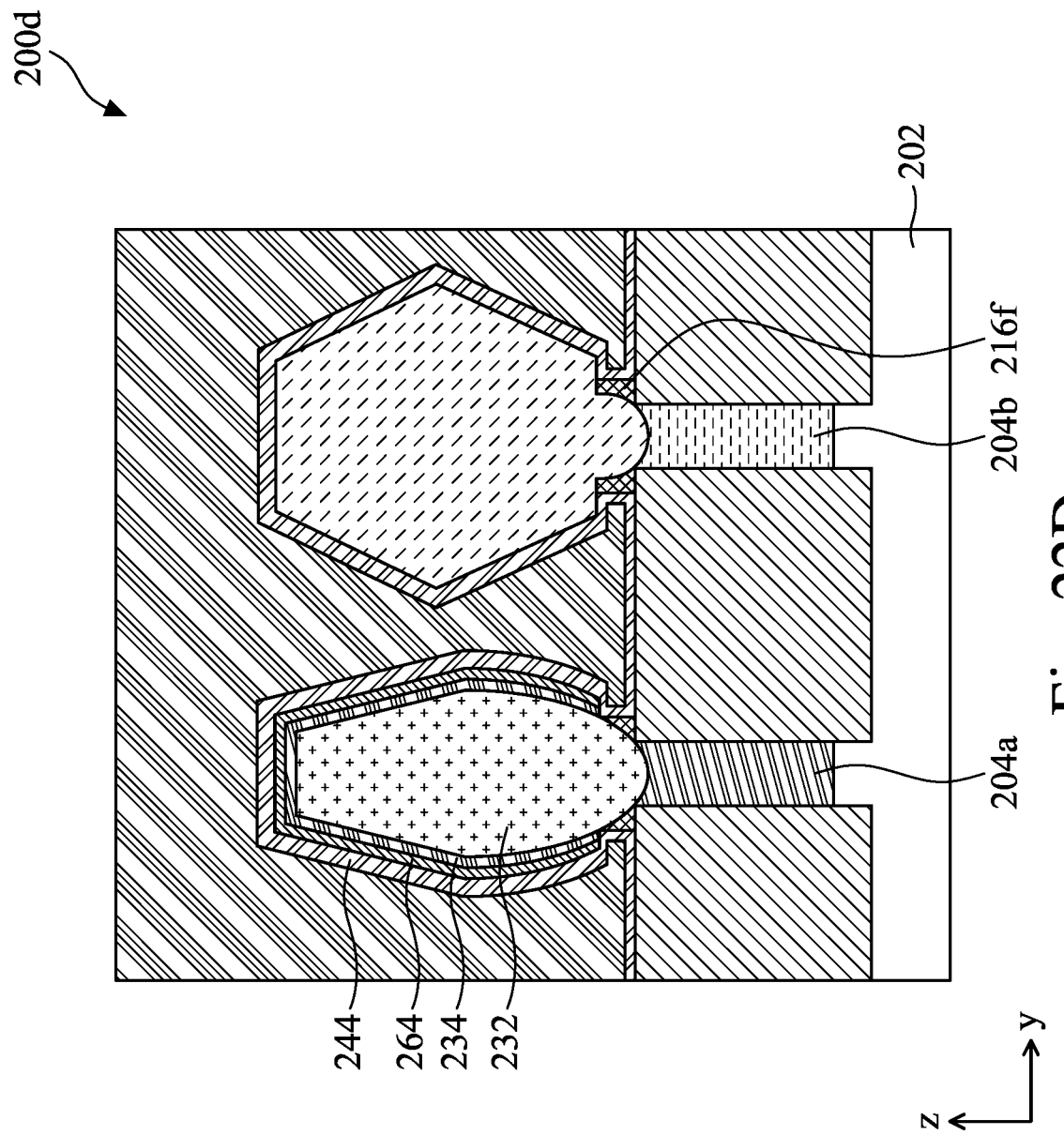

In the embodiments discussed above, the epitaxial cap layer 236 are oxidized at operation 118 forming a substantially uniform oxide layer 238. Alternatively, the epitaxial cap layer 236 may become multiple layers in response to various processing conditions. FIGS. 22A-D schematically illustrate a semiconductor device 200d manufactured when the epitaxial cap layer 236 becomes a tri-layer structure after operation 120 in the method 100. FIG. 22A schematically demonstrates sectional views of changes of the epitaxial cap layer 236 after operations 116, 118, and 120 in the semiconductor device 200d according to embodiments of the present disclosure. FIG. 22B schematically demonstrates one example of the semiconductor device 200d after operation 120 of the method 100. FIG. 22C schematically demonstrates one example of the semiconductor device 200d after operation 124 of the method 100. FIG. 22D schematically demonstrates one example of the semiconductor device 200d after operation 130 of the method 100.

The semiconductor device 200d is similar to the semiconductor device 200 until reaching operation 118, where after the oxidation process the epitaxial cap layer 236 become a semiconductor cap layer 264, an oxide layer 238d, and a self-aligned mask layer 240d. As shown in FIG. 22A, the epitaxial cap layer 236 which includes SiGe becomes substantially tri-layer structure after exposing to an oxidizing agent, to which Si has a higher oxidizing rate compared to Ge. The self-aligned mask layer 240*d*, formed on topmost, includes mainly SiOx. The oxide layer 238*d*, immediately under the self-aligned mask layer 240*d*, includes mainly SiGeOx. The semiconductor cap layer 264, underneath the oxide layer 238*d*, mainly incudes unoxidized Ge. In some embodiments, the tri-layer structure may be a result of partial oxidization of the epitaxial cap layer 236. After the anneal process at operation 120, a portion of Ge is removed from the tri-layer structure, increasing the thickness of the self-aligned mask layer 240*d*, forming an oxide layer 266 including SiGeOx and GeOx, and with the semiconductor cap layer 264 substantially unchanged. After operation 120, the combined thickness of the self-aligned mask layer 240*d*, the mixed oxide layer 238*d*, and the semiconductor cap layer 264 is denoted by T11. The self-aligned mask layer 240*d* may have a thickness T12. In some embodiments, a ratio of the thickness T12 over T11 may be a range between 0.50 and 0.80. When the ratio T12:T11 is lower than 0.5, the self-aligned mask layer 240*d* may not be thick enough to endure the subsequent processes to protect the epitaxial source/drain features 232. When the ratio T12:T11 is higher than 0.80, the time for performing operations 118 and 120 may be too long thus increasing the cost of without obvious additional benefit.

As shown in FIGS. 22A and 22B, the self-aligned mask layer 240*d* is formed over the oxide layer 266, the semiconductor cap layer 264, and the epitaxial liner 234 after operation 120. The self-aligned mask layer 240*d* acts as a protection layer for the epitaxial source/drain features 232 during operation 124. The self-alignment mask layer 240*d* may incur some thickness loss during operation 124, as shown in FIG. 22C.

At operation 126, remainder of the self-aligned mask layer 240*d* and the oxide layer 266 are removed from the semiconductor device 200*d* with the semiconductor cap layer 264 and the epitaxial liner 234 remaining on the epitaxial source/drain features 232, as shown in FIG. 22D. The CESL 244 is then formed over the semiconductor cap layer 264. Alternatively, at least a portion of the oxide layer 266 may remain after operation 126, and remain in the resulting semiconductor device (not shown).

Figure 22E:
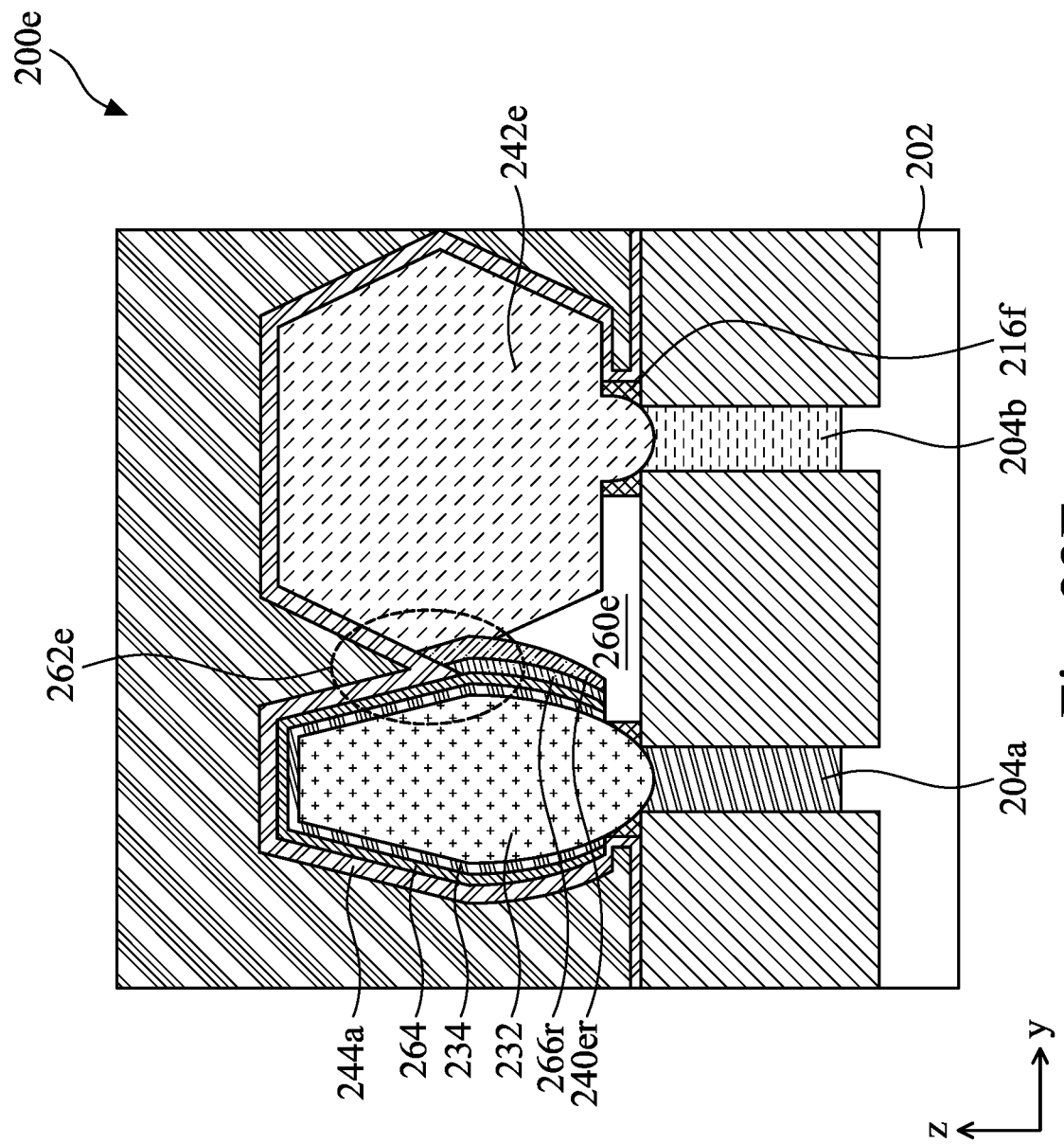
FIG. 22E schematically illustrates a semiconductor device according to embodiments of the present disclosure.

FIG. 22E schematically illustrates a semiconductor device 200*e* according to embodiments of the present disclosure. The semiconductor device 200*e* is similar to the semiconductor device 200*d* except that epitaxial source/drain features 242*e* for P-type devices overlap or bridge the epitaxial source/drain features 232 for N-type devices. In a region 262*e* where the epitaxial source/drain features 242*e* overlap with the epitaxial source/drain features 232, the self-aligned mask layer 240*d*, and the oxide layer 266 disposed between the epitaxial source/drain features 242*e* overlap with the epitaxial source/drain features 232 preventing direct contact. As shown in FIG. 22E, a self-aligned mask portion 240*er* and an oxide layer portion 266*r* remain on the epitaxial source/drain features 232. In some embodiments, an air gap 260*e* may form between the epitaxial source/drain feature 242*e* and the epitaxial source/drain feature 232. The self-aligned mask portion 240*er* and oxide layer portion 238*er* may include the portions where the epitaxial source/drain feature 242*e* and the epitaxial source/drain feature 232 merge and where the self-aligned mask layer 240 is exposed to the air gap 260*e*. Similar to the self-aligned mask portion 240*r*, the self-aligned mask portion 240*er* and oxide layer portion 266*r* may also include a corner or curved portion.

Figure 23A:
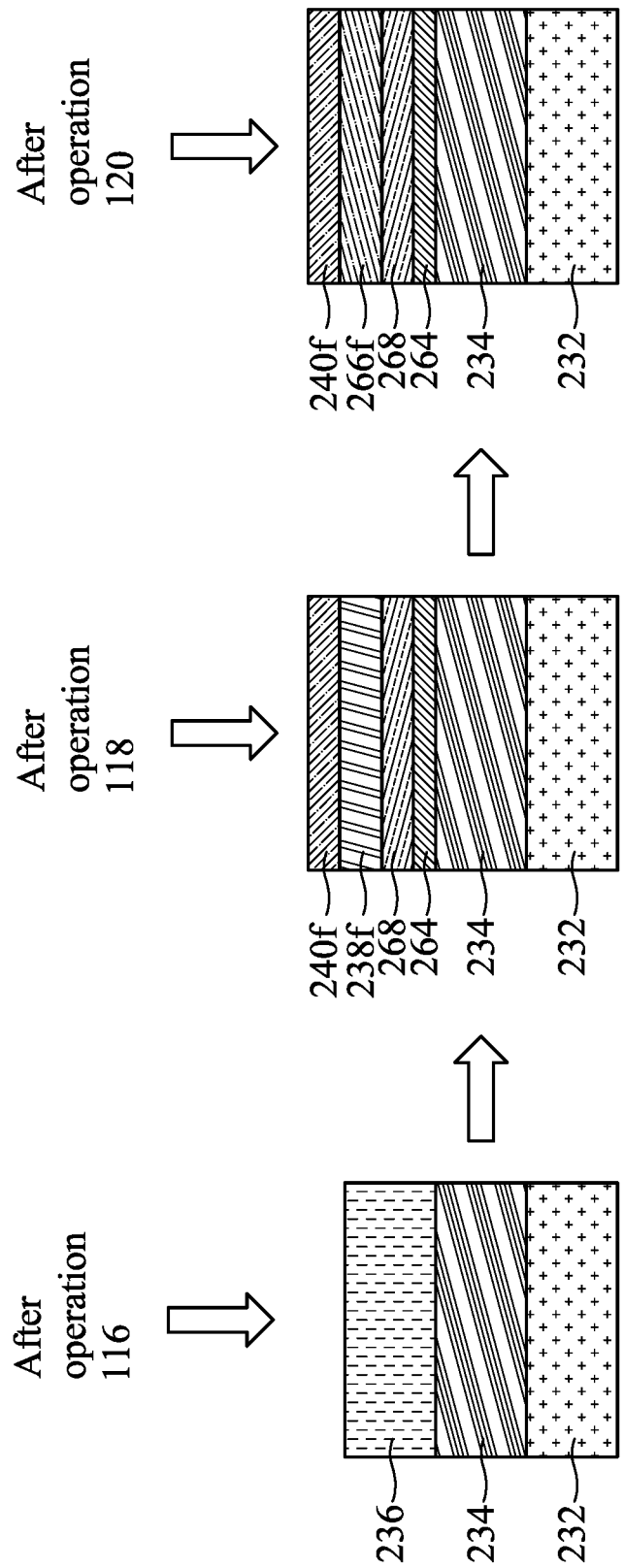
FIGS. 23A-23D schematically illustrate a semiconductor device according to embodiments of the present disclosure at various stages.
Figure 23B:
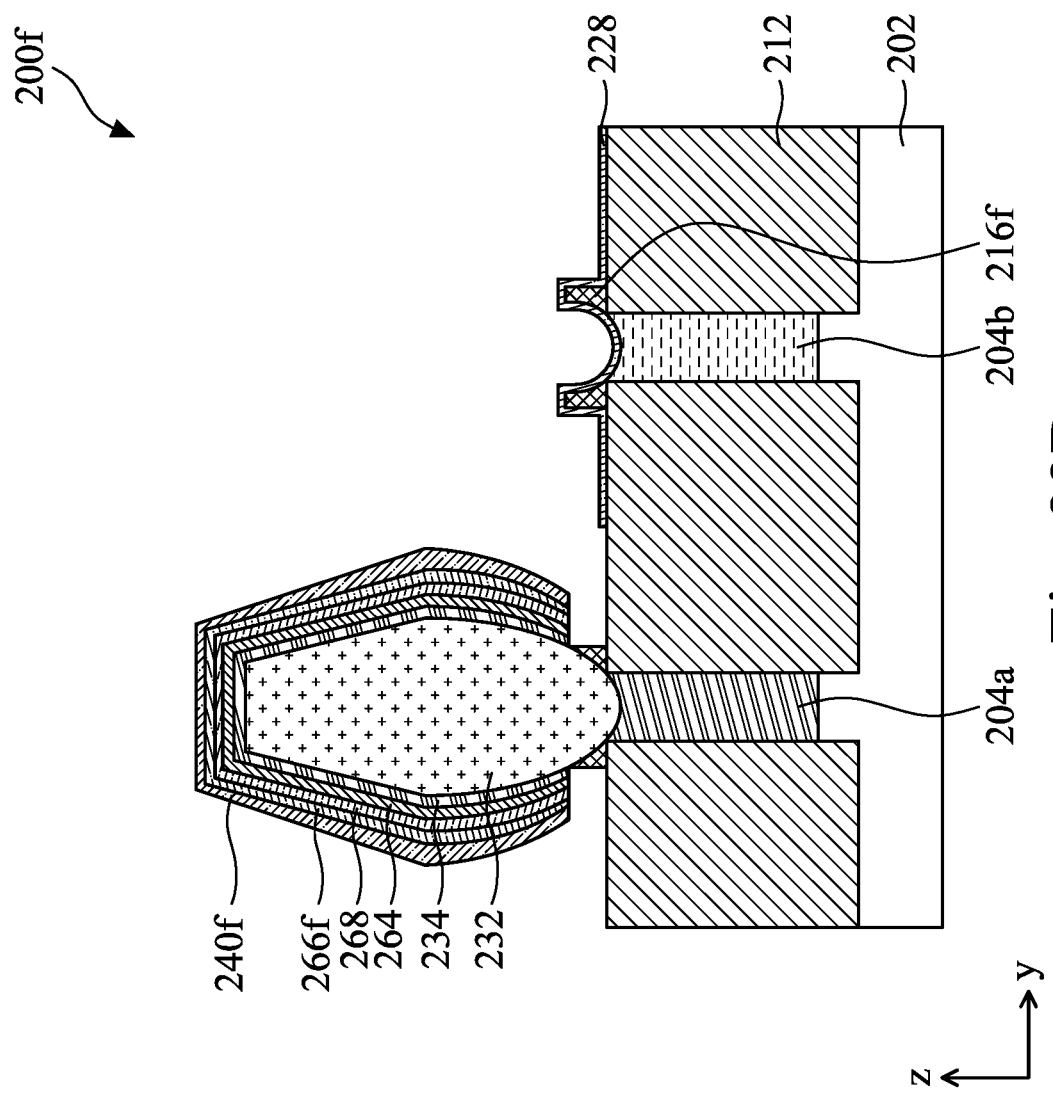
Figure 23C:
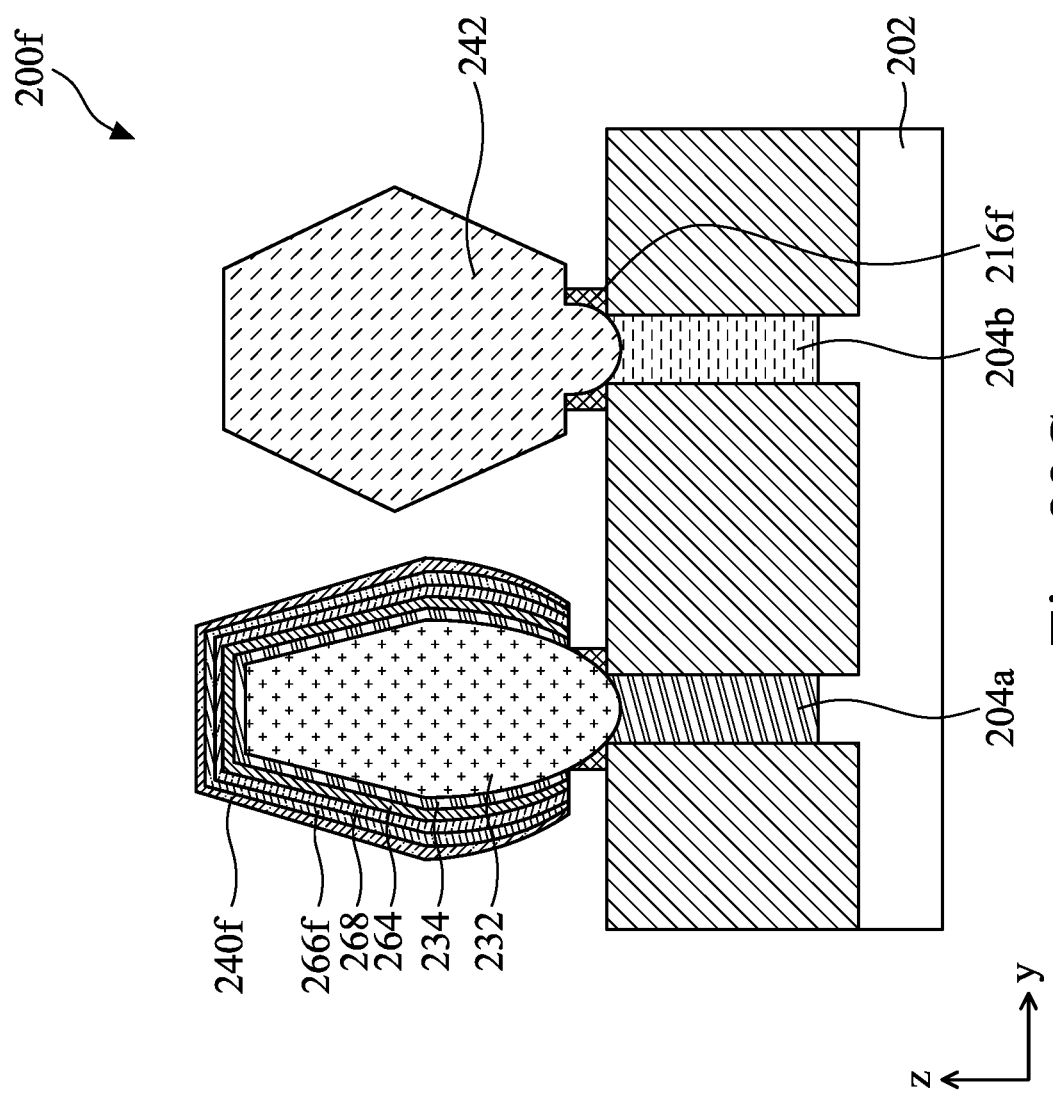
Figure 23D:
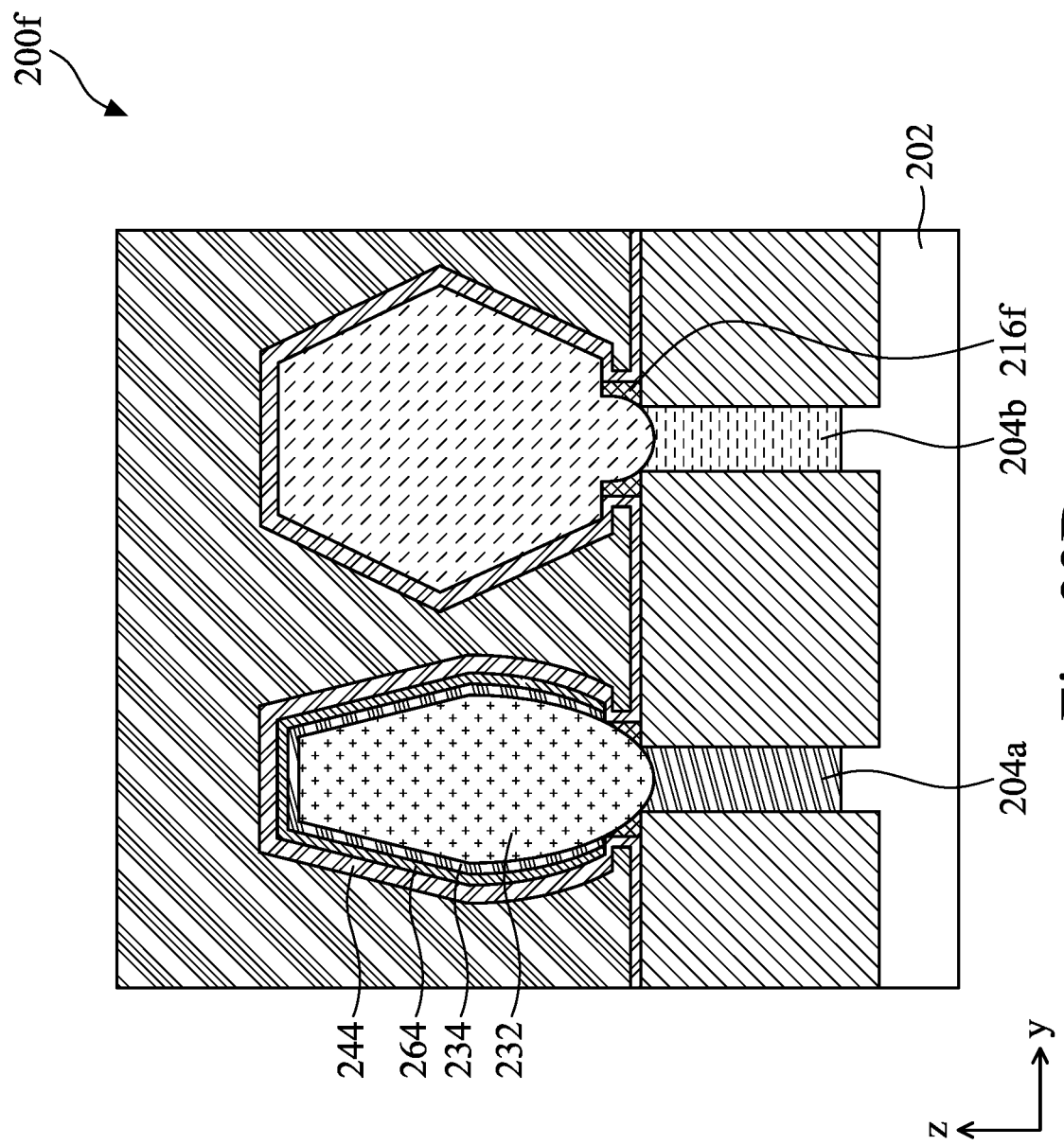

In other embodiments, the epitaxial cap layer 236 are oxidized at operation 118 forming a four-layer structure after operation 120 in the method 100. FIG. 23A schematically demonstrates sectional views of changes of the epitaxial cap layer 236 after operations 116, 118, and 120 in the semiconductor device 200*f* according to embodiments of the present disclosure. FIG. 23B schematically demonstrates one example of the semiconductor device 200*f* after operation 120 of the method 100. FIG. 23C schematically demonstrates one example of the semiconductor device 200*f* after operation 124 of the method 100. FIG. 23D schematically demonstrates one example of the semiconductor device 200*f* after operation 130 of the method 100.

The semiconductor device 200*f* is similar to the semiconductor device 200*d* except that after the oxidation process the epitaxial cap layer 236 become a semiconductor cap layer 264, a silicon oxide layer 268, a mixed oxide layer 238*f*, and a self-aligned mask layer 240*f*. As shown in FIG. 23A, the epitaxial cap layer 236 which includes SiGe becomes substantially a four-layer structure after exposing to an oxidizing agent. The self-aligned mask layer 240*f*, formed on topmost, includes mainly SiOx. The mixed oxide layer 238*f*, immediately under the self-aligned mask layer 240*d*, includes mainly SiGeOx and GeOx. The silicon oxide layer 268, underneath the mixed oxide layer 238*f*, mainly incudes SiOx. The semiconductor cap layer 264, underneath the mixed oxide layer 238*f*, mainly incudes unoxidized Ge. After the anneal process at operation 120, a portion of Ge is removed from the tri-layer structure, increasing the thickness of the self-aligned mask layer 240*f*, forming a mixed oxide layer 266*f* including SiGeOx, GeOx, and Ge, and with the silicon oxide layer 268 and the semiconductor cap layer 264 substantially unchanged.

The self-aligned mask layer 240*f* acts as a protection layer for the epitaxial source/drain features 232 during operation 124. The self-alignment mask layer 240*f* may incur some thickness loss during operation 124, as shown in FIG. 23C. At operation 126, remainder of the self-aligned mask layer 240*d*, the mixed oxide layer 266*f* and the silicon oxide layer 268 are removed from the semiconductor device 200*f* with the semiconductor cap layer 264 and the epitaxial liner 234 remaining on the epitaxial source/drain features 232, as shown in FIG. 23D.

Figure 23E:
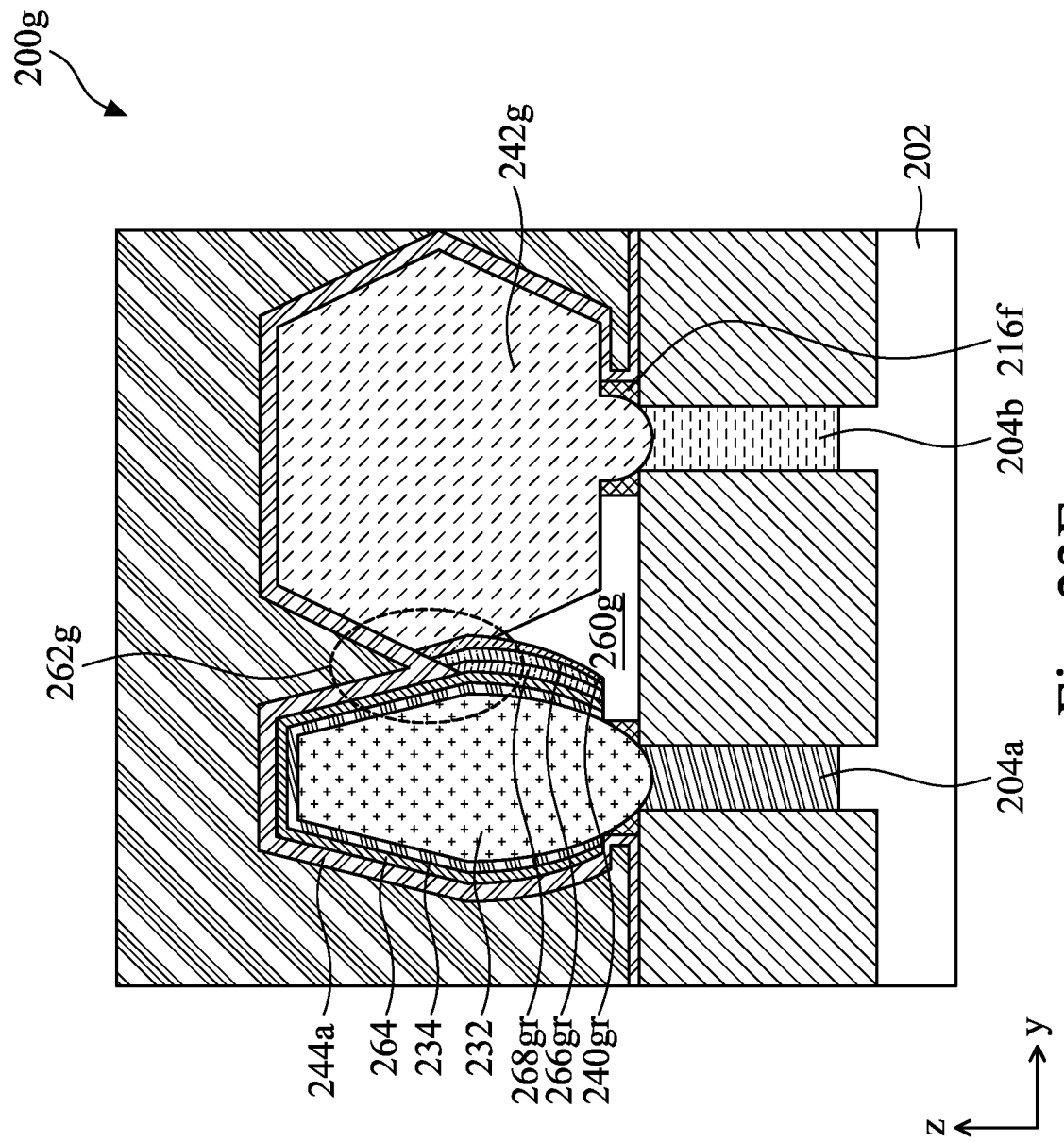
FIG. 23E schematically illustrates a semiconductor device according to embodiments of the present disclosure.

FIG. 23E schematically illustrates a semiconductor device 200*g* according to embodiments of the present disclosure. The semiconductor device 200*g* is similar to the semiconductor device 200*f* except that epitaxial source/drain features 242*g* for P-type devices overlap or bridge the epitaxial source/drain features 232 for N-type devices. In a region 262*g* where the epitaxial source/drain features 242*g* merge with the epitaxial source/drain features 232, a self-aligned mask layer portion 240*gr*, and a mixed oxide layer portion 266*gr*, a silicon oxide layer portion 268*gr* remain in the resulting semiconductor device 200*g*. Similar to the self-aligned mask portion 240*r*, the self-aligned mask portion 240*gr*, oxide layer portion 266*gr*, and silicon oxide layer portion 268*gr* may also include a corner or curved portion.

Figure 24B:
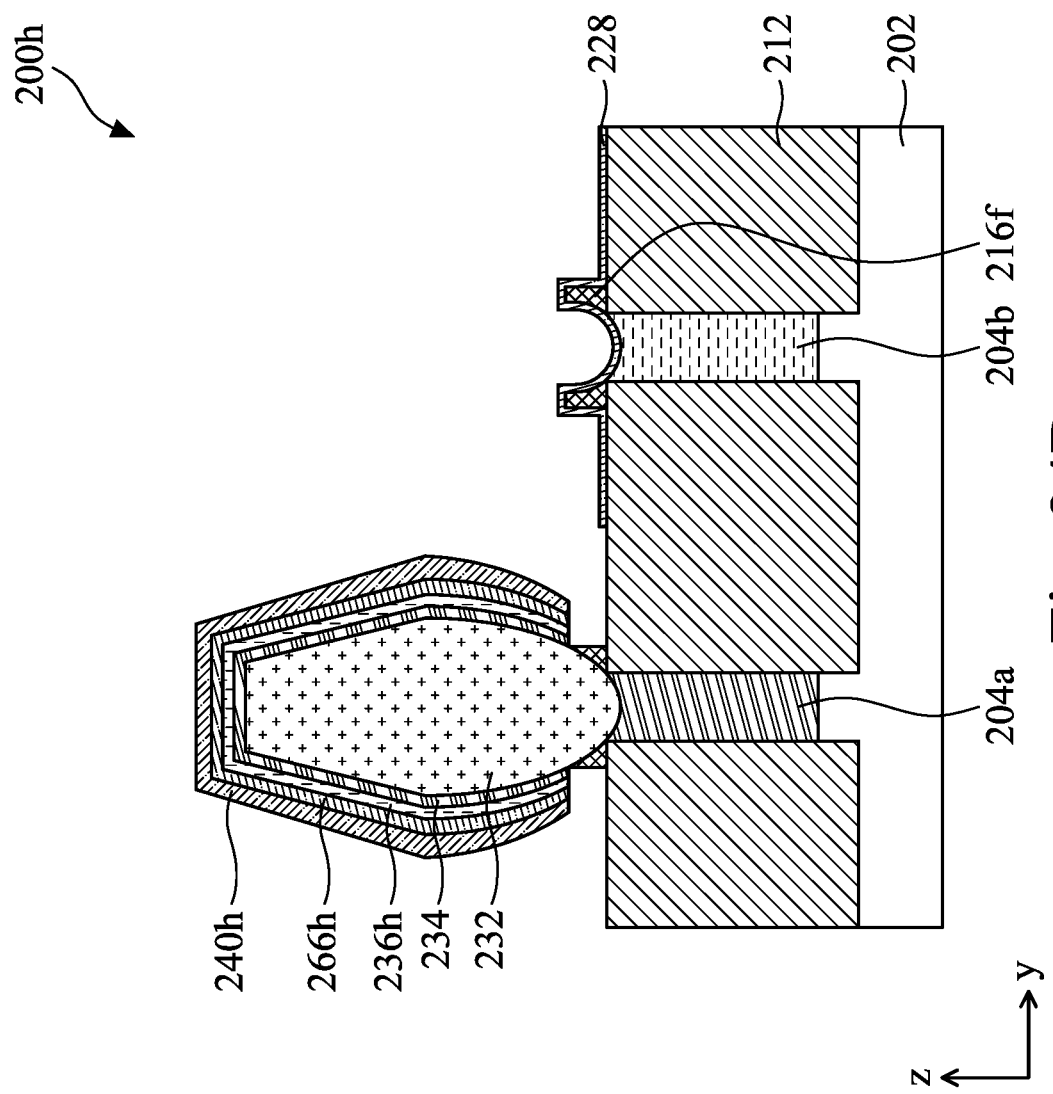
Figure 24C:
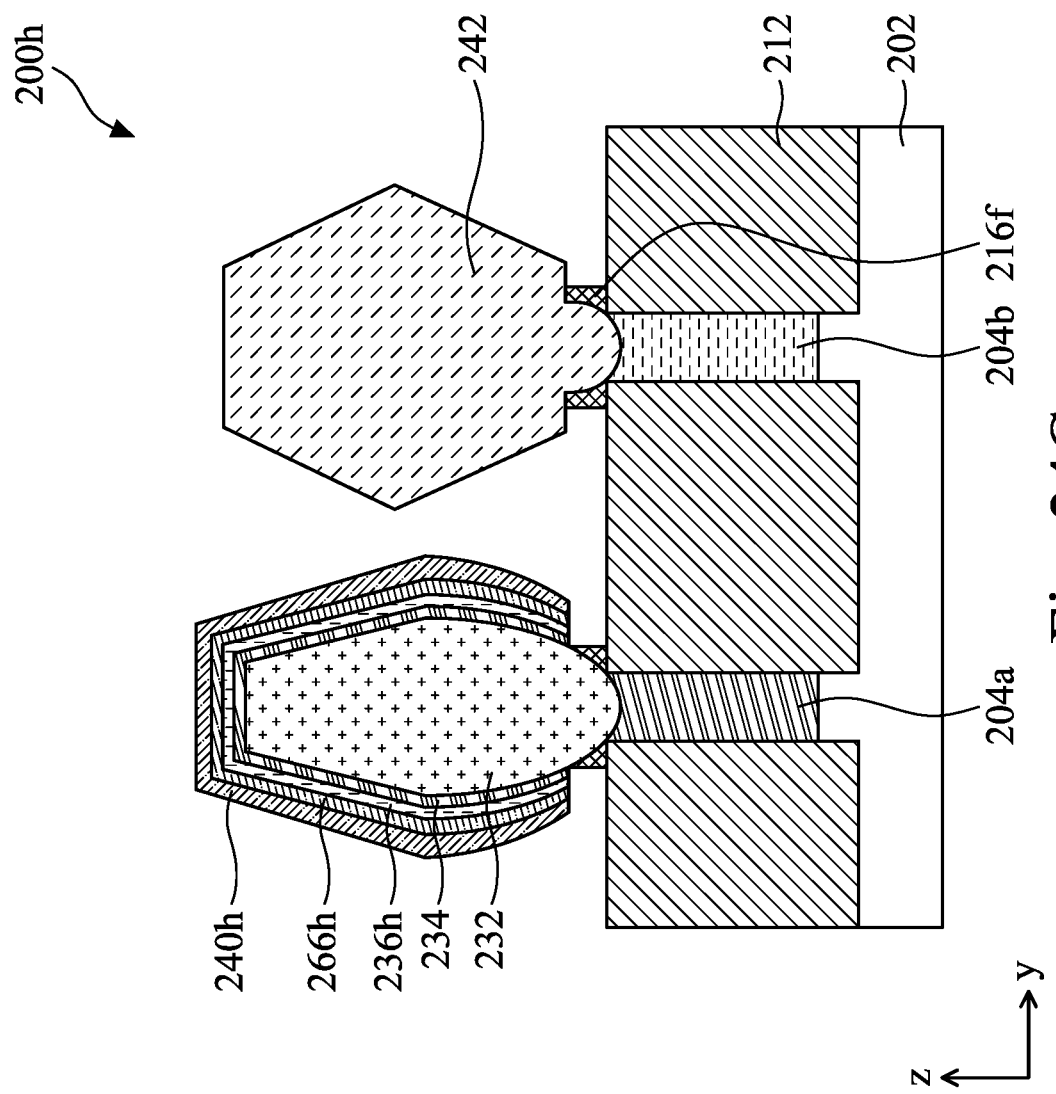
Figure 24D:
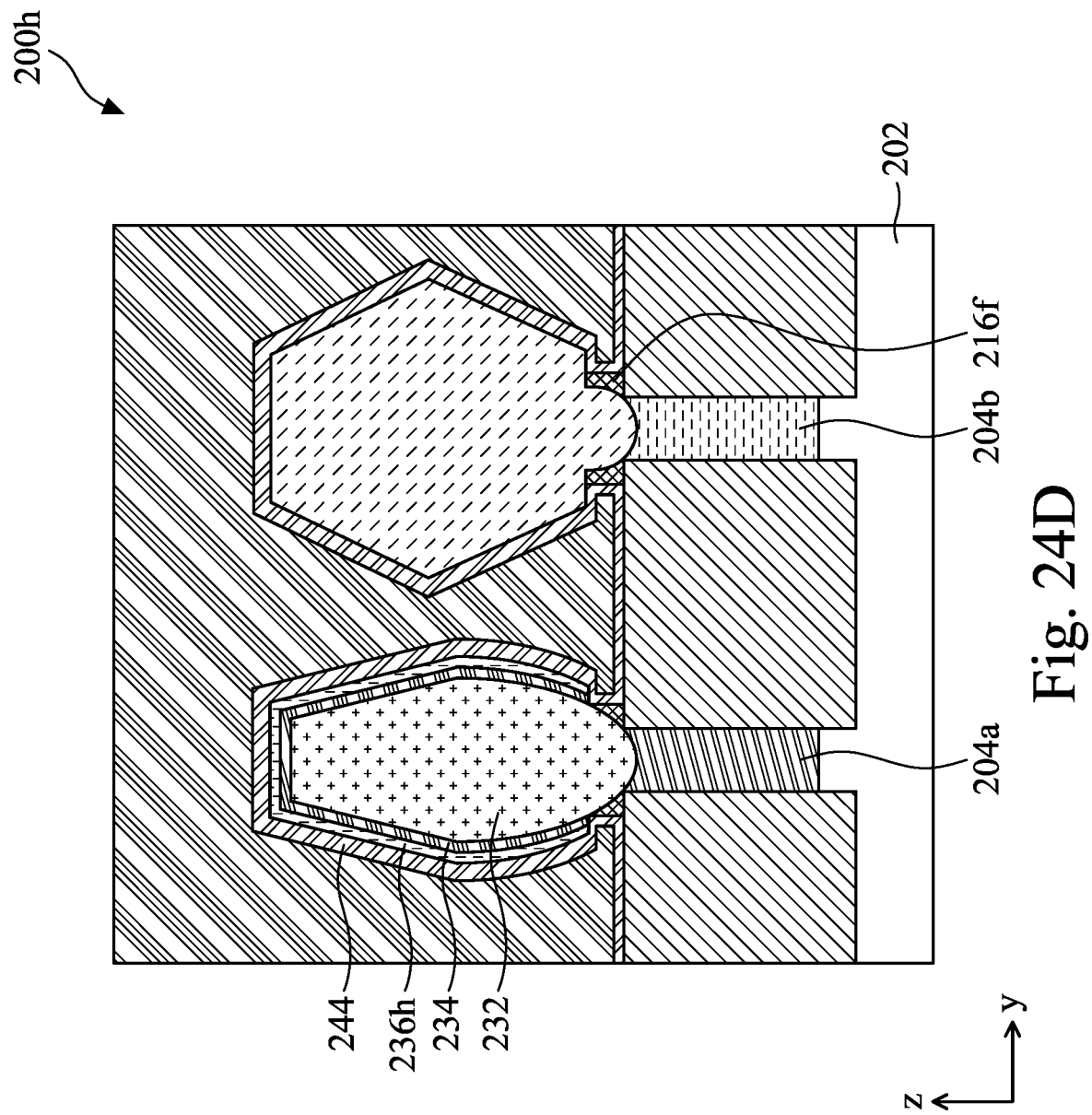

In some embodiments, the epitaxial cap layer 236 are partially oxidized at operation 118 and partially unchanged. FIGS. 24A-D schematically illustrate a semiconductor device 200*h* manufactured when the epitaxial cap layer 236 is partially oxidized at operation 118 in the method 100. FIG. 24A schematically demonstrates sectional views of changes of the epitaxial cap layer 236 after operations 116, 118, and 120 in the semiconductor device 200*h* according to embodiments of the present disclosure. FIG. 24B schematically demonstrates one example of the semiconductor device 200*h* after operation 120 of the method 100. FIG. 24C schematically demonstrates one example of the semiconductor device 200*h* after operation 124 of the method 100. FIG. 24D schematically demonstrates one example of the semiconductor device 200*h* after operation 130 of the method 100.

The semiconductor device 200*h* is similar to the semiconductor device 200 until reaching operation 118, where after the oxidation process the epitaxial cap layer 236 is partially oxidized with a top portion becoming an oxide layer 238*h*, and a lower portion remaining unoxidized, denoted as a cap layer 236*h* in FIG. 24A. In some embodiments, the partial oxidation may be achieved using decoupled plasma oxidation, as discussed with operation 118 above. The oxide layer 238*h* includes mainly SiGeOx. The cap layer 236*h* includes unoxidized epitaxial SiGe. After the anneal process at operation 120, the oxide layer 238*h* becomes an self-aligned mask layer 240*h* including SiOx, and an oxide layer 266*h* including SiGeOx and GeOx.

As shown in FIGS. 24A and 24B, the self-aligned mask layer 240*h* is formed over the oxide layer 266*h*, the cap layer 236*h*, and the epitaxial liner 234 after operation 120. The self-aligned mask layer 240*h* acts as a protection layer for the epitaxial source/drain features 232 during operation 124. The self-alignment mask layer 240*h* may incur some thickness loss during operation 124, as shown in FIG. 23C.

At operation 126, remainder of the self-aligned mask layer 240*h* and the oxide layer 266*h* are removed from the semiconductor device 200*h* with the cap layer 236*h* and the epitaxial liner 234 remaining on the epitaxial source/drain features 232, as shown in FIG. 24D. The CESL 244 is then formed over the semiconductor cap layer 264. Alternatively, at least a portion of the oxide layer 266*h* may remain after operation 126, and remain in the resulting semiconductor device (not shown).

Figure 24E:
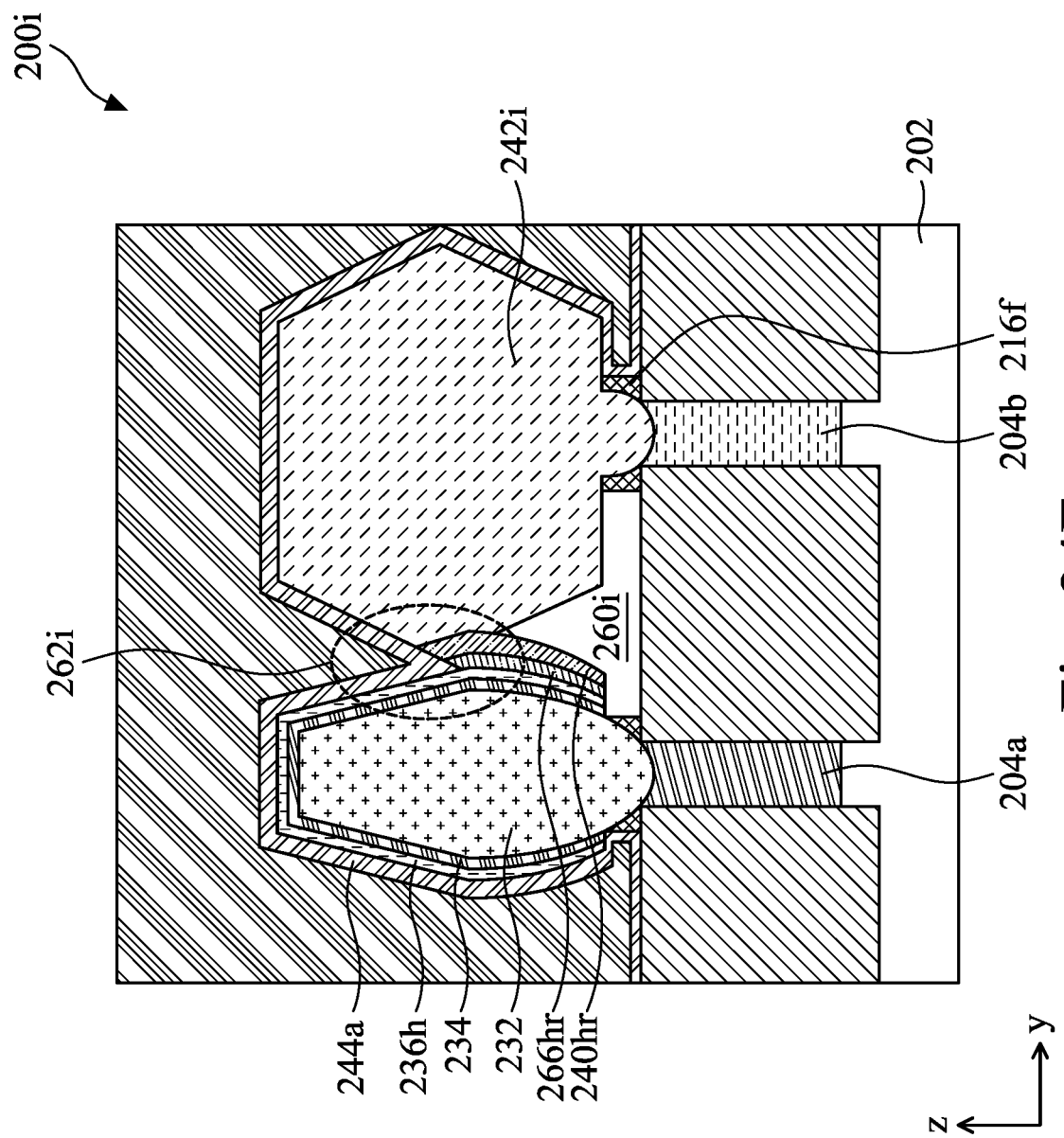
FIG. 24E schematically illustrates a semiconductor device according to embodiments of the present disclosure.

FIG. 24E schematically illustrates a semiconductor device 200*i* according to embodiments of the present disclosure. The semiconductor device 200*i* is similar to the semiconductor device 200*h* except that epitaxial source/drain features 242*i* for P-type devices overlap or bridge the epitaxial source/drain features 232 for N-type devices. In a region 262*e* where the epitaxial source/drain features 242*i* overlap with the epitaxial source/drain features 232, the self-aligned mask layer 240*h*, and the oxide layer 266*h* disposed between the epitaxial source/drain features 242*i* overlap with the epitaxial source/drain features 232 preventing direct contact. As shown in FIG. 24E, a self-aligned mask portion 240*hr* and an oxide layer portion 266*hr* remain on the epitaxial source/drain features 232. In some embodiments, an air gap 260*i* may form between the epitaxial source/drain feature 242*i* and the epitaxial source/drain feature 232. The self-aligned mask portion 240*hr* and oxide layer portion 266*hr* may include the portions where the epitaxial source/drain feature 242*i* and the epitaxial source/drain feature 232 merge and where the self-aligned mask layer 240*h* is exposed to the air gap 260*i*. Similar to the self-aligned mask portion 240*r*, the self-aligned mask portion 240*hr* and oxide layer portion 266*hr* may also include a corner or curved portion.

In the examples discussed above, epitaxial source/drain features N-type devices are formed before epitaxial source/drain features for P-type devices. Alternatively, embodiments of the present disclosure may be used to form epitaxial source/drain features for P-type devices and form a self-aligned mask layer on the epitaxial source/drain features for P-type devices.

FIGS. 25-34 schematically illustrate a semiconductor device 300 according to embodiments of the present disclosure at various stages. The semiconductor device 300 may be fabricated using the method 100 described above. The semiconductor device 300 is similar to the semiconductor device 200 until reaching operation 110 as shown in FIGS. 1-6.

Figure 25:
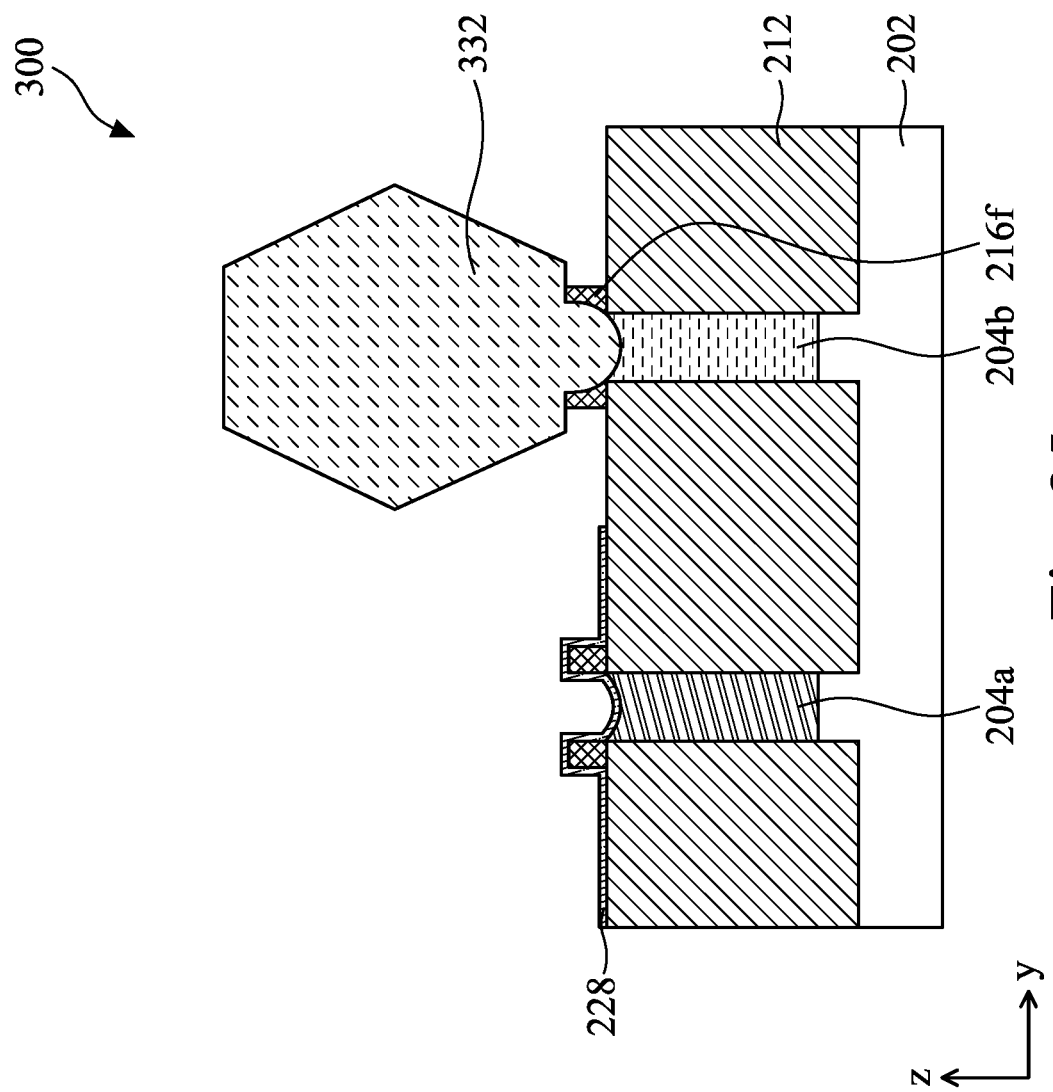

At operation 110, a photolithography process is performed to pattern the hard mask layer 228 to expose areas over the n-well 204*b* where P-type devices are to be formed, as shown in FIG. 25.

At operation 112, epitaxial source/drain features 332 for P-type devices are formed as shown in FIG. 25. The epitaxial source/drain features 332 for P-type of devices may include one or more layers of Si, SiGe, Ge with p-type dopants, such as boron (B), for a p-type device, such as pFET. In some embodiments, the epitaxial source/drain features 332 may be SiGe material including boron as dopant. The epitaxial source/drain features 332 shown in FIG. 8 has a hexagonal shape. However, the epitaxial source/drain features 332 may be other shapes according to the design. The epitaxial source/drain features e32 may be formed by any suitable method, such as by CVD, CVD epitaxy, molecular beam epitaxy (MBE), or any suitable deposition technique.

At operation 114, an epitaxial liner 334 is formed over the epitaxial source/drain features 332 for P-type devices as shown in FIG. 26A. The epitaxial liner 334 is selectively formed on the exposed surfaces of the epitaxial source/drain features 332 by an epitaxial process. The epitaxial liner 334 is substantially conformal over exposed surfaces of the source/drain features 332. The epitaxial liner 334 may be formed by any suitable method, such as by CVD, CVD epitaxy, molecular beam epitaxy (MBE), or any suitable deposition technique. According to some embodiments of the present disclosure, the epitaxial liner 334 is formed in-situ in the same chamber where the epitaxial source/drain features 332 are formed. In some embodiments, the epitaxial liner 334 is a semiconductor layer of a single crystalline material. In some embodiments, the epitaxial liner 334 is a dopant free epitaxial semiconductor layer. The epitaxial liner 334 may be formed from other materials that is capable of providing structural transition and/or diffusion barrier, for example, the epitaxial liner 234 may include one or more layers of Si, Ge, SiGe, GaAs, InSb, GaP, GaSb, InAlAs, InGaAs, GaSbP, GaAsSb, and InP, depending on the material selection in the epitaxial source/drain features 332 and the subsequent layer. In one embodiment, the epitaxial liner 334 is a dopant free epitaxial silicon layer.

FIG. 26B is a partial enlarged view of the FIG. 26A within a region marked by 26B. As shown in FIG. 26B, the epitaxial liner 334 may have a thickness T6. In some embodiments, the thickness T6 of the epitaxial liner 334 is in a range between 1 nm and 5 nm. A thickness less than 1 nm may not provide enough transitional and/or barrier benefit. A thickness greater than 5 nm would not provide additional benefit.

At operation 116, an epitaxial cap layer 336 is selectively formed on the exposed surfaces of the epitaxial liner 334 by an epitaxial process. The epitaxial cap layer 336 may be substantially conformal. The epitaxial cap layer 336 may be formed by any suitable method, such as by CVD, CVD epitaxy, molecular beam epitaxy (MBE), or any suitable deposition technique. According to some embodiments of the present disclosure, the epitaxial cap layer 336 is formed in-situ in the same chamber where the epitaxial source/drain features 332 and the epitaxial liner 334 are formed.

In some embodiments, the epitaxial cap layer 336 includes semiconductor materials having different oxidation rates and/or different etch selectivity with the epitaxial liner 334 and the epitaxial source/drain features 332. In some embodiments, the epitaxial cap layer 336 may include one or more layers of Si, SiP, SiC and SiCP. The epitaxial cap layer 336 is SiP.

As shown in FIG. 26B, the epitaxial cap layer 336 may have a thickness T7. In some embodiments, the thickness T7 of the epitaxial cap layer 336 is in a range between 2 nm and 10 nm. A thickness less than 2 nm cannot form a hard mask thick enough to protect the epitaxial source/drain features 332 during subsequent processes. A thickness greater than 10 nm would not provide additional benefit.

At operation 118, an oxidation treatment is performed to selectively oxidize the epitaxial cap layer 336. FIG. 27A schematically demonstrates one example of the semiconductor device 300 after operation 118. FIG. 27B is a partial enlarged view of the FIG. 27A within a region marked by 27B. An oxide layer 338 is formed from the epitaxial cap layer 336 while the epitaxial liner 334 is substantially unaffected by the oxidation treatment. In some embodiments, the oxide layer 338 may include SiPOx.

The formation of the oxide layer 338 may be performed using wet oxidation, dry oxidation, plasma oxidation, for example, decoupled plasma oxidation (DPO), or a combination thereof. In some embodiments, a low thermal budget and/or reduced diffusion of oxygen are performed at operation 118 to prevent re-crystalizing of the epitaxial source/drain features 332.

At operation 120, an anneal process is performed to remove one or more elements, for example P, from at least a topmost portion of the oxide layer 338, resulting in a self-aligned mask layer 340. FIG. 28A schematically demonstrates one example of the semiconductor device 300 after operation 120. FIG. 28B is a partial enlarged view of the FIG. 28A within a region marked by 28B.

In some embodiments, the anneal process at operation removes P from the oxide layer 338 including SiPOx resulting in the self-aligned mask layer 340 including SiOx. In some embodiments, the anneal process substantially removes all P from the oxide layer 2238, the entire portion of the oxide layer 338 is converted to the self-aligned mask layer 340. In other embodiments, P is only removed from topmost portion of the oxide layer 238, a portion of SiPOx remains between the self-aligned mask layer 340 and the epitaxial liner 334.

As shown in FIG. 28B, the self-aligned mask layer 340 may have a thickness T8. In some embodiments, the thickness T8 of the self-aligned mask layer 240 is in a range between 2 nm and 10 nm. A thickness less than 2 nm is not thick enough to protect the epitaxial source/drain features 332 during subsequent processes. A thickness greater than 10 nm would not provide additional benefit.

Figure 29:
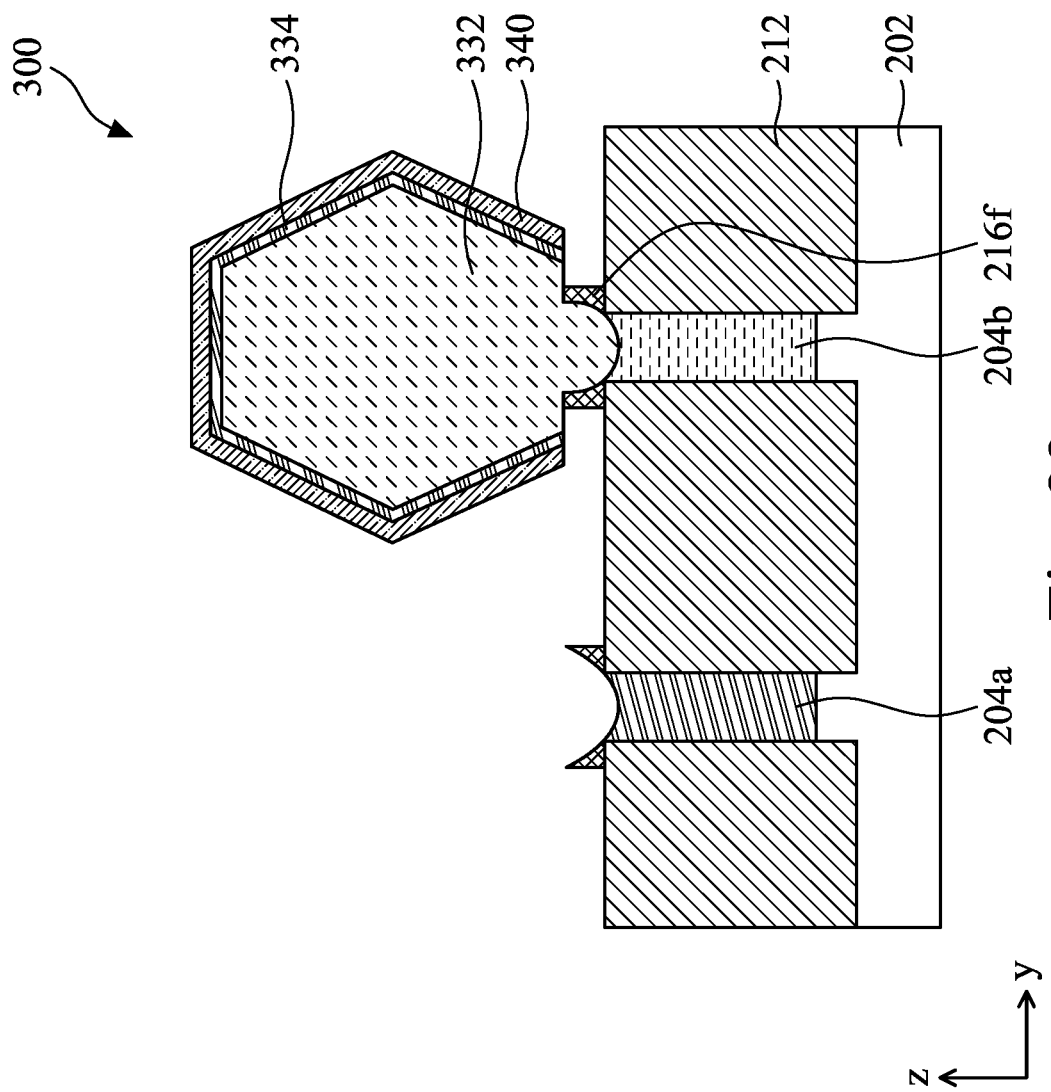

At operation 122, the patterned hard mask layer 228 is removed exposing the fin structure 210a over the p-well 204a for subsequent formation of source/drain features for N-type devices, as shown in FIG. 29.

In some embodiments, the etch process to remove the portion of the hard mask layer 328 includes a wet etch process, a dry etch process, or a combination thereof. During the etch process, the self-aligned mask layer 340 protects the epitaxial source/drain features 332. In some embodiments, the self-aligned mask layer 340 may incur some thickness loss during the etch process to remove the hard mask layer 328.

Figure 30:
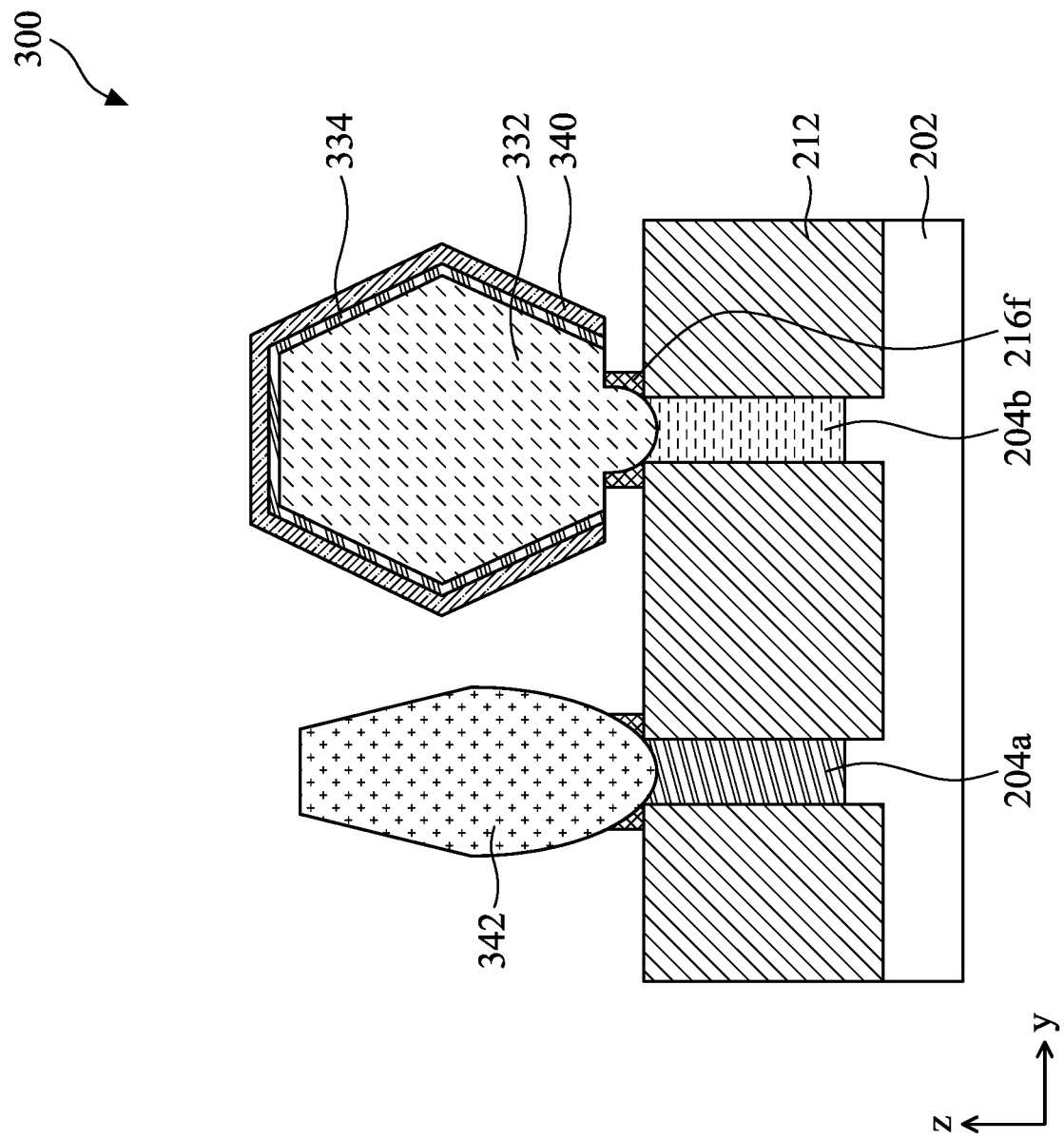

At operation 124, epitaxial source/drain features 342 for N-type devices are formed by epitaxial growth from exposed surfaces of the fin structure 210a, as shown in FIG. 30. A cleaning process is performed to the semiconductor device 300 prior to epitaxially growing the epitaxial source/drain features 342, for example to remove native oxide formed on the surfaces of the fin structure 210a. After the cleaning process, the epitaxial source/drain features 342 may be formed by any suitable method, such as by CVD, CVD epitaxy, molecular beam epitaxy (MBE), or any suitable deposition technique. In some embodiments, the epitaxial source/drain features 342. The epitaxial source/drain features 342 may include one or more layers of Si, SiP, SiC and SiCP. The epitaxial source/drain features 332 also include N-type dopants, such as phosphorus (P), arsenic (As), etc. In some embodiments, the epitaxial source/drain features 332 may be a Si layer includes phosphorus (P) dopants.

Figure 31:
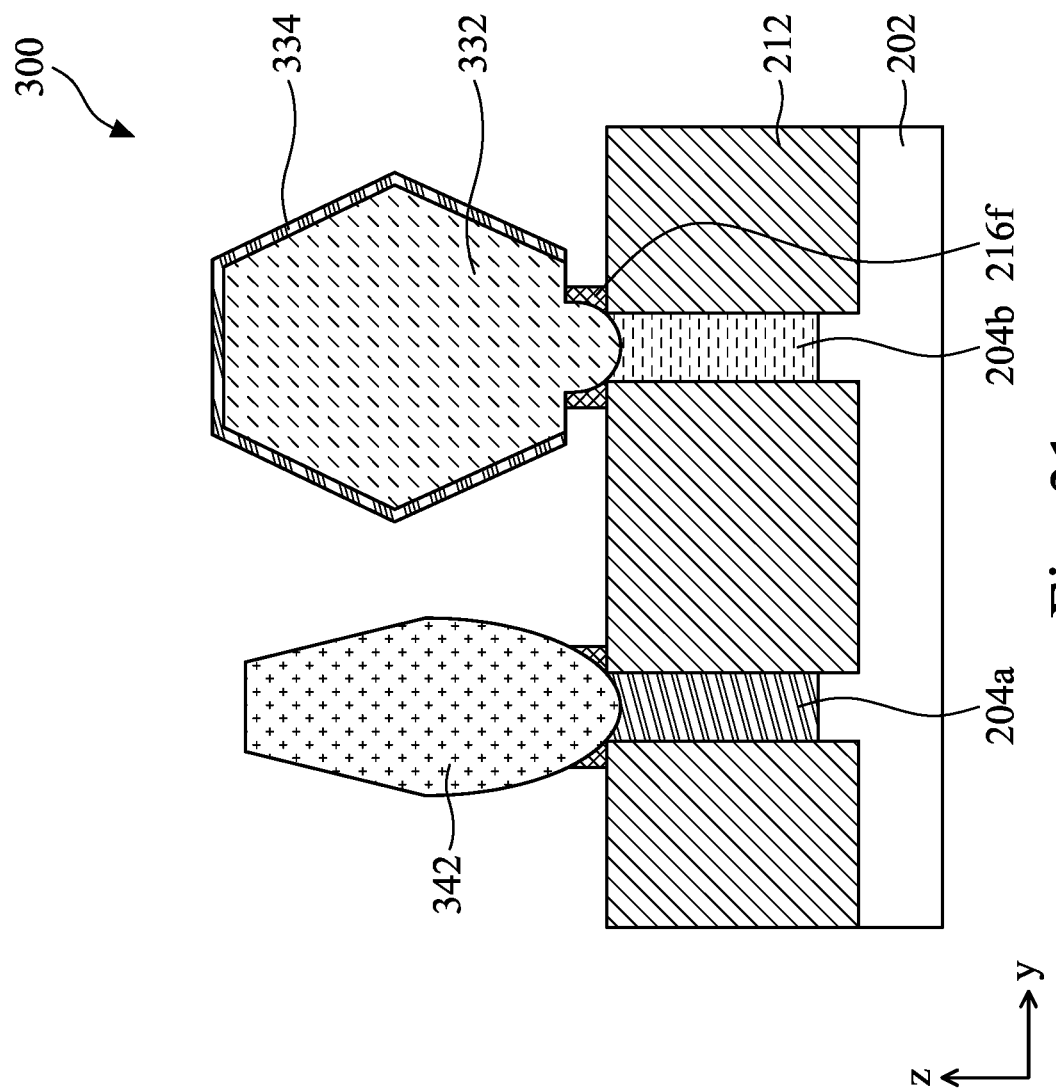

At operation 126, the self-aligned mask layer 340 is removed. A suitable etching method may be used to selectively remove the self-aligned mask layer and expose to epitaxial materials underneath. As shown in FIG. 31, remainder of the self-aligned mask layer 340 is removed exposing the epitaxial liner 334. In some embodiments, the self-aligned mask layer 340 may be removed using a halogen containing etchant.

At operation 128, a contact etch stop layer (CESL) 344 is conformally formed over the semiconductor device 300. The CESL 344 is formed on the epitaxial source/drain features 342, the epitaxial liner 334, the sidewall spacers 316, and the isolation layer 312 as shown in FIG. 32.

Figure 32:
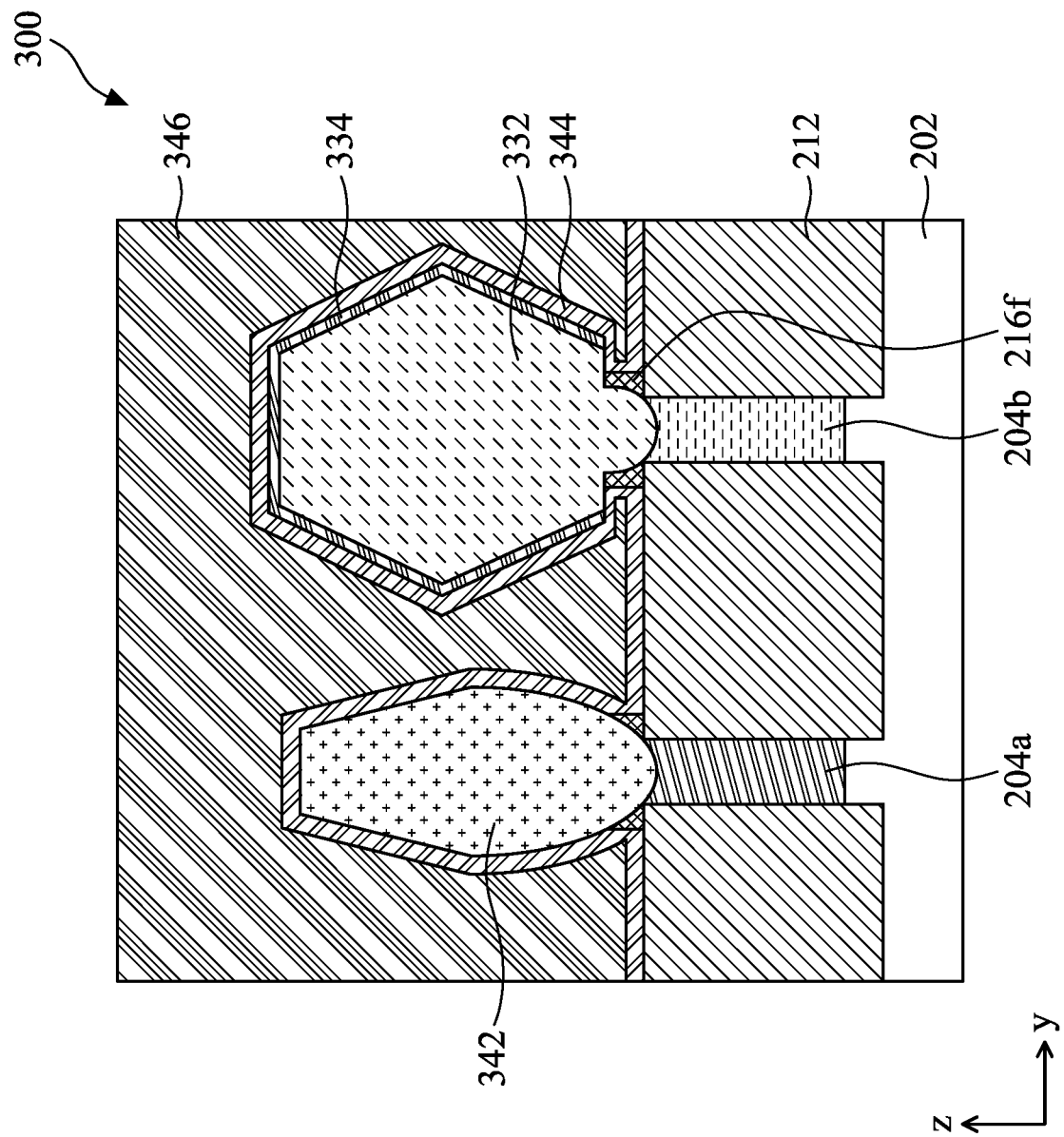

At operation 130, an interlayer dielectric (ILD) layer 346 is formed over the CESL 344, as shown in FIG. 32. Operations 132, 134 are subsequently performed as previously discussed.

Figure 33:
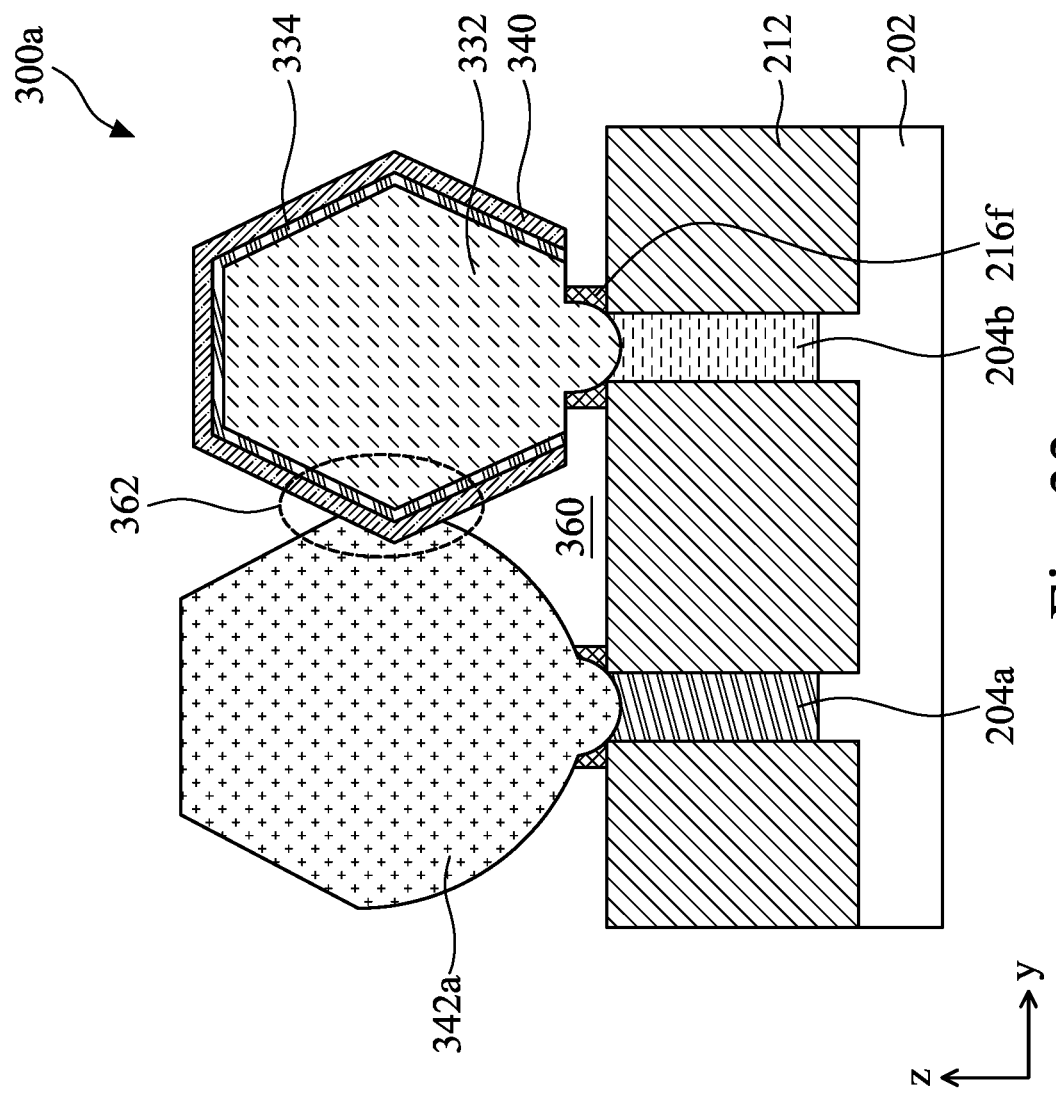

FIGS. 33-34 schematically illustrate a semiconductor device 300a according to embodiments of the present disclosure at various stages. The semiconductor device 300a may be manufactured using the method 100. FIG. 33 schematically demonstrates one example of the semiconductor device 300a after operation 124 of the method 100. FIG. 34 schematically demonstrates one example of the semiconductor device 300a after operation 128 of the method 100.

The semiconductor device 300a is similar to the semiconductor device 300 until reaching operation 124, where epitaxial source/drain features 342a for N-type devices overlap or bridge the epitaxial source/drain features 332 for P-type devices. As shown in FIG. 33, the self-aligned mask layer 340 acts as a protection layer for the epitaxial source/drain features 332 during operation 124. In a region 362 where the epitaxial source/drain features 342a overlap with the epitaxial source/drain features 332, the self-aligned mask layer 340 is disposed between the epitaxial source/drain features 342a overlap with the epitaxial source/drain features 332 preventing direct contact. In some embodiments, an air gap 360 may form between the epitaxial source/drain feature 342a and the epitaxial source/drain feature 332.

At operation 126, the self-aligned mask layer 340 is removed partially removed from the semiconductor device 300a. As shown in FIG. 34, a self-aligned mask portion 340r remains on the epitaxial source/drain features 332. The self-aligned mask portion 340r may include the portions where the epitaxial source/drain feature 342a and the epitaxial source/drain feature 332 overlap and where the self-aligned mask layer 340 is exposed to the air gap 360. Similar to the self-aligned mask portion 240r, the self-aligned mask portion 340r may also include a corner or curved portion.

In the embodiments discussed above, the epitaxial cap layer 336 are oxidized at operation 118 forming a substantially uniform oxide layer 338. Alternatively, the epitaxial cap layer 336 may become multiple layers in response to various processing conditions. FIGS. 35A-35C schematically illustrates a semiconductor device 300b according to embodiments of the present disclosure at various stages. FIG. 35A schematically demonstrates sectional views of changes of the epitaxial cap layer 336 after operations 116, 118, and 120 in the semiconductor device 300b according to embodiments of the present disclosure. FIG. 35B schematically demonstrates one example of the semiconductor device 300b after operation 120 of the method 100. FIG. 35C schematically demonstrates one example of the semiconductor device 300b after operation 130 of the method 100.

The semiconductor device 300b is similar to the semiconductor device 300 until reaching operation 118, where after the oxidation process the epitaxial cap layer 336 become a semiconductor cap layer 364, an oxide layer 338d, and a self-aligned mask layer 340d. As shown in FIG. 35A, the epitaxial cap layer 336 which includes SiP becomes substantially tri-layer structure after exposing to an oxidizing agent, to which Si has a higher oxidizing rate compared to P. The self-aligned mask layer 340d, formed on topmost, includes mainly SiOx. The oxide layer 338d, immediately under the self-aligned mask layer 340d, includes mainly SiPOx. The semiconductor cap layer 364, underneath the oxide layer 338d, mainly incudes unoxidized P. After the anneal process at operation 120, a portion of P is removed from the tri-layer structure, increasing the thickness of the self-aligned mask layer 340d, forming an oxide layer 366 including SiGeOx and GeOx, and with the semiconductor cap layer 264 substantially unchanged.

As shown in FIGS. 35A and 35B, the self-aligned mask layer 340d is formed over the oxide layer 366, the semiconductor cap layer 364, and the epitaxial liner 334 after operation 120. The self-aligned mask layer 340d acts as a protection layer for the epitaxial source/drain features 332 during operation 124.

At operation 126, remainder of the self-aligned mask layer 340d and the oxide layer 366 are removed from the semiconductor device 300b with the semiconductor cap layer 364 and the epitaxial liner 334 remaining on the epitaxial source/drain features 332, as shown in FIG. 35C. Alternatively, at least a portion of the oxide layer 366 may remain after operation 126, and remain in the resulting semiconductor device (not shown).

FIGS. 35D-35E schematically illustrates a semiconductor device 300c according to embodiments of the present disclosure. The semiconductor device 300c is similar to the semiconductor device 300b except that epitaxial source/drain features 342c for N-type devices overlap or bridge the epitaxial source/drain features 232 for P-type devices. In a region 362c where the epitaxial source/drain features 342c overlap with the epitaxial source/drain features 332, the self-aligned mask layer 340, and the semiconductor cap layer 364 disposed between the epitaxial source/drain features 342e overlap with the epitaxial source/drain features 332 preventing direct contact. As shown in FIG. 35E, a self-aligned mask portion 340r remains on the epitaxial source/drain features 332. In some embodiments, an air gap 360c may form between the epitaxial source/drain feature 342c and the epitaxial source/drain feature 332. The self-aligned mask portion 340r may include the portions where the epitaxial source/drain feature 342c and the epitaxial source/drain feature 332 overlap and where the self-aligned mask layer 340 is exposed to the air gap 360c.

Various embodiments or examples described herein offer multiple advantages over the state-of-art technology. For example, by using a self-aligned mask layer, embodiments of the present disclosure enlarge process error windows and avoid damaging source/drain features in patterning processes. Embodiments of the present disclosure provide flexibility in shape, dimension, and/or location of epitaxial source/drain features. Embodiments of the present disclosure also enable overlapping or bridging epitaxial source/drain features without causing short circuits.

Some embodiments of the present provide a semiconductor device comprising a first source/drain feature, an epitaxial liner formed on the first source/drain feature, a second source/drain feature, and a contact etch stop layer formed over the first and second source/drain features, wherein the contact etch stop layer is formed directly on the second source/drain feature, and the epitaxial liner is formed between the first source/drain feature and the contact etch stop layer.

Some embodiments of the present disclosure provide a semiconductor device. The semiconductor device includes a first source/drain feature comprising one or more first type dopants, a second source/drain feature comprising one or more second type dopants, a liner formed on the first source/drain feature, wherein the liner comprises a first layer in contact with the first source/drain feature, wherein the first layer comprises an epitaxial semiconductor layer, and a second layer in contact with the first layer, wherein the second layer comprises one or more second type of dopants, and a contact etch stop layer formed over the liner and the second source/drain feature.

Some embodiments of the present disclosure provide a method for forming a semiconductor device. The method includes forming first and second fin structures, epitaxially growing a first source/drain feature from the first fin structure while the second fin structure is covered by a hard mask layer, forming a self-aligned mask layer covering the first source/drain feature, removing the hard mask layer covering the second fin structure, epitaxially growing a second source/drain feature from the second fin structure, removing the self-aligned mask layer, depositing a contact etch stop layer to cover the first and second source/drain features, and depositing an interlayer dielectric material over the contact etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming a semiconductor device, comprising:
  forming first and second fin structures;
  epitaxially growing a first source/drain feature from the first fin structure while the second fin structure is covered by a hard mask layer;
  forming a self-aligned mask layer covering the first source/drain feature, wherein forming the self-aligned mask layer comprises:
    forming a cap layer comprising a first element and a second element;
    oxidizing at least a portion of the cap layer; and
    annealing the oxide layer to remove at least a portion of the second element;

removing the hard mask layer covering the second fin structure;
epitaxially growing a second source/drain feature from the second fin structure;
removing the self-aligned mask layer;
depositing a contact etch stop layer to cover the first and second source/drain features; and
depositing an interlayer dielectric material over the contact etch stop layer.

2. The method of claim 1, wherein forming the self-aligned mask layer comprising:
epitaxially growing a liner on the first source/drain feature; and
epitaxially growing the cap layer over on the liner.

3. The method of claim 2, wherein the liner includes the first element, and the cap layer includes the first element and the second element.

4. The method of claim 3, wherein oxidizing at least a portion of the cap layer is performed by decoupled plasma oxidation.

5. The method of claim 3, wherein the first element is silicon and the second element is geranium.

6. The method of claim 3, wherein the first element is silicon and second element is phosphorus.

7. The method of claim 1, wherein removing the second element comprises performing an anneal process in a nitrogen environment.

8. A method for forming a semiconductor device, comprising:
forming a first source/drain feature comprising a first element;
selectively forming an epitaxial liner on the first source/drain feature, wherein the epitaxial liner comprises the first element and a second element;
oxidizing a portion of the epitaxial liner to form a mask layer;
removing at least a portion of the second element from the epitaxial liner;
forming a second source/drain feature while the first source/drain features is covered by the epitaxial liner, wherein the second source/drain feature comprises the second element; and
depositing a contact etch stop layer over the first and second source/drain features, wherein the contact etch stop layer is formed directly on the second source/drain feature, and the epitaxial liner is disposed between the first source/drain feature and the contact etch stop layer.

9. The method of claim 8, wherein the epitaxial liner comprises an epitaxially semiconductor layer.

10. The method of claim 9, wherein the first element is silicon.

11. The method of claim 10, wherein forming the epitaxial liner comprises:
forming a first semiconductor liner comprising the first element;
forming a semiconductor cap layer comprising the second element over the first semiconductor liner.

12. The method of claim 11, wherein the second element comprises geranium.

13. The method of claim 11, further comprising:
removing the mask layer prior to depositing the contact etch stop layer, wherein a portion of the mask layer is in contact with the second source/drain feature.

14. The method of claim 13, wherein oxidizing the epitaxial liner comprises oxidizing the semiconductor cap layer.

15. The method of claim 8, wherein the first source/drain feature is a source/drain feature for a N-type device and the second source/drain feature is a source/drain feature for a P-type device.

16. A method for forming a semiconductor device, comprising:
forming a first source/drain feature, wherein the first source/drain feature comprising one or more first elements for a first type of devices;
forming a self-aligned liner on the first source/drain feature, wherein the self-aligned liner comprises:
a first liner layer in contact with the first source/drain feature, wherein the first layer comprises an epitaxial semiconductor layer;
a second liner layer in contact with the first liner layer, wherein the second liner layer comprises one or more second elements for a second type of devices; and
oxidizing the self-aligned liner;
removing at least a portion of the one or more second elements from the self-aligned liner;
forming a second source/drain feature while the first source/drain feature is covered by the self-aligned liner, wherein the second source/drain feature comprises one or more the second elements for the second type of devices; and
depositing a contact etch stop layer over the self-aligned liner and the second source/drain feature.

17. The method of claim 16, wherein oxidizing the self-aligned liner comprises forming a third liner layer in contact with the second liner layer.

18. The method of claim 16, wherein removing one or more second elements comprises performing an anneal process in a nitrogen environment.

19. The method of claim 16, wherein oxidizing at least a portion of the self-aligned layer is performed by decoupled plasma oxidation.

20. The method of claim 16, wherein the first type of devices are N-type devices.

* * * * *